United States Patent [19]
Imai et al.

[11] Patent Number: 5,297,077
[45] Date of Patent: Mar. 22, 1994

[54] MEMORY HAVING FERROELECTRIC CAPACITORS POLARIZED IN NONVOLATILE MODE

[75] Inventors: Motomasa Imai, Tokyo; Hiroshi Toyoda, Yokohama; Kazuhide Abe; Koji Yamakawa, both of Kawasaki; Hisakazu Iizuka, Yokohama; Mitsuo Harata, Kawasaki; Koji Sakui, Tokyo, all of Japan

[73] Assignee: Kabushiki Kaisha Toshiba, Kawasaki, Japan

[21] Appl. No.: 676,546

[22] Filed: Mar. 28, 1991

[30] Foreign Application Priority Data

Mar. 30, 1990 [JP] Japan .................................... 2-81131
Mar. 30, 1990 [JP] Japan .................................... 2-84680

[51] Int. Cl.⁵ ............................................ G11C 11/22
[52] U.S. Cl. ...................................... 365/145; 365/117
[58] Field of Search ................................ 365/145, 117

[56] References Cited

FOREIGN PATENT DOCUMENTS

| 0278167 | 8/1988 | European Pat. Off. ............ 365/145 |
| 0293798 | 12/1988 | European Pat. Off. . |
| 63-201998 | 8/1988 | Japan . |
| 64-66899 | 3/1989 | Japan . |
| 3-283079 | 12/1991 | Japan .................................... 365/145 |

OTHER PUBLICATIONS

IEEE Proceedings/VLSI and Computer Peripherals/VLSI and Microelectronic Application in Intelligent Peripherals and their Interconnection Networks (Cat. No. CH 2704-May 1989, Hamburg, May 8 to 12, 1989, pp. 1-20, to 1-23.

*Primary Examiner*—Margaret R. Wambach
*Attorney, Agent, or Firm*—Oblon, Spivak, McClelland, Maier & Neustadt

[57] ABSTRACT

A semiconductor memory device comprises a ferroelectric capacitor, a voltage output circuit for outputting a first voltage for reversely polarizing the ferroelectric capacitor and a second voltage by which the polarization of the ferroelectric capacitor is not reversed, regardless of data stored in the ferroelectric capacitor, a first reference capacitor having a such a capacitance as to accumulate less charge than charge which the ferroelectric capacitor accumulates, when the second voltage is applied to the ferroelectric capacitor, a second reference capacitor having such a capacitance that as to accumulate greater charge than the charge which the ferroelectric capacitor accumulates while the ferroelectric capacitor is forwardly polarized, when the first voltage is applied to the ferroelectric capacitor, thus reversely polarizing the ferroelectric capacitor, a sense amplifier connected to the ferroelectric capacitor and the first or second reference capacitor, a reference-capacitor selecting circuit for connecting the first reference capacitor to the sense amplifier when the voltage output circuit outputs the second voltage, and connecting the second reference capacitor to the sense amplifier while the voltage output circuit outputs the first voltage, and a circuit for determining data from the presence or absence of an electric charge in the ferroelectric capacitors while the memory is set in volatile mode, and for determining data from the direction in which the ferroelectric capacitor is polarized, while the memory is set in nonvolatile mode.

19 Claims, 43 Drawing Sheets

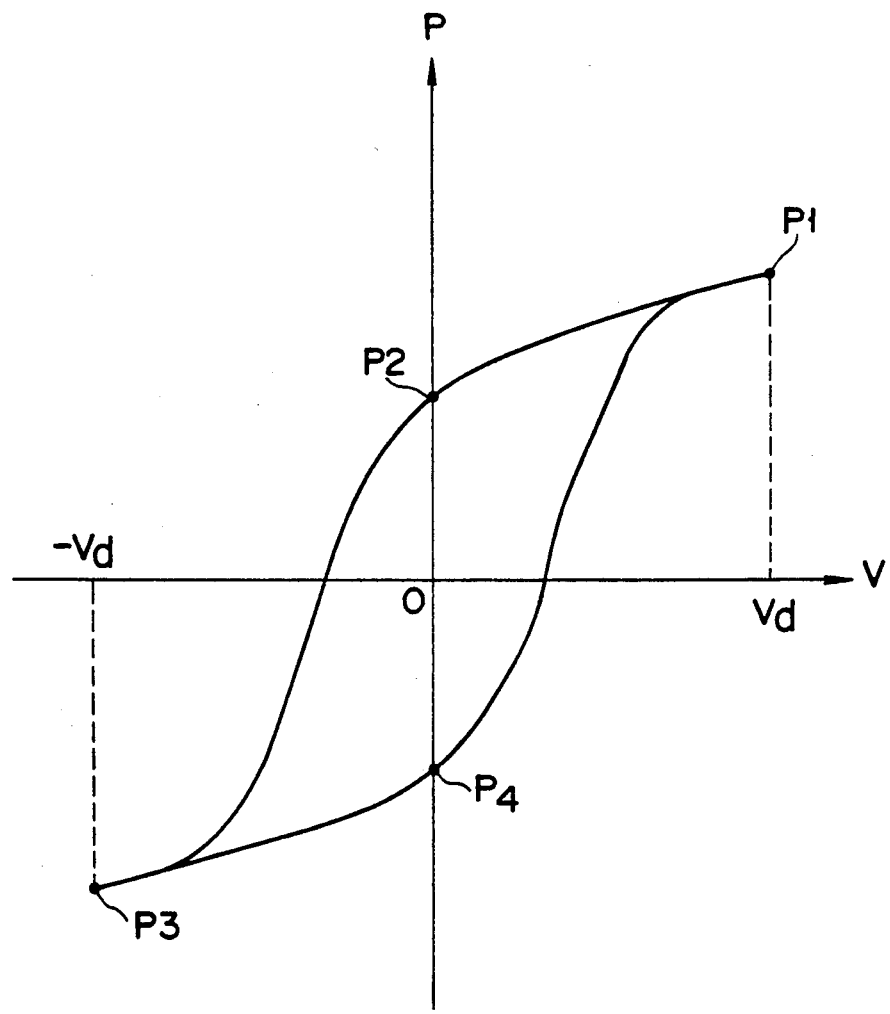
F I G. 1

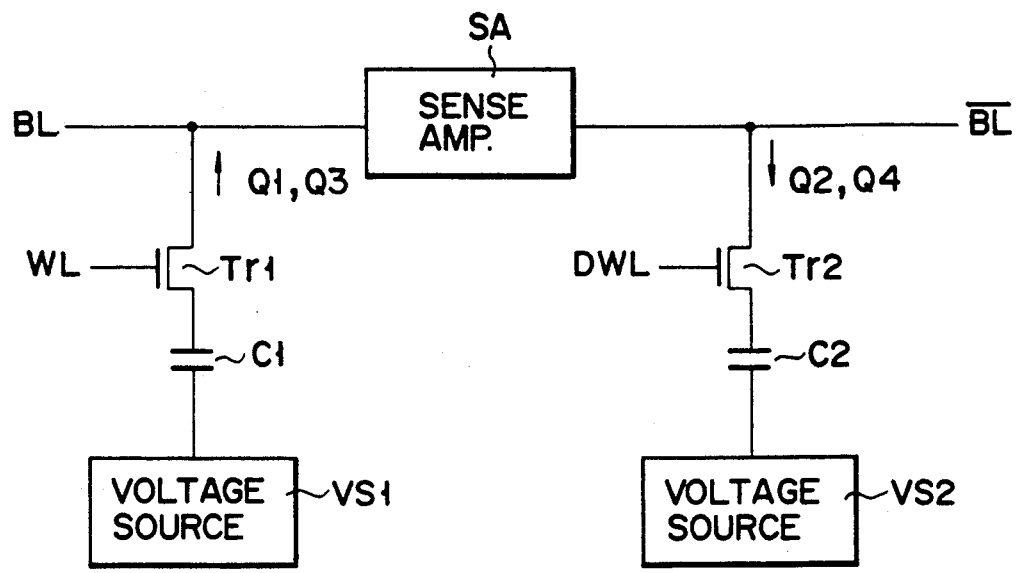
F I G. 2A
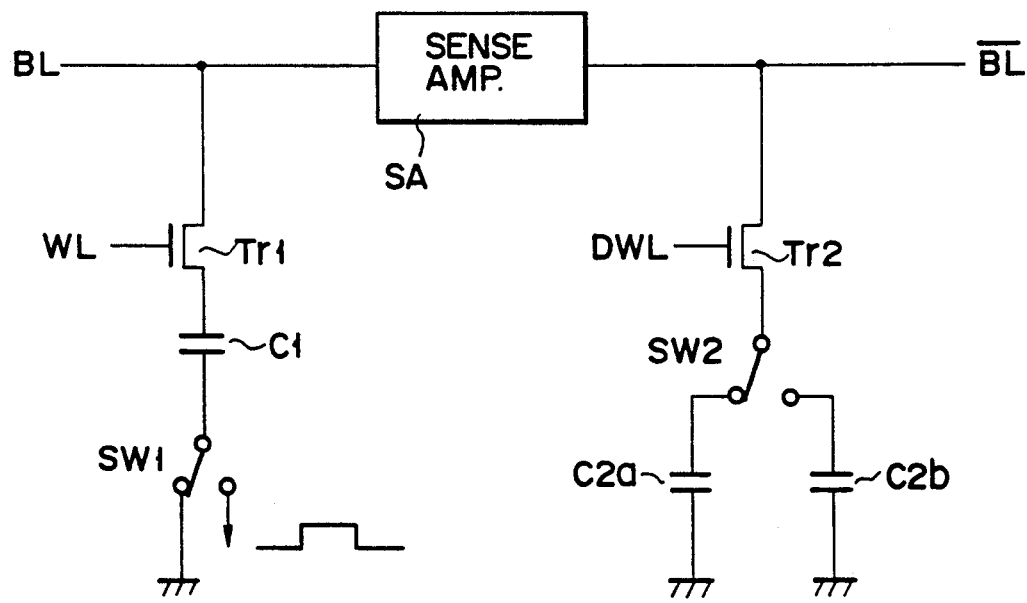
F I G. 2B

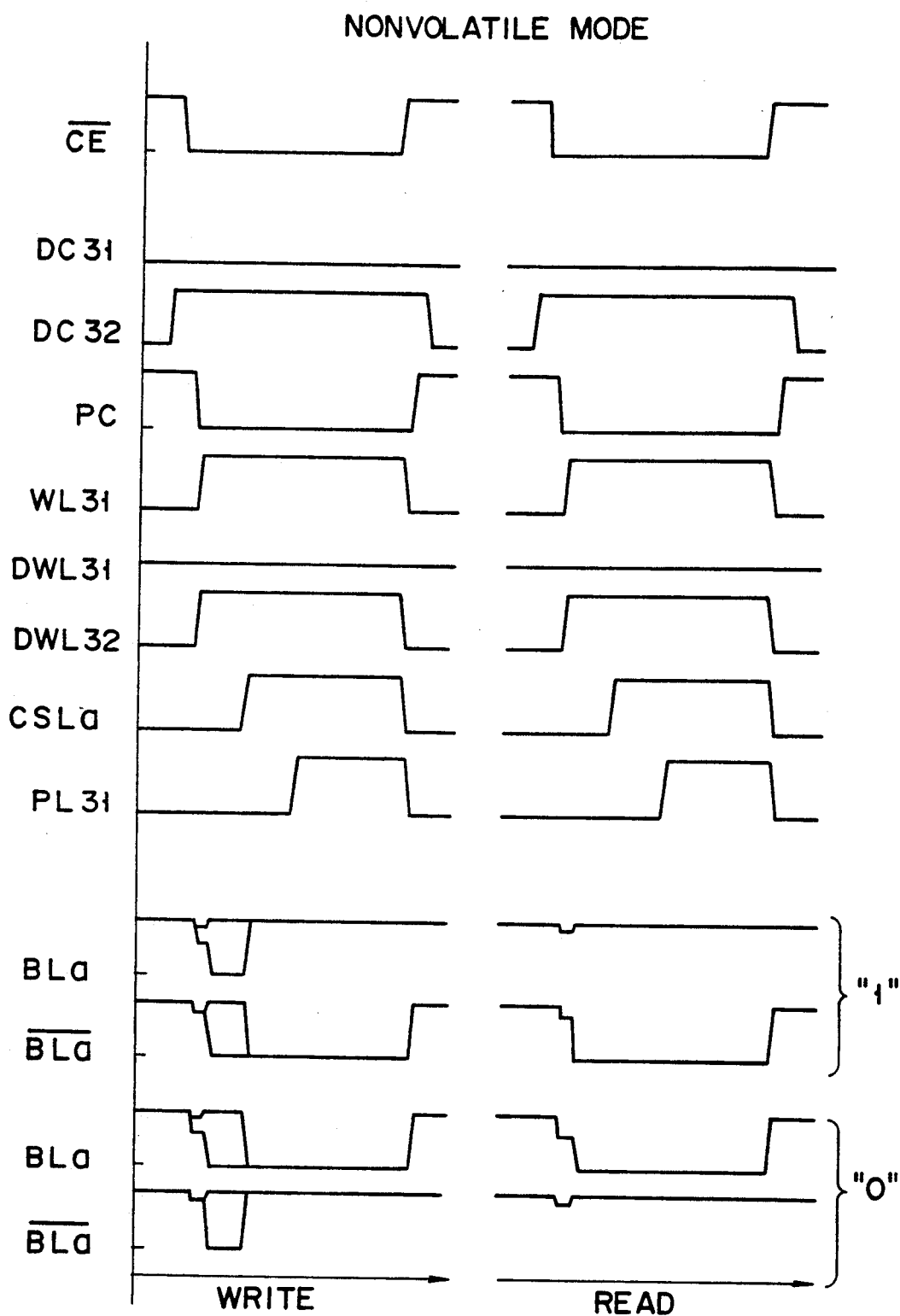
F I G. 4B

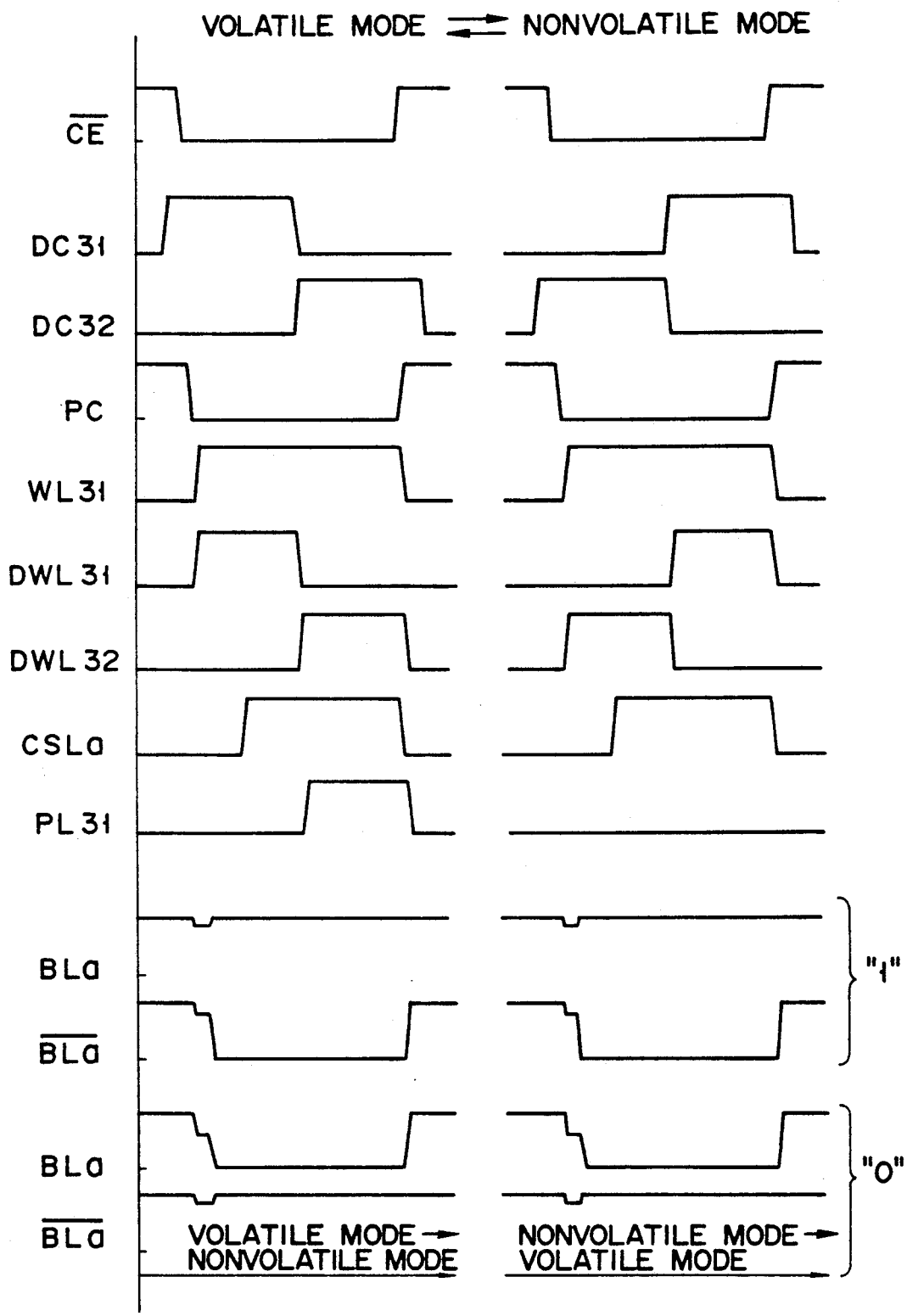
F I G. 4C

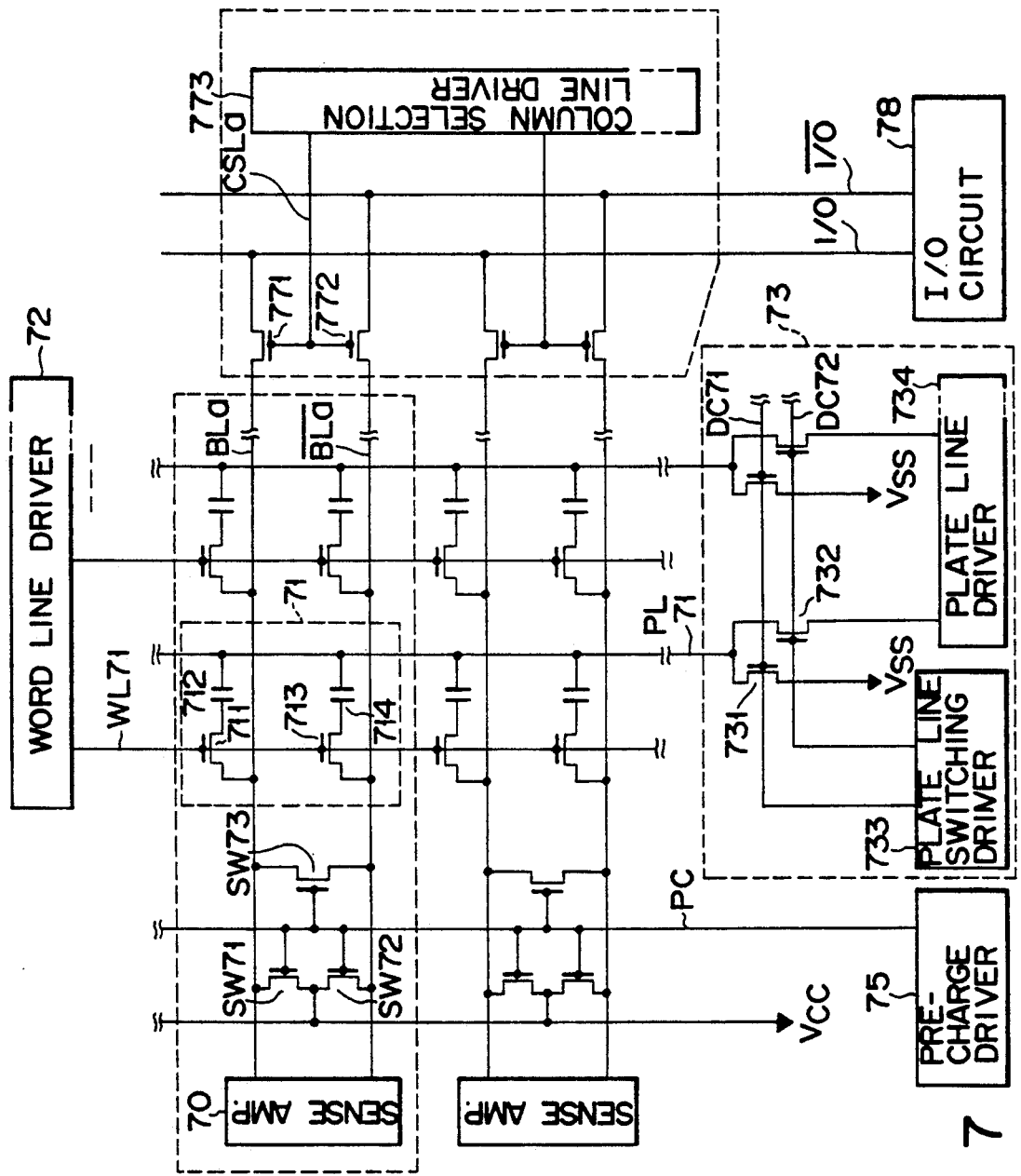
F I G. 7

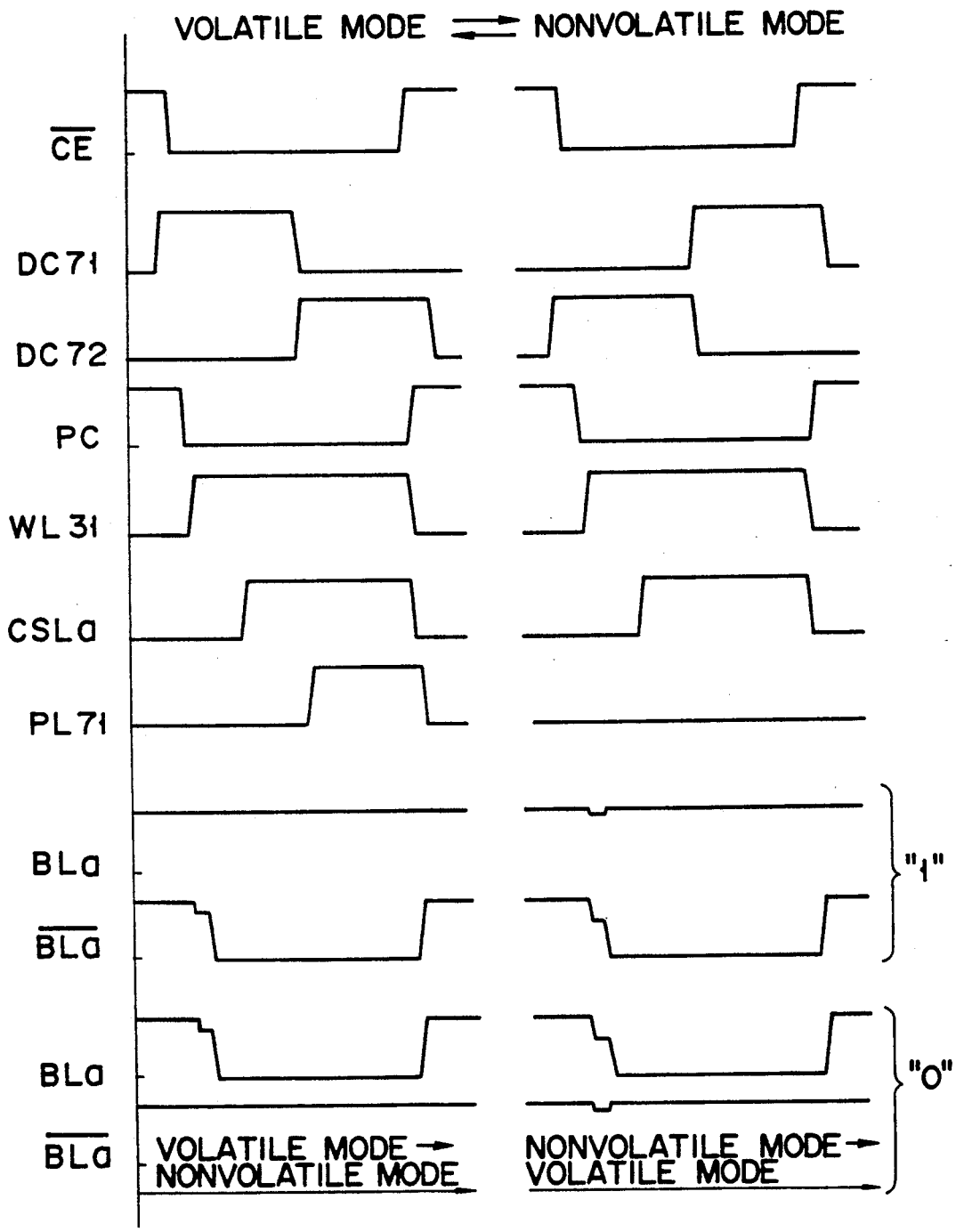
F I G. 8C

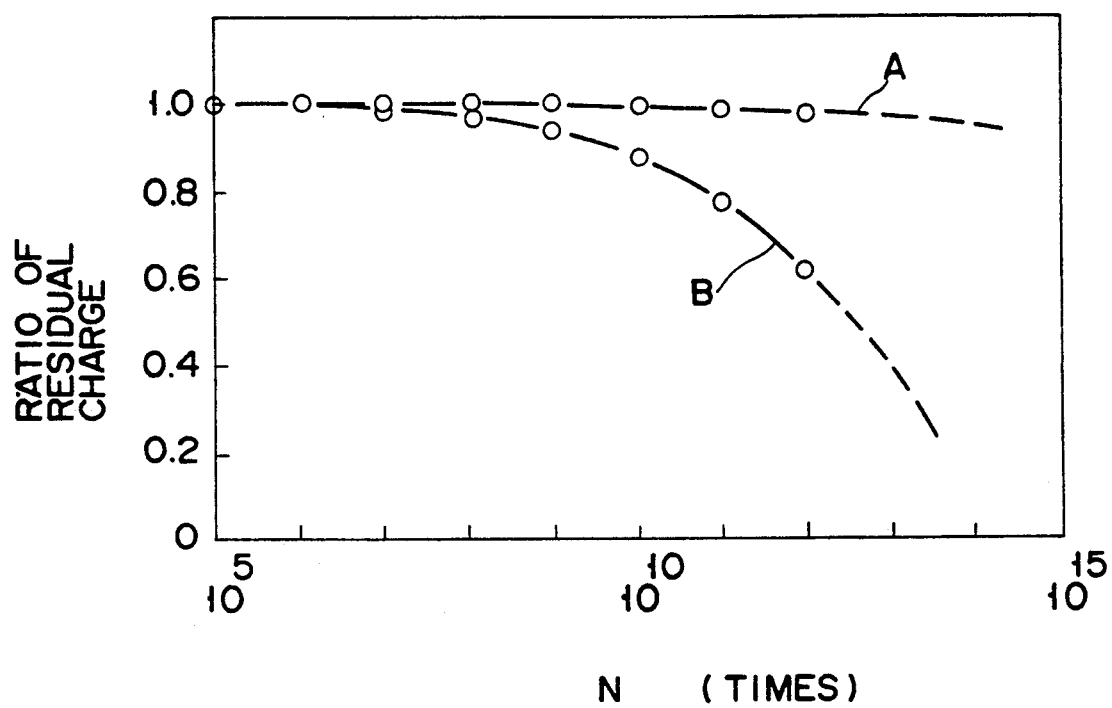
F I G. 14

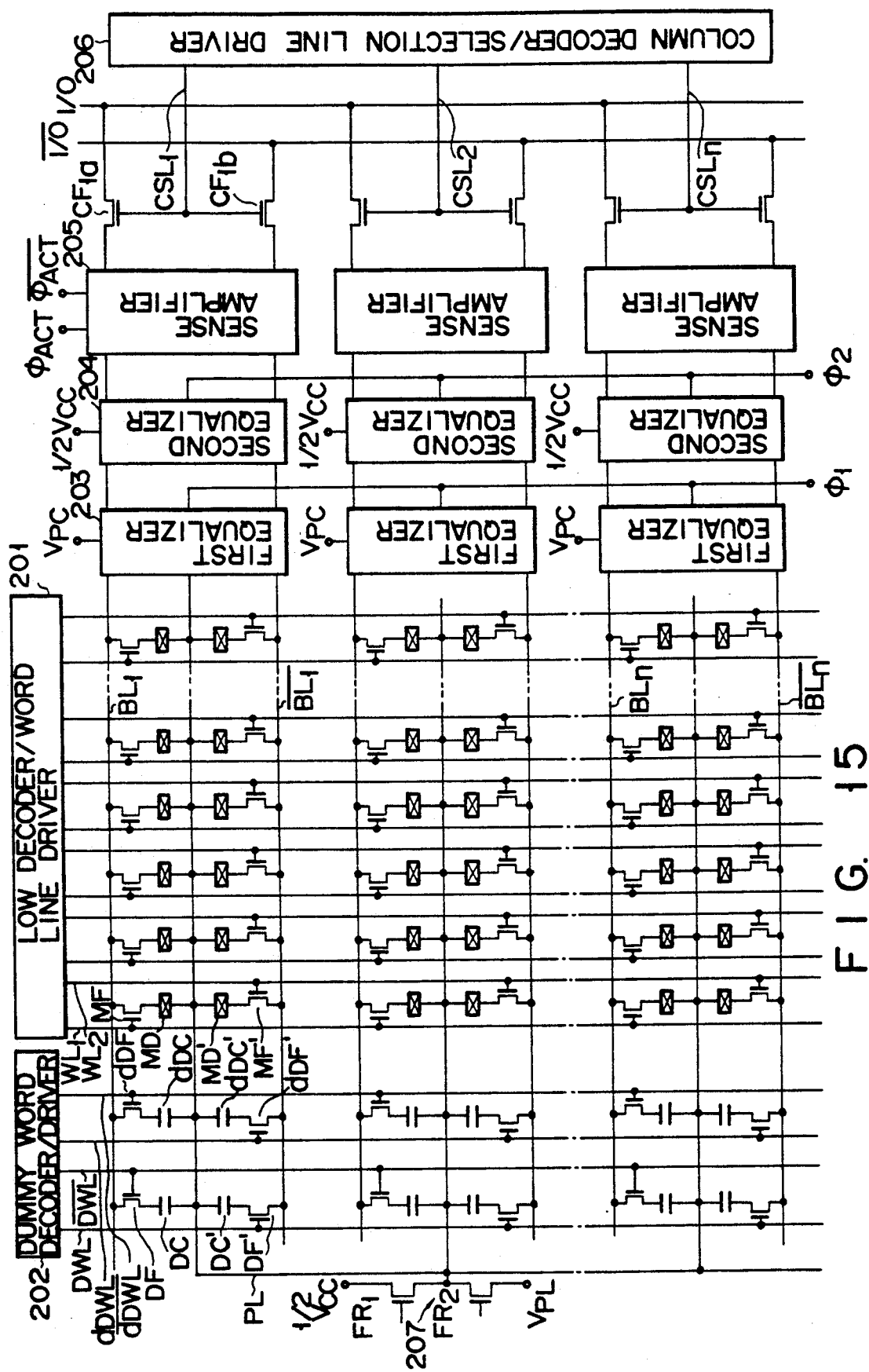
F I G. 15

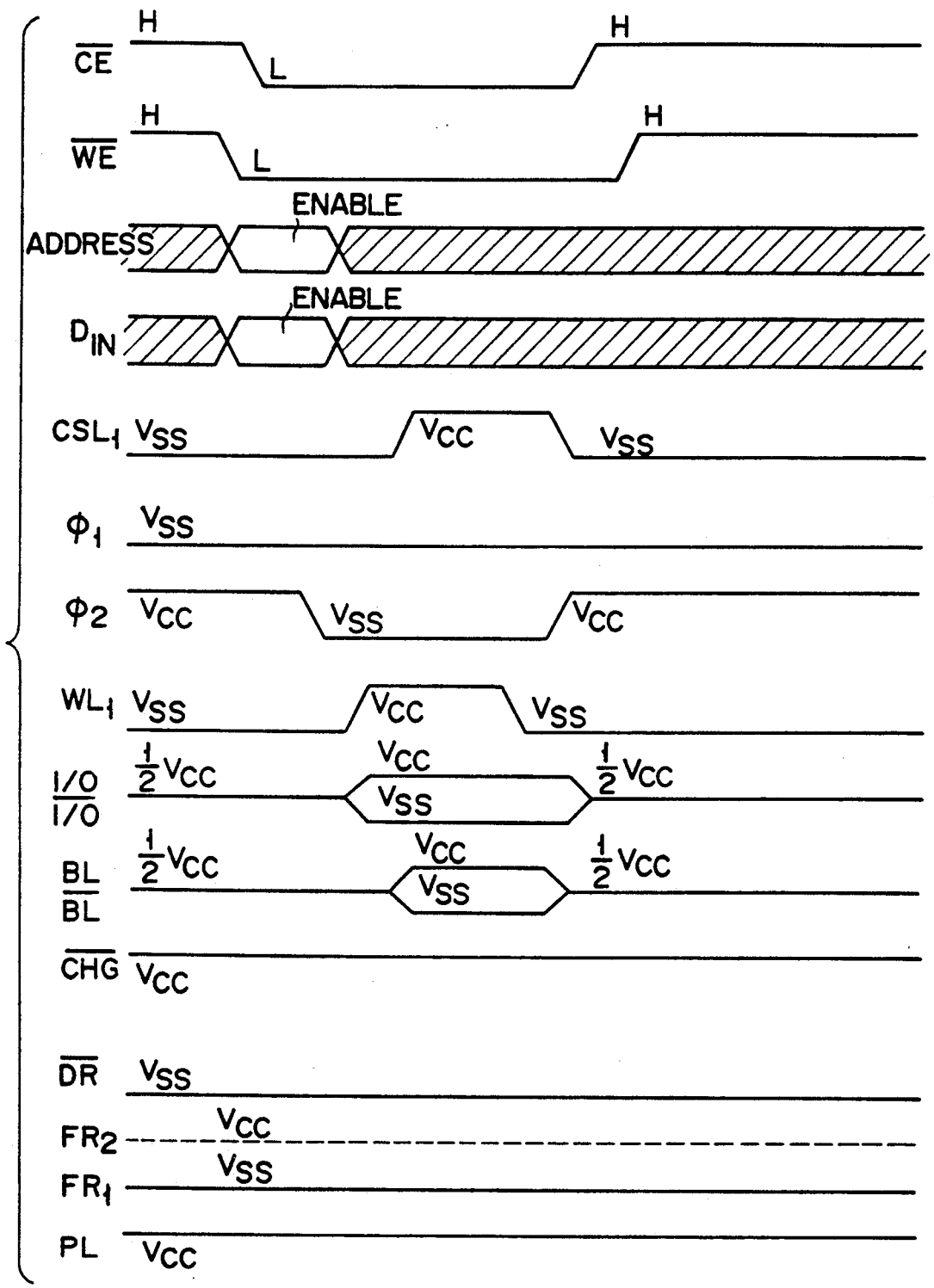
F I G. 20

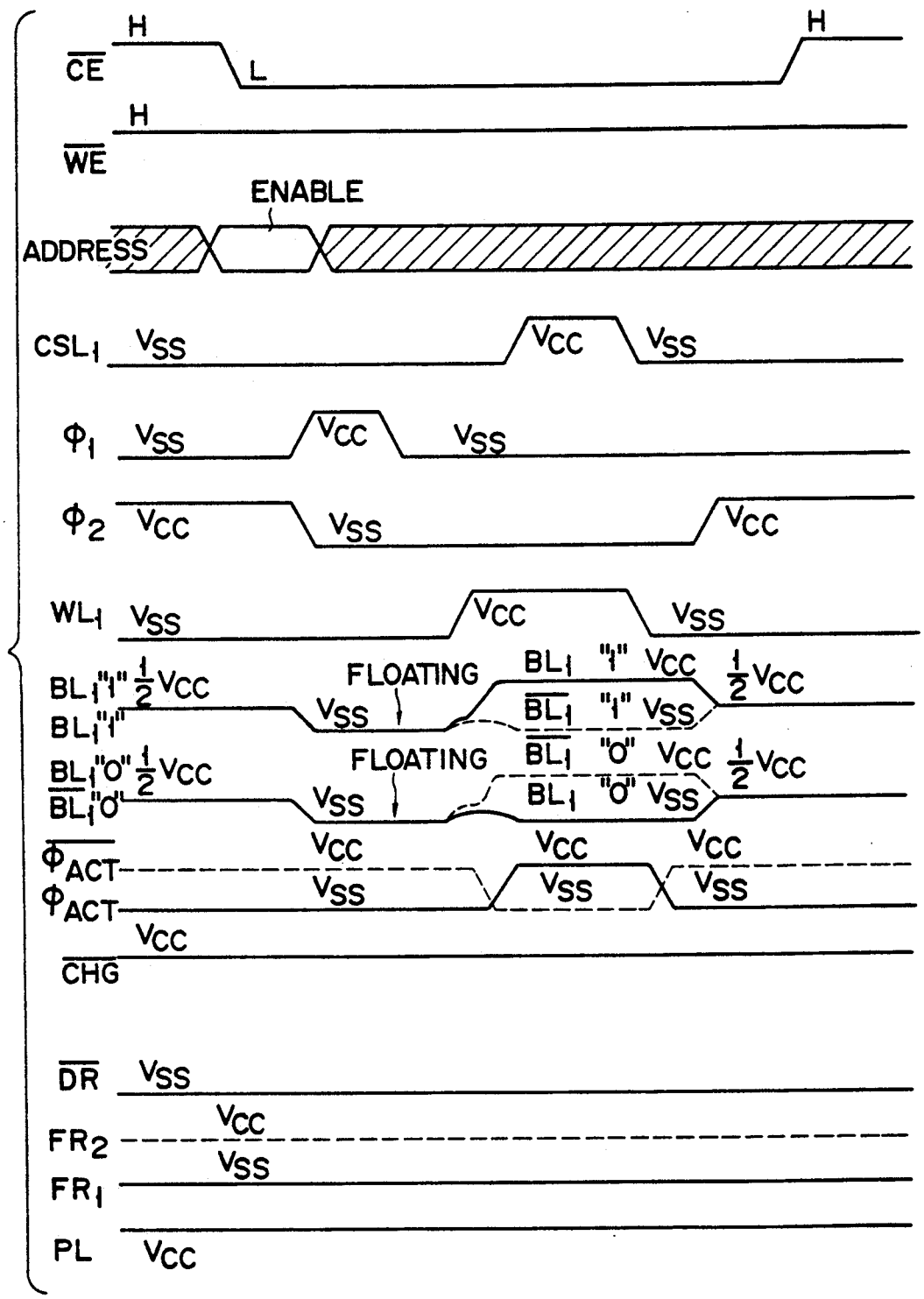
F I G. 23

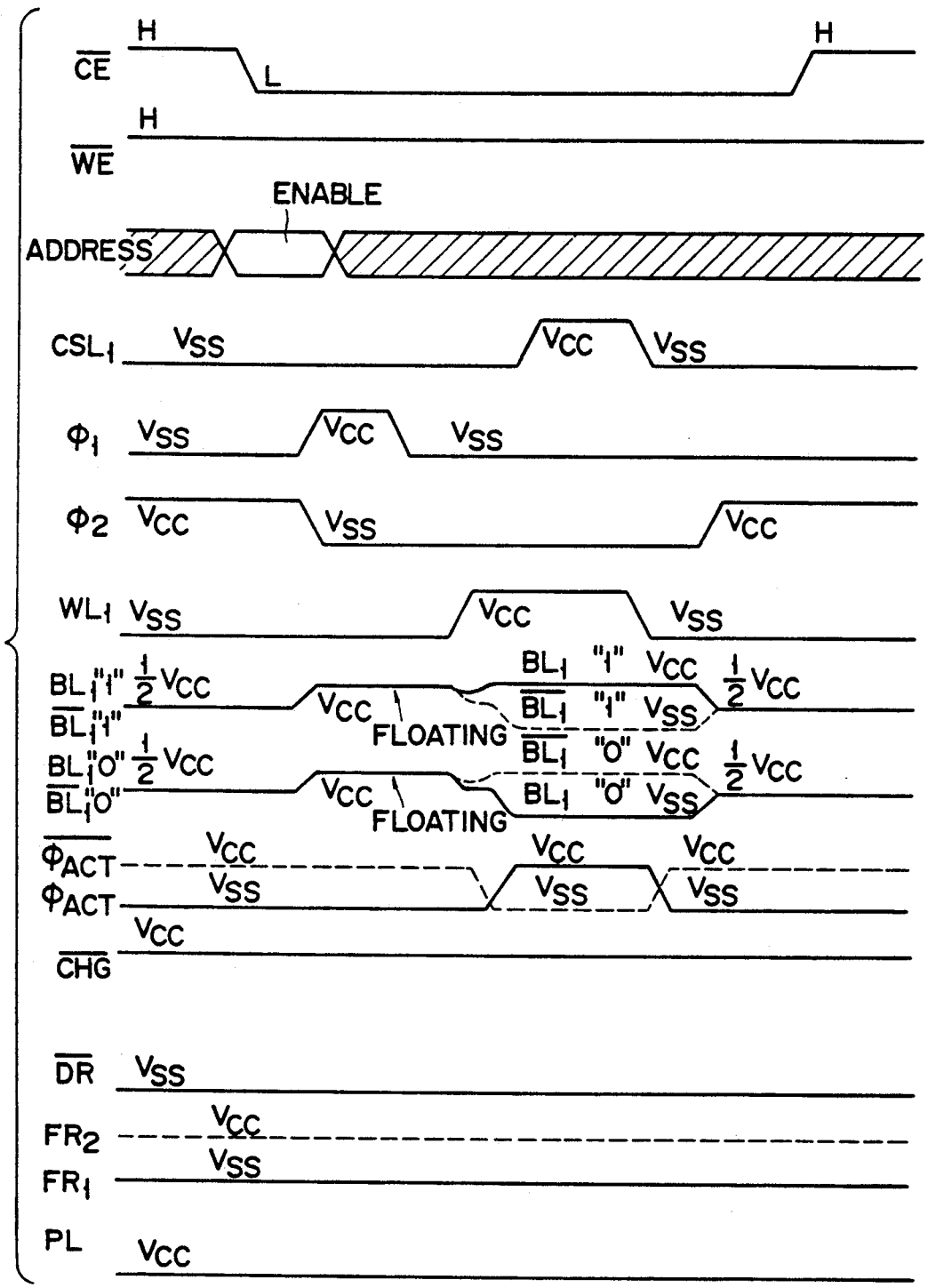
F I G. 24

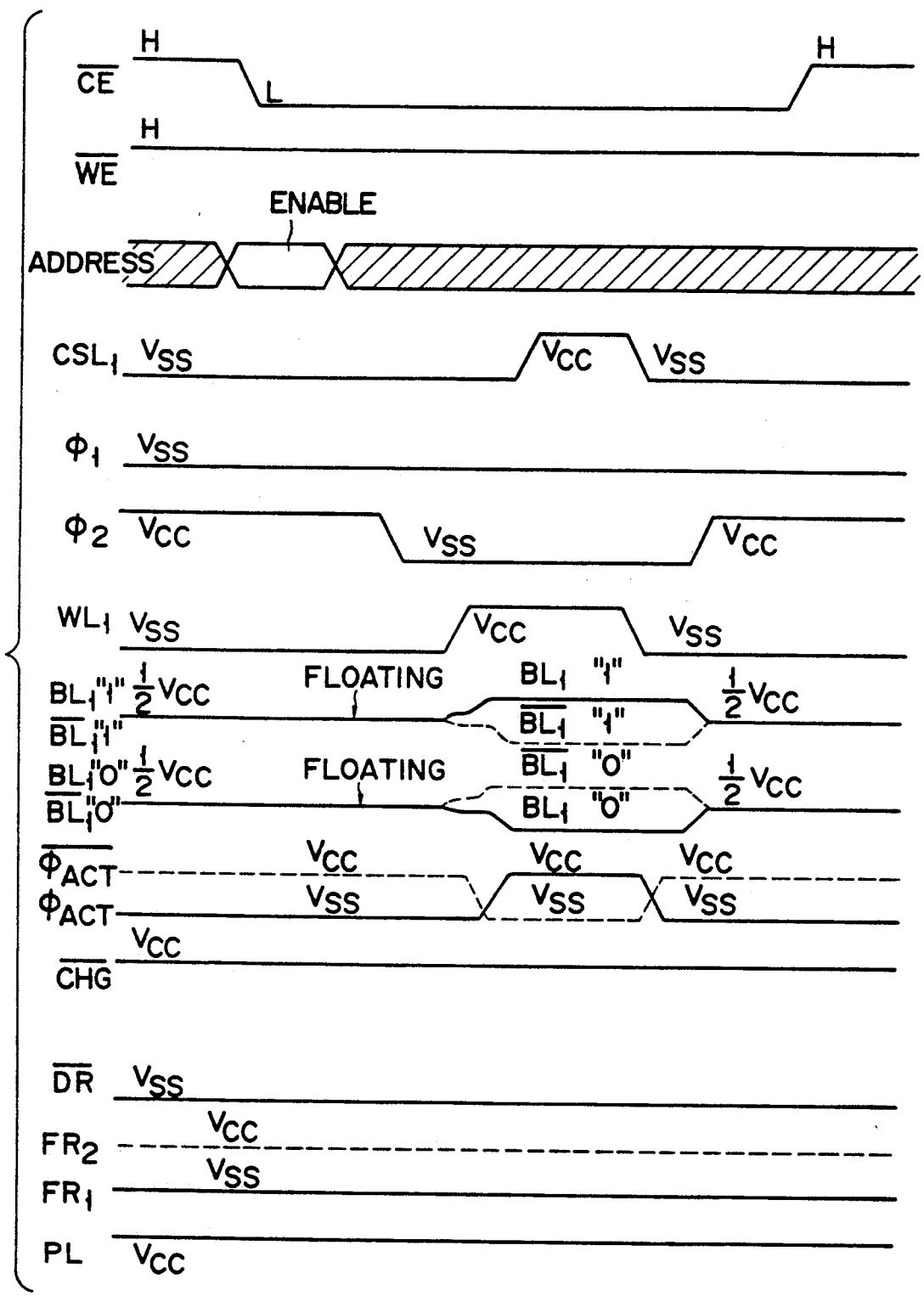
F I G. 26

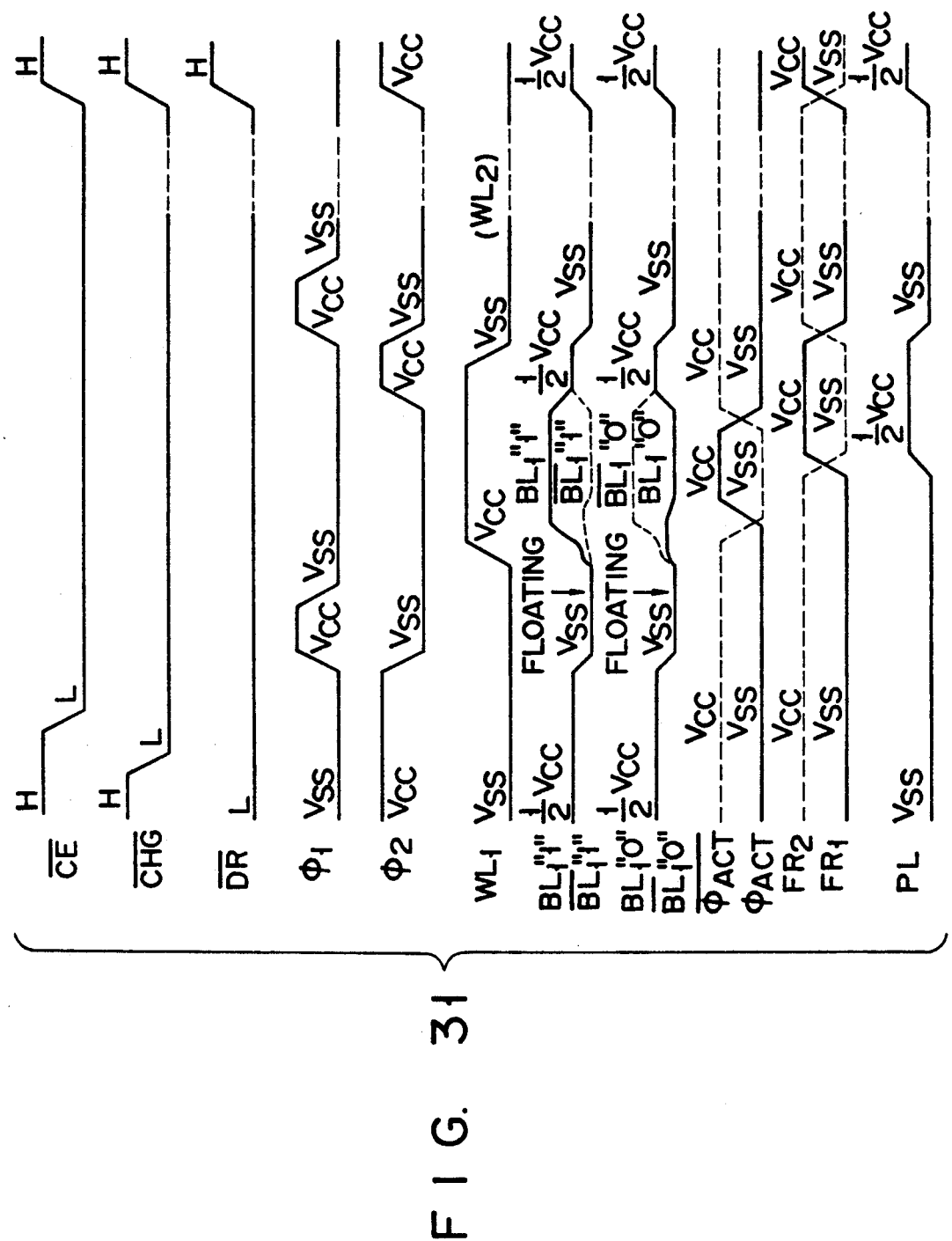
F I G. 31

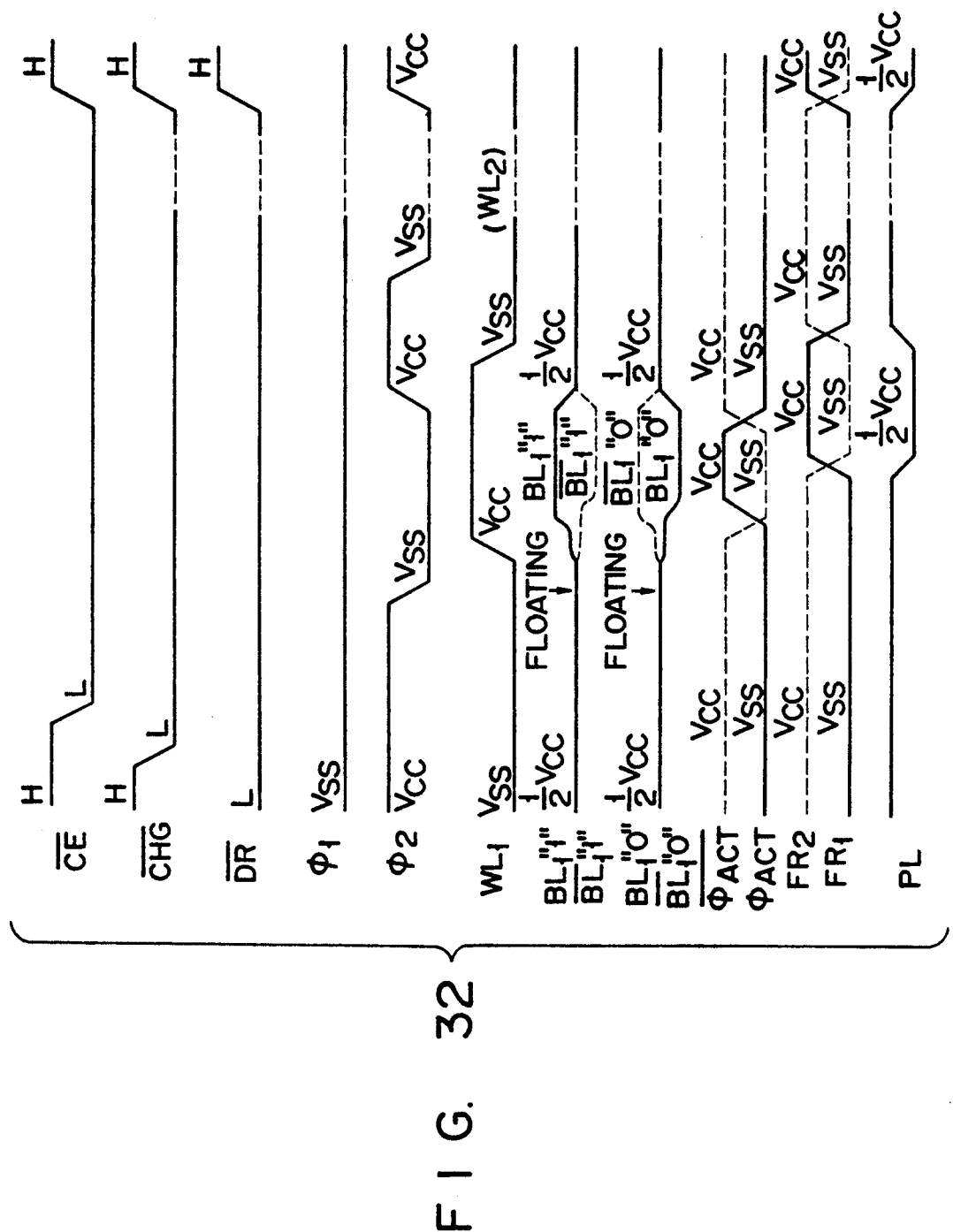
F I G. 32

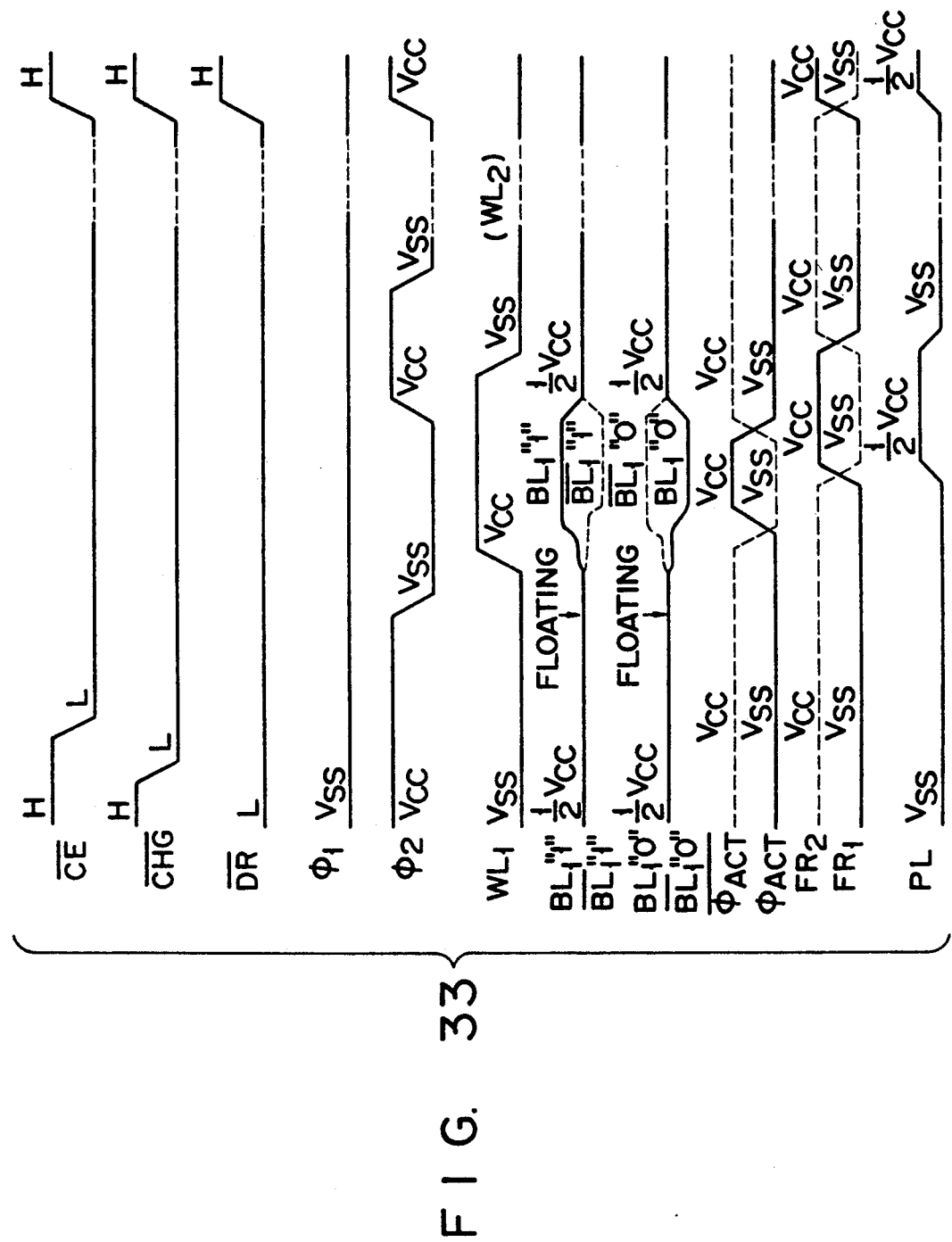
F I G. 33

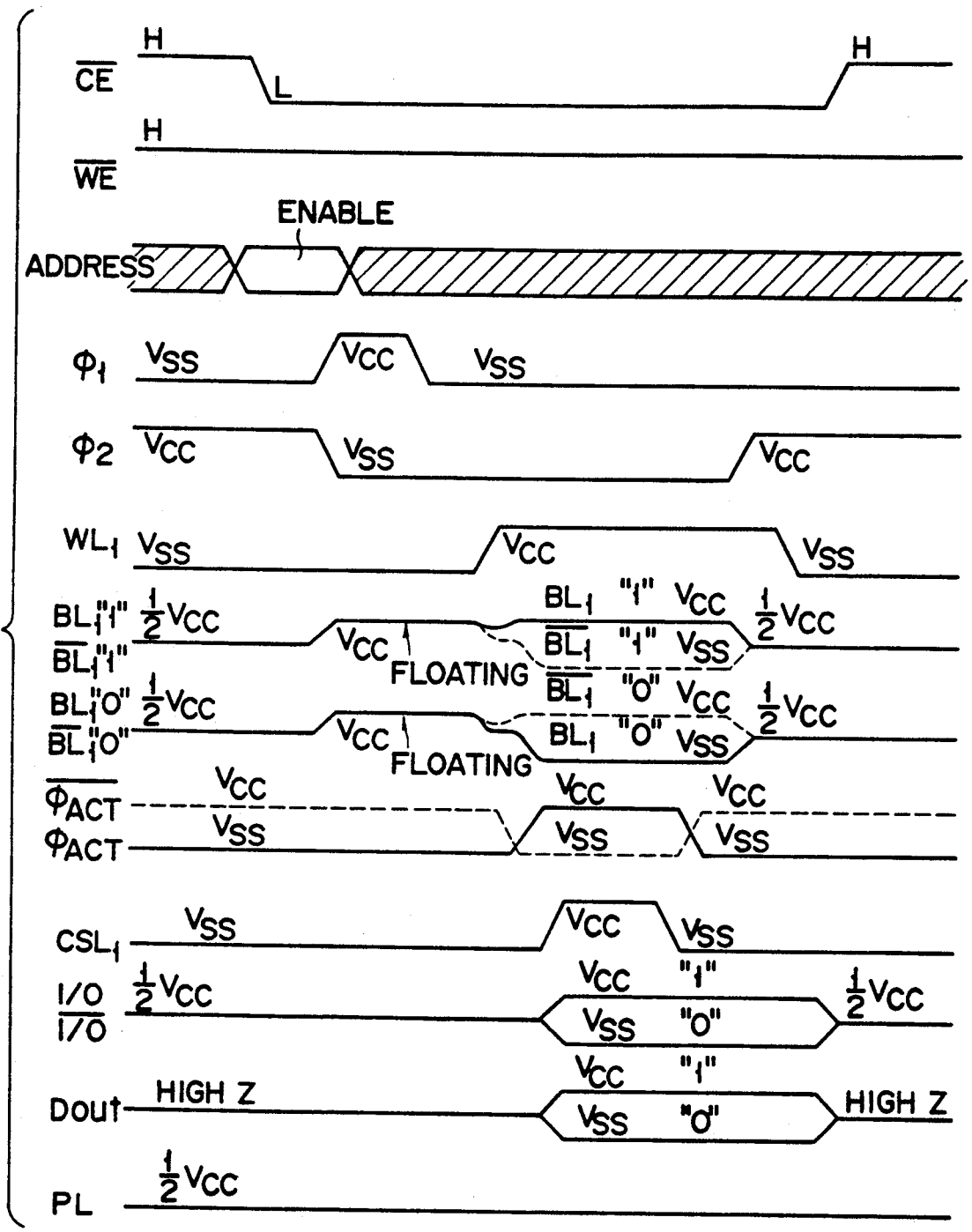
F I G. 37

MEMORY HAVING FERROELECTRIC CAPACITORS POLARIZED IN NONVOLATILE MODE

BACKGROUND OF THE INVENTION

1. Field of the Invention

The present invention relates to a semiconductor memory device, and more particularly to a semiconductor memory device having ferroelectric capacitors.

2. Description of the Related Art

In recent years, the technology of nonvolatile memory which is electrically erasable and programmable has advanced very much. Thanks to this technology advance, various types of nonvolatile memories have been developed. Among these nonvolatile memories is a ferroelectric memory which has ferroelectric capacitors made of ferroelectric material.

Each of the ferroelectric capacitors is polarized, and stores data or does not store data in accordance with the direction in which it is polarized, as is disclosed in Published Unexamined Japanese Patent Application No. 63-201998 corresponding to U.S. patent application Ser. No. 013,746 (filed Feb. 12, 1987). The operating principle of the ferroelectric capacitor will be explained briefly.

The ferroelectric capacitor comprises a plate made of ferroelectric material and two electrodes formed on the opposing two surfaces of the plate. The ferro-electric material has a polarization-voltage characteristic which exhibits hysteresis. Hence, once polarized by applying a voltage to it in one direction or the opposite direction, the ferroelectric capacitor remains polarized (or charged) even after the application of the voltage is stopped. This phenomenon is known as "residual polarization" or "residual charging".

When a voltage is applied to the polarized ferroelectric capacitor so that a voltage larger than a coercive electric field is applied to the ferroelectric capacitor, the ferroelectric capacitor is polarized in an opposite direction.

When to the ferroelectric capacitor is applied a voltage having the same polarity as that of the polarized ferroelectric capacitor, there is accumulated in the ferroelectric capacitor an electric charge which is no more than the value corresponding to the capacitance of the ferroelectric capacitor, just in the same way as in ordinary capacitors made of dielectric material. In contrast, when a voltage is applied to the ferroelectric capacitor at an opposite polarity to the polarity of the polarized capacitor, thus applying an opposite electric field more intense than a predetermined value to the ferroelectric capacitor, the plate is polarized in the opposite direction.

When the ferroelectric capacitor is polarized in the opposite direction, it flows a far greater electric charge than when it is polarized in the same direction as the pre-polarized direction. Whether the plate is polarized in one (first) direction or the other (second) direction can be determined by detecting the charge in the plate in terms of, for example, a voltage drop. Hence, the ferroelectric capacitor can be said to store a "0" when polarized in the first direction and to store a "1" bit when polarized in the second direction. Alternatively, it can be said to store a "0" when polarized in the second direction and to store a "1" bit when polar zed in the first direction.

As has been pointed out, the charge, whether large or small, remains in the plate even when a voltage is no more applied to the plate. The ferroelectric memory is, therefore, nonvolatile. The ferroelectric memory operates at high speed. More specifically, both its write speed and its read speed are about tens of bits per nanosecond (several 10 bit/nsec). Great demand for a ferroelectric memory, i.e., a nonvolatile memory comprising ferroelectric capacitors is now made, and this ferroelectric memory will be used in increasing numbers in the very near future.

When a voltage is applied to the plate of a ferroelectric capacitor in the first direction in order to read the data from the capacitor, the ferroelectric capacitor is not reversely polarized if the capacitor has been polarized in the first direction and stores a "1" bit. However, when a voltage is applied to the ferroelectric capacitor of a ferroelectric capacitor in the first direction in order to read the data from the capacitor, the ferroelectric capacitor is reversely polarized if the capacitor has been polarized in the second direction and stores a "0" bit. In this case, the plate must be polarized in the second direction after the "0" bit has been read from the ferroelectric capacitor. In the case where a voltage is applied to the capacitor in the second direction, thus reading a "1" bit a ferroelectric capacitor, the plate of this capacitor must be polarized in the first direction after the "1" bit has been read from the capacitor.

Obviously, the ferroelectric memory is basically a destructive-reading type. Each ferroelectric capacitor is reversely polarized very frequently.

As is known in the art, the polarization characteristic of a ferroelectric capacitor gradually deteriorates, or the capacitor gradually "wears out," as it is reversely polarized repeatedly. In other words, the more often the plate is polarized reversely, the lower its polarization characteristic. It is generally said that the ferroelectric plate has its polarization characteristic critically deteriorated when it has been reversely polarized $10^{12}$ times or more. The frequency of reverse polarization of the ferroelectric capacitor is one of the most prominent determinants of the lifetime of the ferroelectric capacitor. Hence, it is desirable that the plate be polarized as seldom as possible in order to prolong the lifetime of the ferroelectric capacitor.

Published Unexamined Japanese Patent Application No. 64-66899 corresponding to U.S. patent application Ser. No. 069,390 (filed Jul. 2, 1987) discloses the technique of incorporating a ferroelectric memory in a ordinary semiconductor memory, so that data which need to be preserved can be stored in the ferroelectric memory which is nonvolatile. This technique helps to reduce the frequency of reversely polarizing the capacitor incorporated in the ferroelectric memory. Since the ferroelectric capacitor is not reversely polarized so often, it does not wear out fast. The ferroelectric memory can therefore have a long lifetime.

However, the ordinary semiconductor memory is nothing more than one provided with a back-up memory. If the ordinary semiconductor memory and the ferroelectric memory are formed on the same substrate, as in most cases, the resultant composite memory is rather large and has complicated circuitry. The composite memory cannot easily be manufactured in the form of an integrated circuit.

It is true that the ferroelectric memory has a great prospective use. However, its lifetime is far less long than is desired, due to the wearing-out of the ferroelectric capacitors.

SUMMARY OF THE INVENTION

The object of the present invention is to provide a semiconductor memory which makes an effective use of nonvolatile-storage characteristic of ferroelectric capacitors, which has, nonetheless, a simple structure and a long lifetime.

According to the invention, there is provided a semiconductor memory which comprises ferroelectric capacitors and which can operates in two modes—a volatile mode and a novolatile mode. When the memory is set in the volatile mode, each ferroelectric capacitor functions in the same way as an ordinary capacitor, and storage data is determined in accordance with an amount of the charges accumulated in the capacitor without reverse-polarization. When the memory is set in the nonvolatile mode, each ferroelectric capacitor is polarized reversely, and storage data is determined in accordance with the direction which it is polarized.

The operating mode of the memory can be switched, from the volatile mode to the nonvolatile mode, or vice versa, by a signal externally input, or can automatically be switched by a signal generated when the power switch of the memory is turned on or off.

In the semiconductor memory according to the invention, the ferroelectric capacitors are polarized reversely only while the memory is operating in the nonvolatile mode. Since the capacitors are not polarized reversely as long as memory is set in the volatile mode, the frequency at which the capacitors are polarized reversely during the operation of the memory, in both modes, is much lower than otherwise. The ferroelectric capacitors serve much longer until they wear out, than those of the conventional ferroelectric memory. Hence, the semiconductor memory of the present invention has a lifetime far longer than that of the conventional ferroelectric memory.

In addition, the semiconductor memory according to the invention need not be provided with a back-up memory as is disclosed in Published Unexamined Japanese Patent Application No. 64-66899. This is because each ferro-magnetic capacitor operates as both a volatile cell and a nonvolatile cell. The memory is simple in structure, and its memory cells are small. The memory of the invention can, therefore, easily be manufactured in the form of an integrated circuit.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a graph representing the hysteresis of a ferroelectric capacitor used in the present invention, more precisely the relationship between the voltage applied to the capacitor and the degree of polarization thereof;

FIG. 2A is a circuit diagram showing a ferroelectric memory cell which can be incorporated in a semiconductor memory according to a first embodiment of the present invention;

FIG. 2B is a circuit diagram showing another type of a ferroelectric memory cell which can be incorporated in the semiconductor memory according to the first embodiment of this invention;

FIGS. 4A to 4C are timing charts, explaining how the dummy cells are switched in the semiconductor memory illustrated in FIG. 3;

FIG. 7 is a circuit diagram showing a semiconductor memory according to a third embodiment of this invention, which has no dummy cells;

FIGS. 8A to 8C are timing charts explaining the operation of the memory shown in FIG. 7;

FIG. 14 is a graph representing the relationship between the number of times a drive pulse is applied to each ferroelectric capacitor and the residual charge in the ferroelectric capacitor;

FIG. 15 is a circuit diagram illustrating a semiconductor memory according to a fourth embodiment of the invention, which has a circuit wherein one drive voltage is fixed, while the other drive voltage is switched thereby to polarize an ferroelectric capacitor in one direction or the other;

FIG. 16 through FIG. 33 are timing charts explaining how the memory shown in FIG. 15 operates under various conditions;

FIGS. 36, 37, and 38 are timing charts explaining the operation of the semiconductor memory illustrated in FIG. 35.

DETAILED DESCRIPTION OF THE PREFERRED EMBODIMENTS

Figure 3:
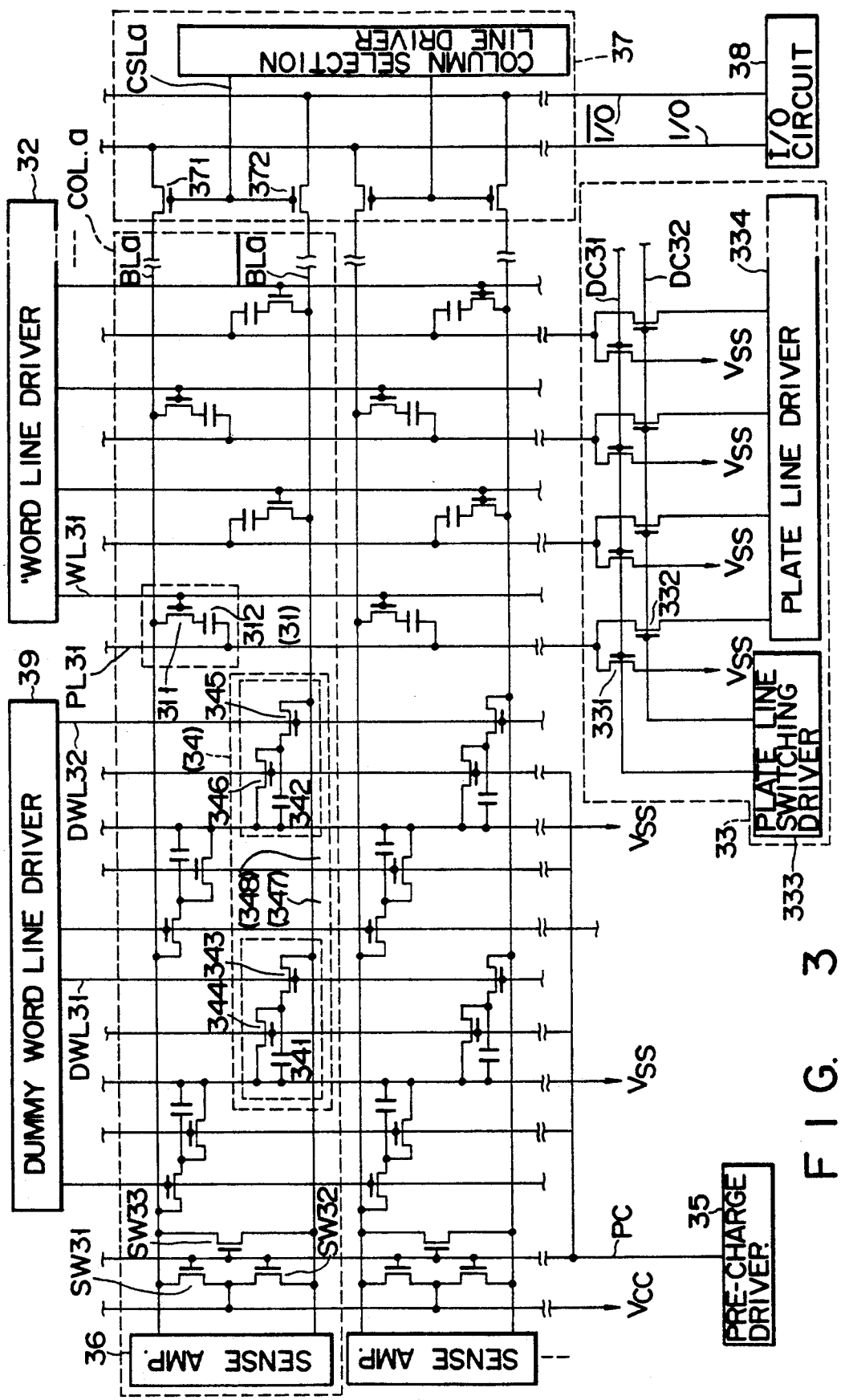
FIG. 3 is a circuit diagram illustrating a semiconductor device according to the first embodiment of the present invention, which has dummy cells.

The operating principle of the present invention will be first described, with reference to the graph of FIG. 1 which represent the hysteresis of a ferroelectric capacitor used in the present invention.

When a driving voltage Vd is applied to the ferroelectric capacitor, it is polarized to a maximum value Pm. When the application of the voltage Vd is stopped, the polarization decreases from the maximum value Pm, but it does not fall below the residual-polarization value Pr. The driving voltage Vd is of such a value that it generates an electric field which is more intense than the opposite electric field required for polarizing the the capacitor reversely, that is, in the opposite direction. Hence, the four points P1, P2, P3, and P4—all in the voltage-polarization coordinates system shown in FIG. 1—are defined as follows:

P1=(Vd, Pm)
P2=(O, Pr)
P3=(−Vd, −Pm)
P4=(O, −Pr)

The semiconductor memory according to the present invention can operate in two data-storing modes. In the first mode, the storage states of points P1 and P2 are a "1" bit and a "0" bit, respectively. In the second mode, the storage states of points P2 and P4 are a "1" bit and a "0" bit, respectively.

First Mode (Volatile Mode)

In the storage state defined by point P1, the ferroelectric capacitor is polarized positively and accumulates an electric charge (Pm−Pr) corresponding to the current which would flow though the capacitor if the capacitor were short-circuited. In the storage state defined by point P2, the capacitor is polarized positively but does not accumulate the electric corresponding to that current. Hence, the storage states defined by points P1 and P2 are a "1" bit and a "0" bit, respectively. When the driving voltage Vd is applied to the capacitor, no new electric charge is applied to the capacitor if the capacitor is in the state of point P1, and new electric charge (Pm−Pr) is applied to the capacitor if the capacitor is in the state of point P2. This new charge is detected, thereby determining the storage state of the ferroelectric capacitor.

In the first mode, once the power switch of the memory is turned off, the current leaks from each ferroelectric capacitor, and no charge can remain in the capacitor. This means that the ferroelectric capacitor functions as a volatile memory cell.

Second Mode (Nonvolatile Mode)

In the storage state defined by point P2, the ferroelectric capacitor is polarized positively, but does not accumulate an electric charge corresponding to the current which would flow though the capacitor if the capacitor were short-circuited. In the storage state defined by point P4, the capacitor is polarized negatively and does not accumulate the electric charge corresponding to that current. Therefore, the storage states defined by points 2 and 4 are a "1" bit and a "0" bit, respectively. When the driving voltage Vd is applied to the capacitor, a new electric charge is applied to the capacitor if the capacitor is in the state of point P2, and a new electric charge Pm−(−Pr) =(Pm+Pr) is applied to the capacitor if the capacitor is in the condition of point P4. The difference between these new charges, i.e. 2Pr, is detected, thereby determining the storage state of the ferroelectric capacitor.

In the second mode, each ferroelectric capacitor is polarized to the value Pr even after the power switch of the memory is turned off. Thus, the ferroelectric capacitor functions as a volatile memory cell as long as the memory is set in the second mode.

Whether the semiconductor memory is operating in the first mode or the second mode, the charge (Pm−Pr) or 2Pr should be as great as possible in order to determine, with high accuracy, the storage state of each ferroelectric capacitor. To this end, it is desirable that the capacitor be made of ferroelectric material which has a rectangular ratio (Pr/Pm) ranging from 0.2 to 0.7. (As is known in the art, rectangular ratio represents the hysteresis characteristic of ferroelectric material.) If the capacitor is made of material having a rectangular ratio of less than 0.2, 2Pr will be insufficient. If the capacitor is made of material having a rectangular ratio of more than 0.7, (Pm−Pr) will be insufficient.

A variety of ferroelectric materials can be used in the invention, among which are: $Pb(Zr, Ti)O_3$ and $(Pb, La)(Zr, Ti)O_3$. The composition of each material is adjusted, a suitable method is employed for forming the ferroelectric body of the capacitor, and the driving voltage Vd is controlled, thereby to adjust the rectangular ratio (Pr/Pm) of the ferroelectric body.

A ferroelectric memory cell, which has the ferroelectric capacitor described above and which can be incorporated in a semiconductor memory according to a first embodiment of the invention, will now be described with reference to FIG. 2A.

As is illustrated in FIG. 2A, the ferroelectric memory cell comprises a ferroelectric capacitor C1, a reference capacitor C2, two switching elements Tr1 and Tr2, and a sense amplifier SA. The first electrode of the ferroelectric capacitor C1 is connected to a bit line BL by the switching element Tr1. The second electrode of the capacitor C1 is connected to a first voltage source VS1. The first electrode of the reference capacitor C2 is connected to a bit line $\overline{BL}$ by the switching element Tr2. The second electrode of thereference capacitor C2 is coupled to a second voltage source VS2. The bit lines BL and $\overline{BL}$ are connected to a sense amplifier SA.

While the semiconductor memory is set in the first mode, i.e., the volatile mode, the ferroelectric capacitor C1 remains polarized in the same direction, not reversely polarized at all, and does nothing but accumulates an electric charge just like an ordinary capacitor. On the other hand, while the semiconductor memory is set in the second mode, i.e., the nonvolatile mode, the capacitor C1 stores data when its polarized state is altered. Therefore, any known method can be used to write data into the memory cell or read data therefrom, provided that either polarized state is detected. In practice, however, the best method is to use a sense amplifier for detecting voltage drops on the bit lines BL and $\overline{BL}$.

This is why the ferroelectric memory cell has the sense amplifier SA.

In the volatile mode, when both bit lines BL and $\overline{BL}$ are set at Vcc potential, electric charges Q1 and Q2 are applied to the ferroelectric capacitor C1 and the reference capacitor C2, respectively. By definition, the memory cell stores a "1" bit when the ferroelectric capacitor C1 accumulates an electric charge, and stores a "1" bit when the capacitor C1 accumulates no electric charge. Hence, while the memory cell is storing a "0" bit, the charge Q1 is applied to the capacitor C1 until the charge accumulated therein reaches the value corresponding to the capacitance Cm of the capacitor C1. On the other hand, while the memory cell is storing a "1" bit, the capacitor C1 is already charged fully, and virtually no new charge can be applied to the capacitor C1. In either case, the charge applied to the reference capacitance C2 is determined by the pre-charged state of the capacitor C2.

The sense amplifier SA compares the voltage drops on the bit lines BL and $\overline{BL}$ which have resulted from the electric charges Q1 and Q2. In this case, the sense amplifier SA determines that the bit lines BL and $\overline{BL}$ are set at a high potential (e.g., Vcc) and a low potential (e.g., Vss), respectively. Let us assume that the charge Q2 applied to the reference capacitor C2 is greater than nil and less than charge Q1 accumulated in the capacitor C1 when the memory cell stores a "0" bit. Then, the bit line BL can be set at the high potential when the memory cell stores a "1" bit, and the bit line $\overline{BL}$ can be set at the high potential when the memory cell stores a "0" bit. In this case, it is preferable that the charge Q2 be set to half the charge Q1 so that the polarized state of the ferroelectric capacitor C1 can be reliably determined.

In actual operation, when the switching element Tr1 electrically connects the ferroelectric capacitor C1 to the bit line BL, the capacitor C1 receives the electric charge which is determined by both the capacitance of the capacitor C1 and the capacitance of the bit line BL. Similarly, when the the switching element Tr2 electrically connects the reference capacitor C2 to the bit line $\overline{BL}$, the capacitor C2 receives the electric charge which is determined by both the capacitance of the capacitor C2 and the capacitance of the bit line $\overline{BL}$.

The electric charge Q2 can be set in accordance with the capacitance of the reference capacitor C2 and the voltage applied to the capacitor C2. For example, the charge Q2 will be 0 if the capacitance Cm' of the capacitor C2 is ½ Cm, the potential of the second voltage source VS2 coupled to the second electrode of the ferroelectric capacitor C2 is at the Vss level, and a voltage at the Vss level is applied to the first electrode of the capacitor C2 via a switching element (not shown). To enable the sense amplifier SA to determine the polarized state of the pre-charged state of the reference capacitor C2, it suffices to set the first electrode of the capacitor C2 at the bit-line potential, i.e., the Vcc level, while maintaining the potential of the second voltage source VS2 at the Vss level.

The first voltage source VS1 applies a Vss-level voltage to the ferroelectric capacitor C1. When the switching element Tr1 electrically connects the capacitor C1 to the bit line BL, the Vcc-level voltage is applied to the capacitor C1 if the memory cell stores a "1" bit. Since the capacitor C1 has already accumulated an electric charge, the charge Q1 applied to the capacitor C1 is substantially nil. By contrast, the charge Q2 applied to the reference capacitor C2 has the value determined by the capacitance Cm' ($=\frac{1}{2}$ Cm) of the capacitor C2 and the voltage Vcc applied to the capacitor C2. Therefore, Q2>Q1 if the memory cell stores a "1" bit. When the sense amplifier SA is activated, the bit lines BL and $\overline{BL}$ are set at the high potential and the low potential, respectively.

If the memory cell stores a "0" bit, the charge Q1 has the value corresponding to the capacitance Cm and the applied voltage Vcc, while the charge Q2 has the value corresponding to the capacitance Cm' ($=\frac{1}{2}$ Cm) and the applied voltage Vcc as in the case where the memory cell stores a "1" bit. Hence, Q1>Q2 if the memory cell stores a "0" bit. When the sense amplifier SA is activated, the bit lines BL and $\overline{BL}$ are set at the low potential and the high potential, respectively.

In the nonvolatile mode, when both bit lines BL and $\overline{BL}$ are set at Vcc potential, electric charges Q3 and Q4 are applied to the ferroelectric capacitor C1 and the reference capacitor C2, respectively. By definition, the memory cell stores a "0" bit when the ferroelectric capacitor C1 is polarized toward the bit line BL, and stores a "1" bit when the capacitor C1 is polarized in the opposite direction. Hence, while the memory cell is storing a "0" bit, the large charge Q3 is applied to the capacitor C1 due to the reverse polarization. On the other hand, while the memory cell is storing a "1" bit, the capacitor C1 is not reversely polarized, and only the charge Q1 which corresponds to the capacitance Cm is applied to the ferroelectric capacitor C1. Let us assume that the charge Q4 applied to the reference capacitor C2 is greater than the charge Q1 and less than the charge Q3 when the memory cell stores a "0" bit. Then, the bit line BL can be set at the high potential when the memory cell stores a "1" bit since Q1<Q4, and the bit line BL can be set at the high potential when the memory cell stores a "0" bit since Q4<Q3. In this case, it is preferable that the charge Q4 be set exactly half way between Q1 and Q3 so that the polarized state of the ferroelectric capacitor C1 may be reliably determined.

Let us assume that the reference capacitor C2 has a capacitance Cm' which equals 2Cm, and also that the second voltage source VS2 coupled to the second electrode of the capacitor C2 is set at the Vss potential when the capacitor is in pre-charged state i.e., in waiting state. Then, the charge accumulated in the reference capacitor C2 decreases to nil when the Vss-level voltage is applied to the first electrode of the capacitor C2 through the switching element (not shown). Meanwhile, a Vss-level voltage is applied from the first voltage source VS1 to the first electrode of the ferroelectric capacitor C1. The bit lines BL and $\overline{BL}$, both set at the Vcc level, are connected to the ferroelectric capacitor C1 by the switching element Tr1. In this condition, a voltage of the polarity equivalent to the polarized direction of the capacitor C1 is applied to the ferroelectric capacitor C1 while the memory cell is storing a "1" bit. This means that the capacitor C1 is not reversely polarized. Hence, the charge Q1 corresponding to the capacitance Cm flows to the ferroelectric capacitor C1, whereas the greater charge Q4 corresponding to the capacitance Cm' (=2Cm) and applied voltage Vcc flows to the reference capacitor C2. As a result, Q4>Q1, and thus the bit lines BL and $\overline{BL}$ are set at the high potential and the low potential, respectively, while the memory cell is storing a "1" bit.

If the memory cell stores a "0" bit, a voltage is applied to the ferroelectric capacitor C1 to polarize this capacitor reversely. As a result of this, the charge Q3 becomes great enough to polarize the capacitor C1 in the reverse direction. More specifically, the charge Q3 increases to a value which corresponds to, for example, 3Cm. By contrast, the charge Q4 is less than Q3. Hence, the bit lines BL and $\overline{BL}$ are set at the low potential and the high potential, respectively, while the memory cell is storing a "0" bit.

Data can be written into the memory cell by setting both bit lines BL and $\overline{BL}$ at either the "0" level or the "1" level and then turning on both switching elements Tr1 and Tr2.

With reference to FIG. 2B, another type of a ferroelectric memory cell according to the invention will be described. This memory cell is different from the ferroelectric memory cell shown in FIG. 2A, in the following three respects. First, it has a first changeover switch SW1 for connecting a ferroelectric capacitor C1 to either a predetermined voltage source or the ground electrode. Second, it has two reference capacitors C2a and C2b, whereas the memory cell of FIG. 2A has only one reference capacitor C2. Third, it has a second changeover switch SW2 for connecting the reference capacitor C2a or C2b through a switching element Tr2 to a bit line $\overline{BL}$.

The first reference capacitor C2a has such a capacitance as to receive an electric charge less than the charge which is applied to the ferroelectric capacitor C1 when the first voltage is applied to the capacitor C1 while a driving voltage is being applied to the memory cell. The second reference capacitor C2b has such a capacitance as to receive an electric charge which is less than the charge applied to the capacitor C1 when the second voltage is applied thereto, thus reversely polarizing the capacitor C1, while the driving voltage is being applied to the memory cell, and which is greater than the charge applied to the capacitor C1, not reversely polarizing the capacitor C1.

The ferroelectric capacitor C1 is connected to a sense amplifier SA by means of a bit line BL and a switching element Tr1. Either the first reference capacitor C2a or the second reference capacitor C2b is connected to the sense amplifier SA by means of the switching element Tr2 and the bit line $\overline{BL}$.

When the first changeover switch SW1 connects the ground electrode to the ferroelectric capacitor C1, thus applying the first voltage to the capacitor C1, the second changeover switch SW2 automatically connects the first reference capacitor C2a. When the first changeover switch SW1 connects the voltage source to the ferroelectric capacitor C1, thereby applying the predetermined voltage to the capacitor C1, the second changeover switch SW2 automatically connects the second reference capacitor C2b.

The ferroelectric capacitor C1 is coupled to the sense amplifier SA by the bit line BL, and both reference capacitors C2a and C2b are coupled to the sense amplifier SA by the bit line $\overline{BL}$. The sense amplifier SA amplifies the voltage corresponding to the voltage drop on the bit line BL, which results from the electric charge applied to the ferroelectric capacitor C1. The sense amplifier SA also amplifies the voltage corresponding to the voltage drop on the bit line $\overline{BL}$, which results from the electric charges applied to the reference capacitor C2a or C2b. Hence, the polarized state of the ferroelectric capacitor C1, i.e., the data stored in the capacitor C1, is determined in accordance with the potentials of the bit lines BL and $\overline{BL}$.

An amount of electric charges charged in the reference capacitor can be determined to an amount of electric charges applied to the reference capacitor C2 when the capacitor C2 is not charged at all, or an amount of electric charges applied thereto when the capacitor C2 is already charged to some value.

The two reference capacitors C2a and C2b can be replaced by a single reference capacitor C2 which has capacitance Cm'. If so, this capacitor C2 is coupled to a second voltage source VS2, and the voltage to be applied to the capacitor C2 is switched. More specifically, the voltage applied to the capacitor C2 is controlled to satisfy the following conditions:

$$Q3 > Q4 > Q3'$$

$$Q1 > Q2 > Q1'$$

where Q3 is the charge applied to the capacitor C1, polarizing the capacitor C1 reversely, Q3' is the charge applied to the capacitor C1, not polarizing the capacitor C1 reversely, Q1 is the charge applied to the capacitor C1 when the cell stores a "0" bit, and Q1' is the charge applied to the capacitor C1 when the cell stores a "1" bit.

For instance, if the capacitance Cm'', which corresponds to the charge applied to the capacitor C1 to polarize the capacitor C1 in the reverse direction, is set to about 3Cm', the capacitance Cm' of the reference capacitor C2 is set to 2Cm. The reference charge accumulated in the capacitor C2 is nil when the semiconductor memory is set in the nonvolatile mode, and is a charge corresponding to $\frac{3}{4}$ Vcc when the semiconductor memory is set in the volatile mode. Vcc is identical to the voltage applied to the ferroelectric capacitor C1. In this instance, the sense amplifier SA compares the potentials on the bit lines BL and $\overline{BL}$, thereby reading the data from the memory cell in the same way as from the memory cell illustrated in FIG. 2A.

The modification of the memory cell shown in FIG. 2B, which has a single reference capacitor C2, is similar to the cell shown in FIG. 2A in terms of structure. However, the voltage source VS1 outputs either of a first voltage polarizing the capacitor C1 in the reverse direction when it is applied to the ferroelectric capacitor C1 or a second voltage which does not change the polarization direction of the capacitor C1 irrespective of the content of stored data when it is applied to the capacitor C1. The voltage source VS2 includes a reference capacitor charge control circuit. This charge control circuit controls an amount of charges to be precharge in the reference capacitor C2 before a drive voltage is applied thereto, so that the charge is supplied to the capacitor C2, which is less than the charge the capacitor C1 accumulates when the voltage source VS1 applies the first voltage to the capacitor C1, and the charge is supplied to the reference capacitor C2, which is less than the charge the capacitor C1 accumulates when the capacitor C1 is polarized reversely and greater than the charge the capacitor C1 accumulates when the capacitor C1 is not polarized reversely.

The capacitors C1 and C2 of the modified memory cell are connected to the sense amplifier SA by the bit lines BL and $\overline{BL}$, respectively. The sense amplifier SA amplifies the voltage corresponding to the voltage drop on the bit line BL, which results from the electric charge the ferroelectric capacitor C1 accumulates when a driving voltage is applied to it. The sense amplifier SA also amplifies the voltage corresponding to the voltage drop on the bit line $\overline{BL}$, which results from the electric charge the reference capacitor C2 accumulates when a driving voltage is applied to it. Hence, the sense amplifier SA determines the polarized state of the ferroelectric capacitor C1, i.e., the data stored in the capacitor C1, in accordance with the potentials of the bit lines BL and $\overline{BL}$, whereby the data is read from the ferroelectric memory cell.

A ferroelectric memory cell of another type, which is another modification of the memory cell of FIG. 2B, can be used in the semiconductor memory according to the present invention. The second modification will be described briefly.

As has been described, the memory cell of FIG. 2B is characterized by the use of two reference capacitors, one used in the volatile mode, and the other used in the nonvolatile mode. However, two references capacitors may be formed of ferroelectric capacitors which are polarized in the opposite directions or which are charged in different amounts of charges. In this case, a "0" bit or a "1" bit is determined in accordance with either the charges which these reference capacitors accumulate, or the directions in which they are polarized.

More specifically, when the semiconductor memory is set in the volatile mode, one of the reference capacitors accumulates an electric charge, whereas the other reference capacitor accumulates no charge at all. Hence, the bit line connected to the reference capacitor accumulating the charge is set at a high level, and the bit line connected to the reference capacitor accumulating no charge is set at a low potential since a large voltage drop occurs on this bit line. On the other hand, when the semiconductor memory is set in the non-volatile mode, the two reference capacitors are polarized in the opposite directions, whereby the bit line connected to the reference capacitor polarized toward the bit line is set at a high potential, whereas the bit line coupled to the other reference capacitor polarized reversely is set at a low potential.

As can be understood from the above, while the semiconductor memory remains in the volatile mode, the ferroelectric capacitor of each memory cell is not polarized in the reverse direction. Therefore, the write/read time is short, and the ferroelectric capacitor is prevented from wearing out.

The memory cell can function not only as a volatile cell while a driving voltage is applied to it, but also as a nonvolatile cell even after the supply of the driving voltage has been stopped. This is because it has a main capacitor and at least one reference capacitor, which are made of the same ferroelectric material. Obviously, the semiconductor memory of the invention is more simple in structure than the conventional memory which comprises a ferroelectric memory and an ordinary volatile memory. Therefore, the memory according to the invention can be more easily be manufactured in the form of an integrated circuit.

The semiconductor memory according to an embodiment of the present invention will now be described in detail, with reference to FIG. 3.

As is illustrated in FIG. 3, the memory has word lines WL31, plate lines PL31 extending parallel to the word lines WL31, and bit lines BLa and $\overline{BLa}$ intersecting with the word lines WL31. It further comprises a plurality of memory cells 31 arranged in rows and columns, and located at the intersections of the word lines WL31 and the bit lines BLa. Each of the memory cells 31 has a switching element 311 and a ferroelectric capacitor 312. The switching element 311 is connected to the nearest word line WL31, which in turn is connected to a word-line driver 32. Hence, the word line driver 32 are connected to the switching elements 311 of all memory cells 31; it drives, at a time, the switching elements 311 connected to the same word line WL31. The first electrode of the capacitor 312 of each memory cell 31 is connected by the switching element 311 to the nearest bit line BLa. The second electrode of the capacitor 312 is coupled to the nearest plate line PL31, which in turn is connected to a plate line driver 33.

The plate line driver 33 comprises a plurality of switching elements 331, a plurality of switching elements 332, a plate-line switching driver 333, and a plate-line driver unit 334. The switching elements 331 are coupled to the plate-line switching driver 333 by means of a switching signal line DC31. The driver 333 generates and supplies a signal to the elements 331 via the line DC31. The switching elements 332 are also coupled to the plate-line switching driver 333 by means of a switching signal line DC32. The driver 333 produces and supplies a signal to the elements 332 through the line DC32. The switching elements 332 are also connected to the plate-line driving unit 334.

The plate lines PL31 are coupled to the switching elements 331 and energized to the Vss level, and then ar supplied via the switching elements 332 to the plate-line driving unit 334.

As is evident from FIG. 3, the semiconductor memory further comprises a plurality of reference sections 34. Each of these section 34 comprises a volatile cell 347 and a nonvolatile cell 348. The volatile cell 347 has one reference capacitor 341 and two switching elements 343 and 344. The nonvolatile cell 348 has one reference capacitor 342 and two switching elements 345 and 346.

The first electrode of the reference capacitor 341 is coupled to the switching element 343 which is a driving element. The switching element 343 is connected to the nearest bit line $\overline{BLa}$. The switching element 343 can be driven by the signal on a dummy word line DWL31 which is connected to a dummy word-line driver 39. The second electrode of the reference capacitor 341 is set at the Vss-level potential. Both electrodes of the reference capacitor 341 are coupled to each other by means of the switching element 344 which is a pre-charging element. The switching element 344 is controlled by a pre-charge driver 35.

The first electrode of the reference capacitor 342 is set at the Vss-level potential. The second electrode of the capacitor 342 is coupled to the switching element 345, which in turn is connected to the nearest bit line $\overline{BLa}$. The switching element 345 can be driven by a signal on a dummy word line WL32 which is coupled to the dummy word-line driver 39. Both electrodes of the reference capacitor 342 are connected to each other by mean of the switching element 346 which is a precharging element. The switching element 346 is controlled by the pre-charge driver 35.

The semiconductor memory further comprises a plurality of sense amplifiers 36, a column-selecting section 37, a data input/output circuit 38. The section 37 comprises pairs of switching elements, each pair consisting of two switching transistors 371 and 372, and a column-selection line driver 373. The sense amplifiers 36 are provided for pairs of bit lines, respectively. Each pair of bit lines BLa and $\overline{BLa}$ are connected at one end to the corresponding sense amplifier 36, and at the other end to the switching elements 371 and 372 of the corresponding pair. These elements 371 and 372 are connected to the data input/output circuit 38 by means of two input/output lines I/O and $\overline{I/O}$, respectively. The bit lines BLa and $\overline{BLa}$ of each pair are connected to switching elements SW31 and SW32, respectively, and are thus set at the Vcc potential. The bit lines BLa and $\overline{BLa}$ of each pair are connected to each other by a switching element SW33 which is driven by the pre-charge driver 35.

As may be seen from FIG. 3, one reference section 34 and a number of memory cells 31 are connected to each sense amplifier 36, constituting a column memory array a. Hence, the semiconductor memory has a number of column memory arrays. These column memory arrays are selected, one at a time, by means of the column-selecting section 37. The memory cells of any column memory array selected are selected, one at a time, by the word line driver 32. Either the ferroelectric capacitor 312 or the reference capacitor 341 is selected by fall-dead operation similar to the one performed in a DRAM. The reference capacitor 341 or 342 of each reference section 34 is selected in accordance with the operation mode of the memory, i.e., the volatile mode or the nonvolatile mode.

Figure 4A:
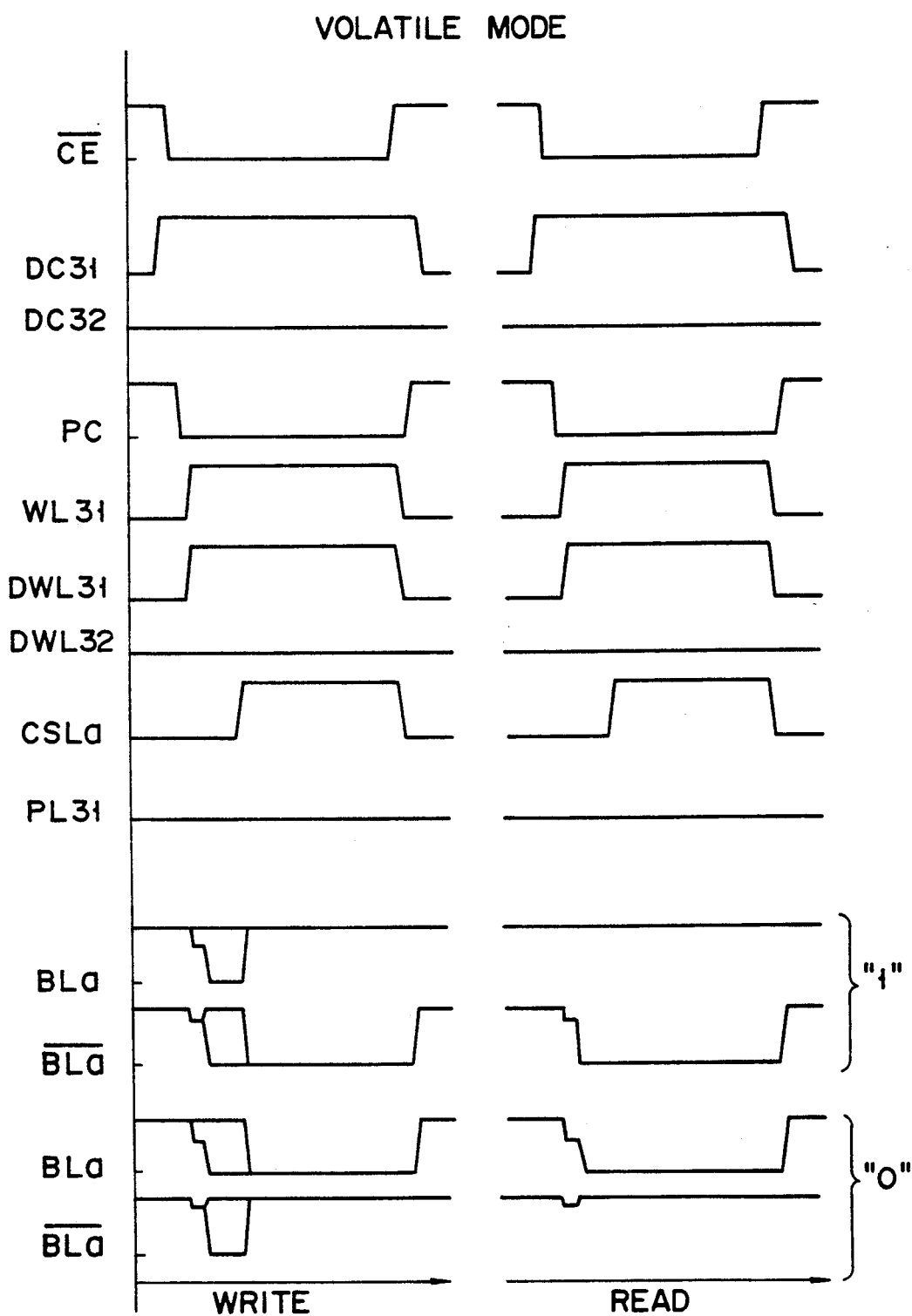

The operation of the semiconductor memory shown in FIG. 3 will be explained, with reference to the timing charts of FIGS. 4A to 4C.

A voltage of 7.5 V is applied to the word lines, whereas a voltage of 5 V is applied to the bit lines. Each reference capacitor 341, which operates while the memory is in the volatile mode, has a capacitance of, for example, ½ Cm which is less than capacitance Cm which the ferroelectric capacitor 312 have while the memory is operating in the nonvolatile mode and, hence, when the capacitor is not reversely polarized. On the other hand, each reference capacitor 342, which operates while the memory is in the nonvolatile mode, has a capacitance of, for example, 2Cm which is greater than capacitance Cm and less than the charge applied to the ferroelectric capacitor 312 when the capacitor is reversely polarized.

(1) Volatile Mode

By definition, each memory cell 31 is assumed to store a "1" bit when the ferroelectric capacitor 312 accumulates an electric charge, and to store a "0" bit when the capacitor 312 accumulates no electric charge. The ferroelectric capacitor 312 accumulates a charge when a voltage is applied to the capacitor 312 in one direction, without polarizing the same in the reverse direction.

(a) Data-Writing Operation

When the memory remains in wait state, the pre-charge line PC is held at the high level, whereas the the bit lines BLa and $\overline{BLa}$ of each pair are held at the Vcc level. Each reference capacitor 341 is short-circuited. The plate-line switching driver 333 generates a signal, which sets the switching signal line DC31 at the high level. As a result, the switching elements 331 of the plate line driver 33 are turned on, setting the plate lines PL31 at the Vss level.

The semiconductor is activated by a chip enable signal $\overline{CE}$ supplied from an external device (not shown). Then, the pre-charge line PC is set at the low level, whereby the bit lines BLa and $\overline{BLa}$ of each pair are set at the Vcc level and brought into floating state. In accordance with the address signal for each memory cell 31 and the selected operation mode of the memory, the word line WL31 and the dummy word line DWL31, both corresponding to the memory cell 31, are set at the high level, so that the switching elements 311 and 343 are turned on. Hence, the ferroelectric capacitor 312 and the reference capacitor 341 are electrically connected to the bit lines BLa and $\overline{BLa}$, respectively. The potentials of the bit lines decrease in accordance with the charges accumulated in the capacitors 312 and 341. When the sense amplifier 36 is activated, the bit lines BLa and $\overline{BLa}$ are set at complementary levels, i.e., the high level and the low level, respectively.

Let us assume that the memory cell stores a "1" bit. In this case, the potential of the bit line BLa falls a little since the ferroelectric capacitor 312 accumulates an electric charge, whereas the potential of the bit line $\overline{BLa}$ greatly falls to the value which is determined by the capacitance of the reference capacitor 341 and that of the bit line $\overline{BLa}$. As a result, the bit line BLa connected to the ferroelectric capacitor 312 by the switching element 311 is set at a potential higher than that of the bit line $\overline{BLa}$ which is connected to the reference capacitor 341 by the switching element 343. Thus, the bit lines BLa and $\overline{BLa}$ are set at the high level and the low level, respectively, while the memory cell 31 is storing a "1" bit.

Let us now assume that the memory cell 31 stores a "0" bit. In this case, an electric charge flows to the ferroelectric capacitor 312, as much as the capacitance thereof, since the capacitor 312 has accumulated no charge at all. The potential of the bit line BLa therefore falls. An electric charge is applied to the reference capacitor 341, too. This charge is less than that applied to the ferroelectric capacitor 312 since the capacitor 341 has a smaller capacitance than the capacitor 312. Hence, the potential of the bit line $\overline{BLa}$ falls less than the potential of the bit line BLa. As a result, the bit line BLa is set at a potential lower than that of the bit line $\overline{BLa}$. In other words, the bit lines BLa and $\overline{BLa}$ are set at the low level and the high level, respectively, while the memory cell 31 is storing a "0" bit.

Thereafter, when the column-selection line driver 373 drives the column-selecting line CSLa, raising the potential of this line to the high level, the switching elements 371 and 372 are turned on. The bit lines BLa and $\overline{BLa}$ are thereby connected to the data input/output lines I/O and $\overline{I/O}$, respectively. As a result of this, the bit lines BLa and $\overline{BLa}$ are set at the potentials of the lines I/O and $\overline{I/O}$. Hence, the ferroelectric capacitor 312 accumulates an charge, thus storing a "1" bit, if the data input/output line I/O is set at the high level; the capacitor 312 accumulates no charge, thus storing a "0" bit, if the line I/O is set at the low level.

To set the semiconductor memory back into the pre-charged condition, a chip enable signal $\overline{CE}$ at the high level is supplied to the memory from the external device (not shown). Simultaneously, for the same purpose, the word-line driver 32, the dummy word-line driver 39, and the column-selection line driver 373 output drive signals, which set the word line WL31, the dummy word line DWL31, and the column-selecting line CSLa—all at the low level. As a result of this, the switching elements 311, 343, 371, and 372 are turned off. Then, the pre-charge driver 35 outputs a drive signal, which sets the pre-charge line PC at the high level.

Hence, data can be written into the memory cell 31 of one column memory array.

To write data into the memory cell 31 of any other column memory array, it suffices to repeat the sequence of the operations described in the preceding paragraph. In other words, it is unnecessary to set the semiconductor memory back into the pre-charge condition in preparation for writing data into another column memory array.

In the instance described above, data is written into a column memory array after the pair of bit liens, i.e., BLa and BLa, have been set to specified potentials. Nevertheless, according to the invention, data can be written through the data input/output lines I/O and I/O before the bit liens BLa and $\overline{BLa}$ are not set at the specified potentials.

(b) Data-Reading Operation

The same sequence of operations is performed, as in the data-writing operation, up until the pair of bit lines BLa and $\overline{BLa}$ of any selected column memory array are set at specified potentials. Thereafter, the column-selecting line driver 373 outputs a high-level signal to the column-selecting line CSLa. The switching elements 371 and 372 are thereby turned on. Hence, the data detected by the sense amplifier 36 is output to the data input/output lines I/O and $\overline{I/O}$. Thus, the data is read from the selected column memory array.

(2) Nonvolatile Mode

While the semiconductor memory is set in the nonvolatile mode, which data bit each memory cell stores is determined by the direction in which the ferroelectric capacitor 312 is polarized. To be more specific, each memory cell 31 stores a "1" bit when the capacitor 312 is polarized toward the plate line $\overline{PL31}$, and stores a "0" bit when the capacitor 312 is polarized toward the bit line BLa.

(a) Data-Writing Operation

When the memory remains in wait state, the precharge line PC is held at the high level, whereas the bit lines BLa and $\overline{BLa}$ of each pair are held at the Vcc level, just as in the case where the memory is set in the volatile mode. The plate-line switching driver 333 generates a signal, which sets the switching signal line DC32 at the high level. As a result, the switching elements 332 of the plate line driver 33 are turned on, connecting the plate lines PL31 to the plate-line driving unit 334. At this time, a low-level (Vcc) signal is supplied to the plate lines PL31.

The semiconductor is activated by a chip enable signal $\overline{CE}$ supplied from from an external device (not shown). Then, the pre-charge line PC is set at the low level, whereby the bit lines BLa and $\overline{BLa}$ of each pair are set at the Vcc level and brought into floating state. In accordance with the address signal for one of the memory cell 31 and the selected operation mode of the memory, the word line WL31 and the dummy word line DWL32, both corresponding to the memory cell 31, are set at the high level. The switching element 311 of the cell 31 and the switching element 345 connected to the dummy word line DWL32 are thereby turned on. Hence, the ferroelectric capacitor 312 and the reference capacitor 342 are electrically connected to the bit lines BLa and $\overline{BLa}$, respectively. The potentials of the bit lines decrease in accordance with the charges accumulated in the capacitors 312 and 342. When the sense amplifier 36 is activated, the bit lines BLa and $\overline{BLa}$ are set at complementary levels, i.e., the high level and the low level, respectively.

Let us assume that the memory cell stores a "1" bit. In this case, the ferroelectric capacitor 312 is polarized toward the plate line PL31. That is the capacitor 31 is polarized such that the bit line BLa is set at the high potential. Hence, an electric charge equivalent to the capacitance (Cm) of the capacitor 312 flows to the ferroelectric capacitor 312. This is because a voltage is applied to the capacitor in the same direction as the direction in which the capacitor 312 is polarized. By contrast, the reference capacitor 342 accumulates an electric charge equivalent to its capacitance (2Cm). Hence, the potential of the bit line $\overline{BLa}$ coupled to the reference capacitor 342 through the switching element 345 falls more than the potential of the bit line BLa. As a result, the bit lines BLa and $\overline{BLa}$ are set at the high level and the low level, respectively, while the memory cell 31 is storing a "1" bit.

Let us now assume that the memory cell 31 stores a "0" bit. In this case, the ferroelectric capacitor 312 is polarized toward the bit line BLa. Hence, when the capacitor 312 is connected to the bit line BLa which is set at the Vcc level and thus held in the floating state, an electric field having the polarity opposite to the polarity of the capacitor 312 is applied to the ferroelectric capacitor 312. The capacitor 312 is thereby polarized reversely. As a result of this, a great charge flows to the ferroelectric capacitor 312, whereby the potential of the bit line BLa falls more than that of the bit line $\overline{BLa}$. In other words, the bit lines BLa and $\overline{BLa}$ are set at the low level and the high level, respectively, while the memory cell 31 is storing a "0" bit.

Thereafter, when the column-selection line driver 373 drives the column-selecting line CSLa, raising the potential of this line to the high level, the switching elements 371 and 372 are turned on. The bit lines BLa and BLa are thereby connected to the data input/output lines I/O and $\overline{I/O}$, respectively. As a result of this, the bit lines BLa and $\overline{BLa}$ are set at the potentials of the lines I/O and $\overline{I/O}$. As has been described, the plate line PL31 is initially set at the low level. Hence, the ferroelectric capacitor 312 is polarized in such a direction that the memory cell 31 stores a "1" bit when the data input/output line I/O is set at the high potential.

The ferroelectric capacitor 312 is not polarized reversely when the data input/output line I/O is held at the low potential. This is because both ends of the capacitor 312 are at the low level as long as the line I/O remains at the low potential. In this condition, the capacitor 312 is polarized such that the memory cell 31 stores a "1" bit. When the plate-line driving unit 334 applies a Vcc-level voltage to the capacitor 312, this voltage has the polarity opposite to the polarity of the capacitor 312. As a result, the ferroelectric capacitor 312 is polarized reversely, so that memory cell 31 stores a "0" bit.

To set the semiconductor memory back into the pre-condition, a chip enable signal $\overline{CE}$ at the high level is supplied to the memory from the external device (not shown). At the same time, for the same purpose, the word-line driver 32, the dummy word-line driver 39, and the column-selection line driver 373 output drive signals, which set the word line WL31, the dummy word line DWL32, and the column-selecting line CSLa—all at the low level. As a result of this, the switching elements 311, 345, 371, and 372 are turned off.

Then, the pre-charge driver 35 outputs a drive signal, which sets the pre-charge line PC at the high level. Hence data can be written into the memory cell 31 of one column memory array.

To write data continuously into the memory cell 31 of any other column memory array, it suffices to repeat the sequence of the operations described in the preceding paragraph. In other words, it is unnecessary to set the semiconductor memory back into the pre-charge condition in preparation for writing data into another column memory array.

In the instance described above, data is written into a column memory array after the pair of bit lines, i.e., BLa and $\overline{BLa}$, have been set to specified potentials. Nevertheless, according to the invention, data can be written through the data input/output lines I/O and $\overline{I/O}$ before the bit lines BLa and $\overline{BLa}$ are not set at the specified potentials.

(b) Data-Reading Operation

The same sequence of operations is performed, as in the data-writing operation, up until the pair of bit lines BLa and $\overline{BLa}$ of any selected column memory array are set at specified potentials. Thereafter, the column-selecting line driver 373 outputs a high-level signal to the column-selecting line CSLa. The switching elements 371 and 372 are thereby turned on. Hence, the data detected by the sense amplifier 36 is output to the data input/output lines I/O and $\overline{I/O}$.

The semiconductor memory is set back into the pre-charge condition, exactly in the same way as in the data-writing operation.

It will now be explained how to switch the operation mode of the semiconductor memory illustrated in FIG. 3.

(3) Volatile Mode to Nonvolatile Mode

Assuming that the data is read from the memory while the memory is set in the volatile mode, the bit lines BLa and $\overline{BLa}$ of any selected column memory array are set at high and low potentials, respectively, if the memory cell 31 of this array stores a "1" bit, or are set at low and high potentials, respectively, if the memory cell 31 stores a "0" bit.

When the plate-line switching driver 333 generates a signal, which sets the switching signal lines DC31 and DC32 at the low level and the high level, the switching elements 331 and 332 are turned off and on, respectively, connecting the plate lines PL31 to the plate-line driving unit 334. As a result, the operation mode of the memory is switched from the volatile mode to the nonvolatile mode.

Once the memory is set in the nonvolatile mode, the memory cell 31 functions as a nonvolatile cell, storing a "1" bit or a "0" bit in accordance with the the potential of the bit line BLa. When the operation mode is changed to the nonvolatile mode, the plate line PL31 is set at the low level, and the bit line BLa is at the high level if the memory cell 31 stores a "1" bit. More specifically, the ferroelectric capacitor 312 remains polarized in such a direction that the cell 31 holds a "1" bit. The capacitor 312 is not reversely polarized even if the plate-line driving unit 334 supplies a Vcc-level voltage to the capacitor 312, since this voltage does nothing but equalizing the potentials at both ends of the capacitor 312.

On the other hand, when the memory cell 31 stores a "0" bit, the bit line BLa is set at the low level, and both ends of the capacitor 312 are set at the low level. In this case, too, the capacitor 312 is not polarized reversely. However, when the plate-line driving unit 334 applies a Vcc-level voltage to the ferroelectric capacitor 312, the capacitor 312 is polarized reversely since this voltage has the opposite polarity. The ferroelectric capacitor 312 is now polarized in such direction that the memory cell 31 stores a "0" bit.

(4) Nonvolatile Mode to Volatile Mode

Assuming that the data is read from the memory while the memory is set in the nonvolatile mode, the bit lines BLa and $\overline{BLa}$ of any selected column memory array are set at high and low potentials, respectively, if the memory cell 31 of this array stores a "1" bit, or are set at low and high potentials, respectively, if the memory cell 31 stores a "0" bit.

When the plate-line switching driver 333 generates a signal, which sets the switching signal lines DC31 and DC32 at the high level and the low level, the switching elements 331 and 332 are turned on and off, respectively. The plate lines PL31 is thereby set at the Vss level, and the the operation mode of the memory is switched from the nonvolatile mode to the volatile mode. Then, data can be written into the memory cell 31 in the volatile mode. Namely, the ferroelectric capacitor 312 accumulates an electric charge if the bit line BLa is held at the high level, and accumulates no charge if the bit line BLa is held at the low level. Therefore, the memory cell 31 functions as a volatile cell, storing the same data which it has stored while acting as a nonvolatile cell.

As has been explained, the operation mode of the semiconductor memory shown in FIG. 3 ca be switched from the volatile mode to the nonvolatile mode, or vice versa, without altering the data stored in each memory cell 31.

In the instance described above, the plate-line driving unit 334 applies the high voltage or the low voltage to the plate line PL31. Instead, the unit 334 can apply only the high voltage to the plate line PL31, and the plate-line switching driver 333 can controls the potentials of the plate-switching line DC31 and DC32 such that the switching element 332 is turned o to apply the high voltage to the plate line PL31, and the switching element 331 is turned o to apply the Vcc voltage to the plate line PL31.

The above explanation centers around only one of the memory cells 31 of each column memory cell array. In the actual operation of the memory shown in FIG. 3, the memory cells 31, provided in great numbers in each column memory array, are sequentially selected by the word line driver 32, and further the column memory arrays, provided in great numbers, too, are sequentially selected by the column-selecting section 37.

The semiconductor memory according to the second embodiment of the present invention will now be described in detail, with reference to FIG. 5.

Figure 5:
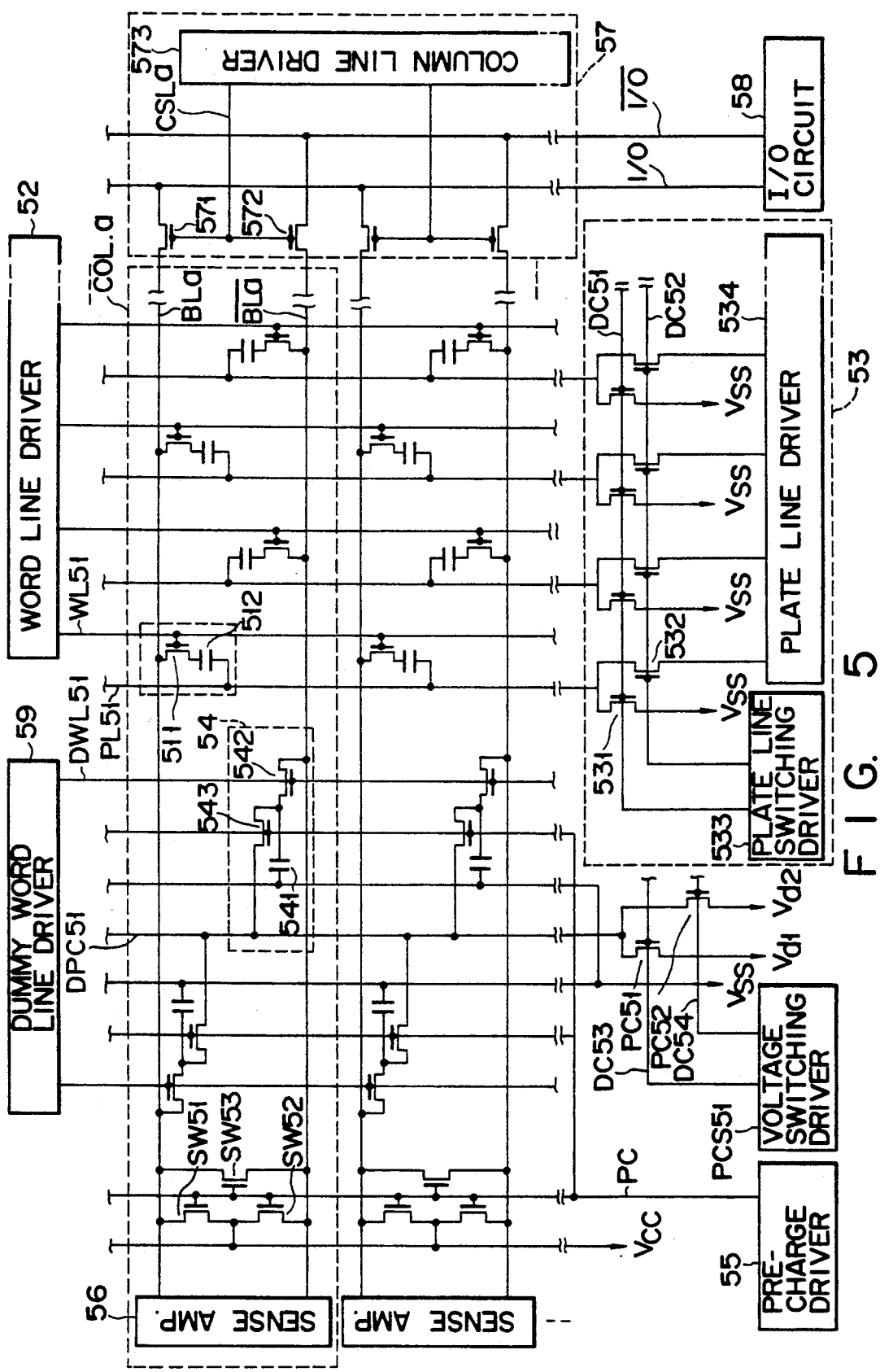
FIG. 5 is a circuit diagram showing a semiconductor device according to a second embodiment of the present invention, in which the charging voltage is changed.

As can be understood from FIGS. 3 and 5, the memory cells 51 of this semiconductor memory are identical in structure to the memory cells 31 of the semiconductor memory illustrated in FIG. 3. Each cell 51 has a switching element 511 and a ferroelectric capacitor 512. The switching element 511 is connected to a word line WL51 and driven by a word line driver 52. The ferroelectric capacitor 512 has on electrode connected to a bit line BLa by the switching element 511, and the other electrode connected to a plate line driver 53 by a plate line PL51. The plate line PL51 is connected to a Vss potential source by a switching element 531 which is driven by the signal on a plate-switching line DC51. It is also connected to a plate-line driving unit 534 by a switching element 532 which is driven by the signal on a plate-switching line DC52.

The second embodiment of the invention, i.e. the semiconductor memory shown in FIG. 5 is different from the first embodiment (FIG. 3) in that each dummy cell 54 has one reference capacitor 541 only.

A reference section 54 has a reference capacitor 541 and two switching elements 542 and 543. The reference capacitor 541 has one electrode connected to a bit line $\overline{BLa}$ which makes a pair, together with the bit line BLa. The dummy cell 54 is selectively driven by a signal on a dummy word line DWL51 which is coupled to the switching element 542 and also to a dummy word-line driver 59. The other electrode of the reference capacitor 541 is connected to a pre-charge potential line DPC51 by the switching element 543 which serve as a precharge element. The switching element 543 is driven by a signal supplied from a pre-charge driver 55 through a pre-charge line PC. Further, pre-charge voltage Vd1 and pre-charge voltage Vd2 can be applied the pre-charge line DPC51 through switching elements PC51 and PC52, respectively. The voltage Vd1 is applied to the line DPC51 when a voltage switching driver PCS51 supplies a signal to the switching element PC51, whereas the voltage Vd2 is applied to the line DPC51 when the driver PCS51 supplies a signal to the switching element PC52. Hence, the voltage switching driver PCS51 controls the electric charge in the reference capacitor 541.

Each pair of bit lines BLa and $\overline{BLa}$ are connected at one end to the corresponding sense amplifier 56, and at the other end to the switching elements 571 and 572 of a column-selecting section 57. These elements 571 and 572 are connected to a data input/output circuit 58 by means of two input/output lines I/O and $\overline{I/O}$, respectively. The column-selecting section 57 has a column-selecting line driver 573, besides the switching elements 571 and 572 The bit lines BLa and $\overline{BLa}$ are connected to switching elements SW51 and SW52, respectively, and are thus set at the Vcc potential. The switching elements SW51 and SW52 are selectively driven by the pre-charge driver 52. The bit lines BLa and $\overline{BLa}$ are connected to each other by a switching element SW53 which is driven by the pre-charge driver 35.

As can be understood from FIG. 5, one dummy cell and a number of memory cells are connected to each sense amplifier and constitute a column memory array.

In the second embodiment (FIG. 5), the electric charge initially accumulated in the reference capacitor 541 is changed by switching the pre-charge voltage, from Vd1 to Vd2 or vice versa. Further, the electric charge, which flows to the capacitor 541 when the capacitor 541 is coupled to the bit line $\overline{BLa}$, is controlled. Therefore, the dummy cell 54 operates in the same way as the reference section 34 (FIG. 3) which has two reference capacitors 341 and 342, though it has only one reference capacitor 541.

In the second embodiment (FIG. 5), the capacitance Cm which the ferroelectric capacitor 512 exhibits when polarized normally, the capacitance Cm' which the capacitor 512 exhibits when polarized reversely, and the capacitance Cf of the reference capacitor 541 are of specific values which satisfy the following equations:

$Cm' = 3 Cm$ $Cf = 2 Cm$

A Vcc-level voltage is applied to the ferroelectric capacitor 512. The pre-charge voltage Vd1 is ⅔ Vcc when the memory is set in the volatile mode. The pre-charge voltage Vd2 has reference value Vss (0 V) when the memory is set in the nonvolatile mode. Hence, an electric charge, which is equal to a middle valve between the charge flowed to the capacitor 512 when the memory cell 51 stores a "1" bit and the charge applied to the capacitor 512 when the cell 51 stores a "0" bit, is applied to the reference capacitor 541, no matter whether the semiconductor memory is operating in the volatile mode or the nonvolatile mode. As a result, the sense amplifier 56 can determine, with high reliability, whether the memory cell 51 stores a "1" bit or a "0" bit.

Figure 6A:
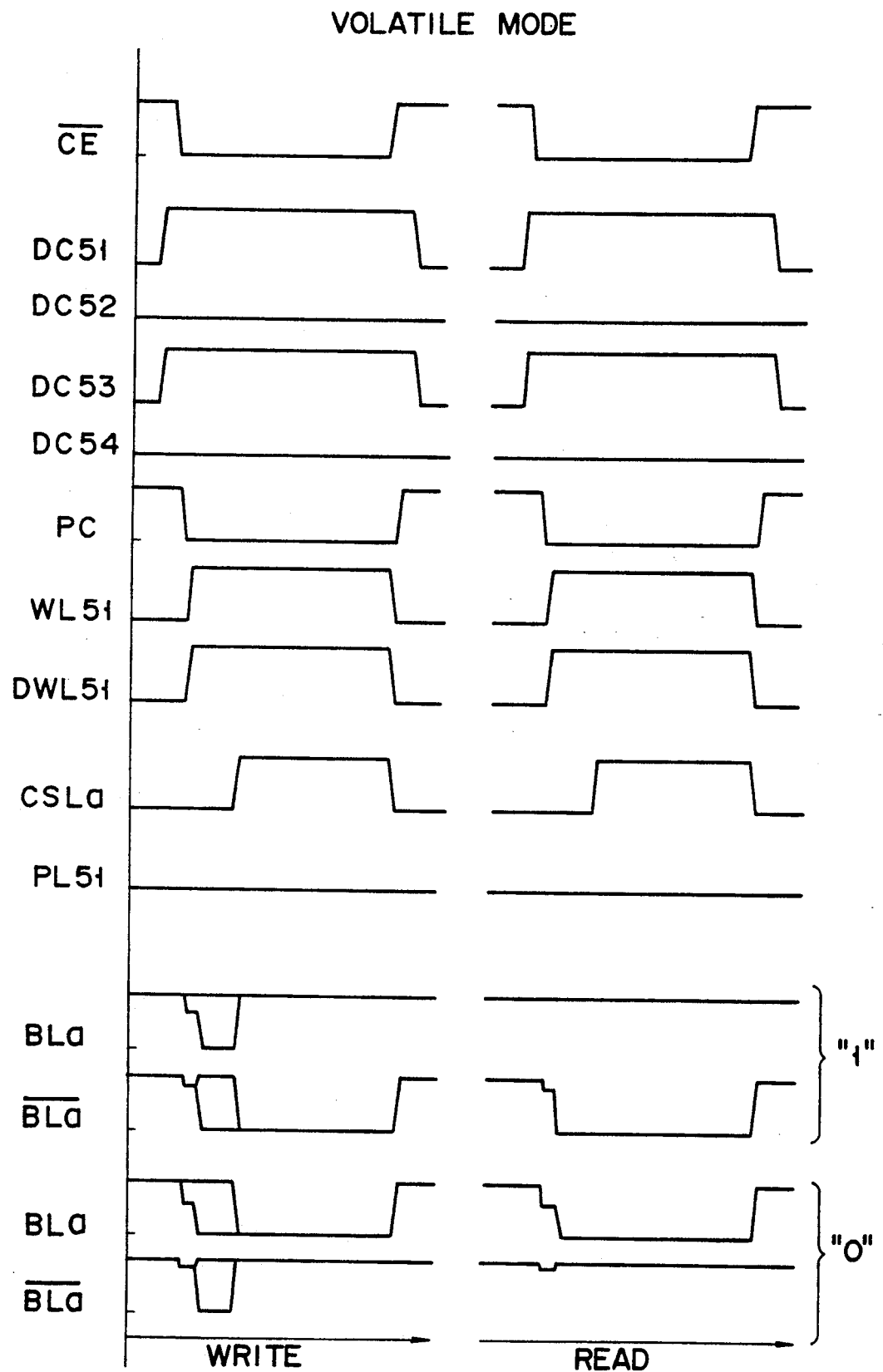
FIGS. 6A to 6C are timing charts explaining the operation of the semiconductor memory illustrated in FIG. 5.
Figure 6B:
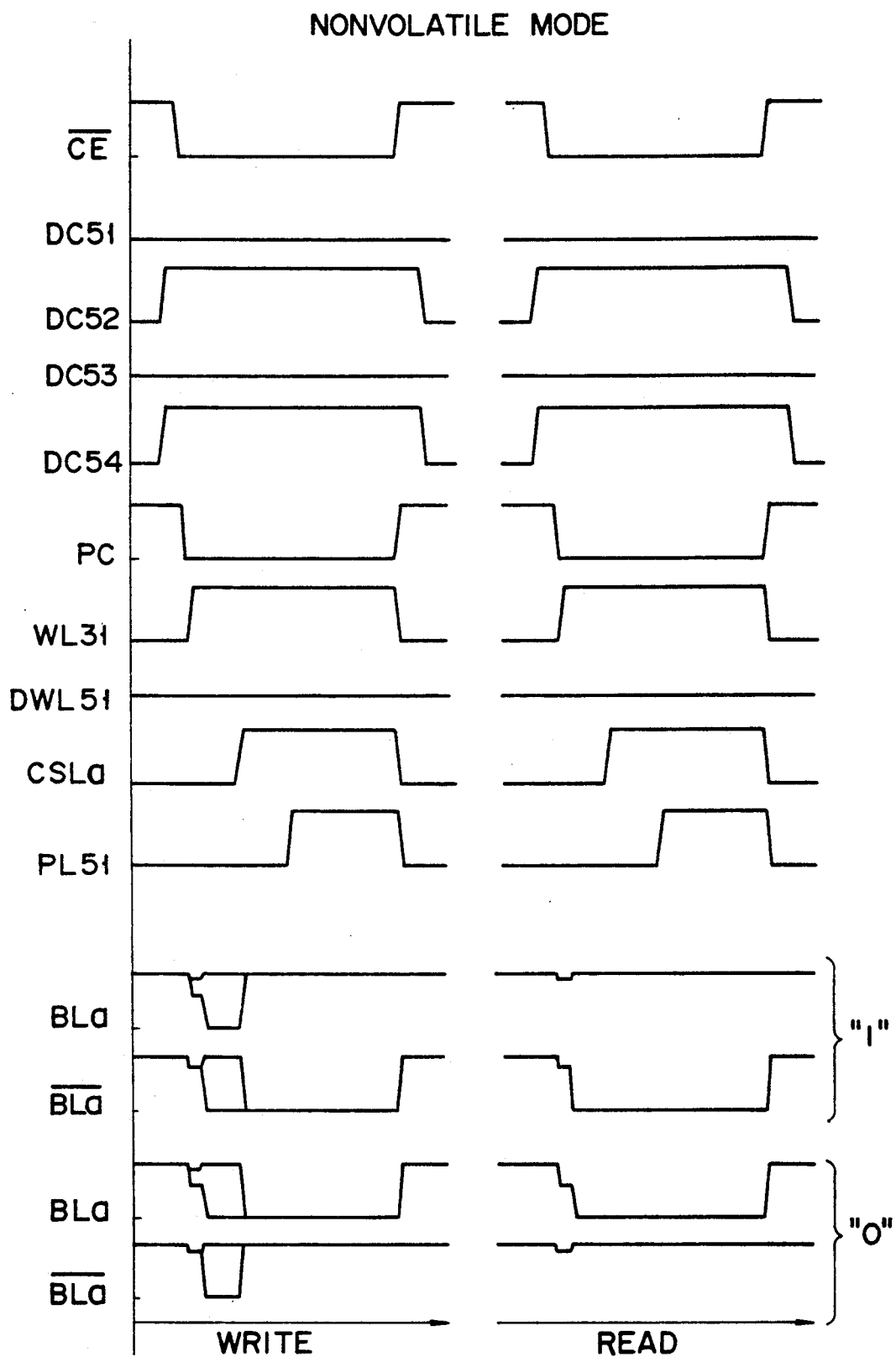
Figure 6C:
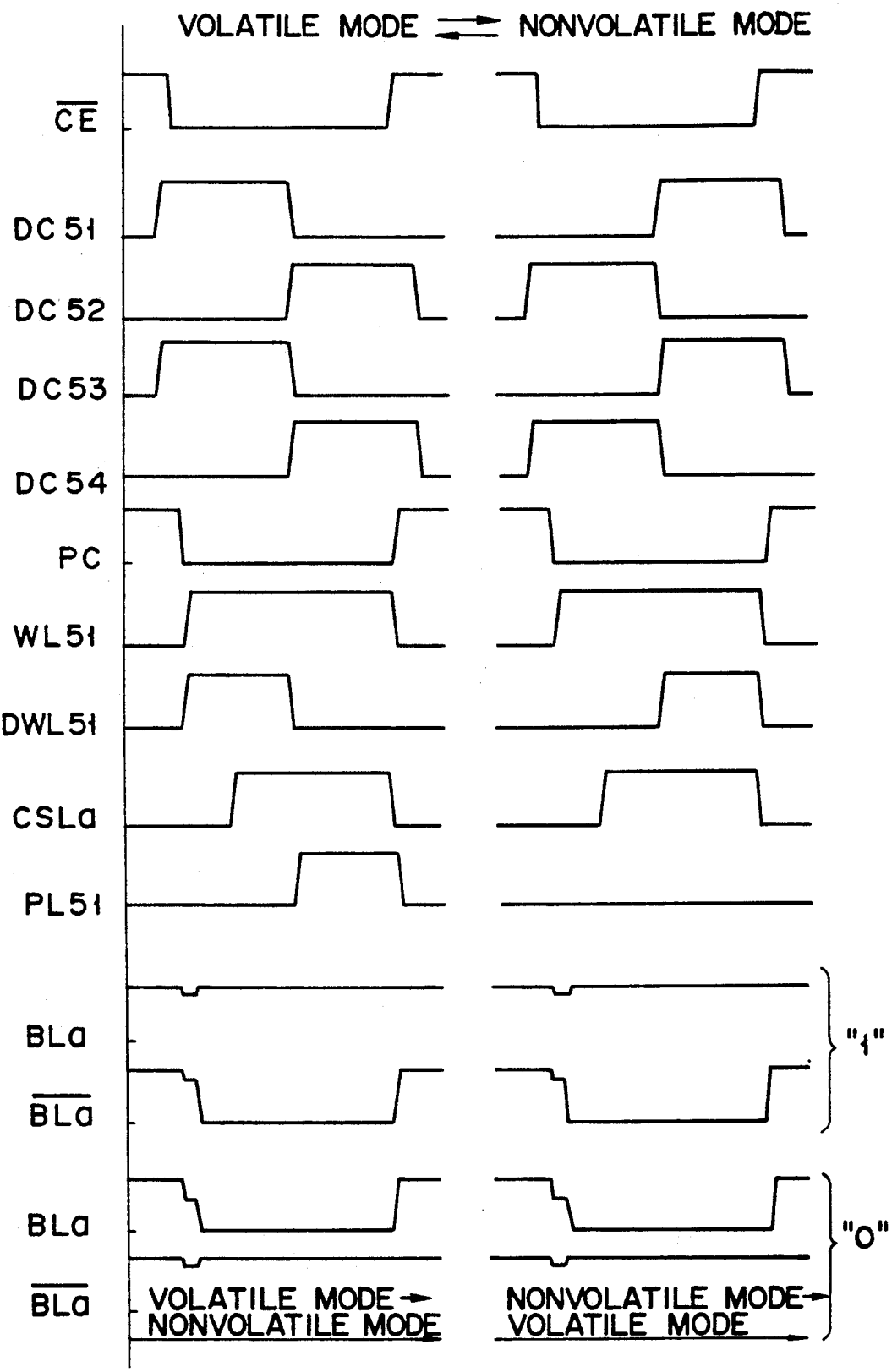

The operation of the semiconductor memory shown in FIG. 5 will be explained, with reference to the timing charts of FIGS. 6A to 6C.

(1) Volatile Mode

By definition, each memory cell 51 is assumed to store a "1" bit when the ferroelectric capacitor 512 accumulates an electric charge, and to store a "0" bit when the capacitor 512 accumulates no electric charge. The capacitor 512 accumulates a charge when a voltage is applied to the capacitor 512 in one direction, without polarizing the same in the reverse direction.

(a) Data-Writing Operation

When the memory remains in wait state, the pre-charge line PC is held at the high level, whereas the bit lines BLa and $\overline{BLa}$ of each column memory array are held at the Vcc level. The voltage Vd1 ($= ⅔$ Vcc) is applied at one end to the reference capacitor 541 in respect to a reference voltage Vss at other end. The plate-line switching driver 533 generates a signal, which sets the plate-line switching line DC51 at the high level. As a result, the switching elements 531 of the plate line driver 53 are turned on, setting the plate lines PL51 at the Vss level.

The semiconductor is activated by a chip enable signal $\overline{CE}$ supplied from an external device (not shown). Then, the pre-charge line PC is set at the low level, whereby the bit lines BLa and $\overline{BLa}$ of each column memory array are set at the Vcc level and brought into floating state. In accordance with the address signal for each memory cell 51 and the selected operation mode of the memory, the word line WL51 and the dummy word line DWL51, both corresponding to the memory cell 51, are set at the high level. The switching element 511 of the cell 51 and the switching element 542 connected to the dummy word line DWL51 are thereby turned on. Hence, the ferroelectric capacitor 512 and the reference capacitor 541 are electrically connected to the bit lines BLa and $\overline{BLa}$, respectively. The potentials of the bit lines decrease in accordance with the charges accumulated in the capacitors 512 and 541. When the sense amplifier 56 is activated, the bit lines BLa and $\overline{BLa}$ are set at complementary levels, i.e., the high level and the low level, respectively.

Let us assume that the memory cell stores a "1" bit. In this case, the potential of the bit line BLa falls but a little since the ferroelectric capacitor 512 accumulates an electric charge. The reference capacitor 541 accumulates a charge equivalent to ⅔ Vcc. When a Vcc-level potential is applied to the capacitor 541, an electric charge equivalent to ¼ Vcc is applied to the capacitor 541. Hence, a greater charge is applied to the reference capacitor 541 than to the ferroelectric capacitor 512. As a result of this, the bit line BLa connected to the ferroelectric capacitor 512 by the switching element 511 is set at a potential higher than that of the bit line $\overline{BLa}$ which is connected to the reference capacitor 541 by the switching element 542. Thus, the bit lines BLa and $\overline{BLa}$ are set at the high level and the low level, respectively, while the memory cell 51 is storing a "1" bit.

Let us now assume that the memory cell 51 stores a "0" bit. In this case, an electric charge equivalent to the Vcc-level voltage is applied to the ferroelectric capacitor 512 since the capacitor 512 has accumulated no charge at all. The potential of the bit line BLa therefore falls. An electric charge, which is equivalent to ¼ Vcc, is applied to the reference capacitor 541. Hence, the potential of the bit line $\overline{BLa}$ falls less than the potential of the bit line BLa. As a result, the bit line BLa is set at a potential lower than that of the bit line $\overline{BLa}$. In other words, the bit lines BLa and $\overline{BLa}$ are set at the low level and the high level, respectively, while the memory cell 51 is storing a "0" bit.

Thereafter, when the column-selection line driver 573 drives the column-selecting line CSLa, raising the potential of this line to the high level, the switching elements 571 and 572 are turned on. The bit lines BLa and $\overline{BLa}$ are thereby connected to the data input/output lines I/O and $\overline{I/O}$, respectively. As a result of this, the bit lines BLa and $\overline{BLa}$ are set at the potentials of the lines I/O and $\overline{I/O}$. A chip enable signal CE at the high level is supplied from the external device (not shown) to the semiconductor memory, whereby the data input/output line I/O set into pre-charged condition. Simultaneously, for the same purpose, the word-line driver 52, the dummy word-line driver 59, and the column-selection line driver 573 output drive signals, which set the word line WL51, the dummy word line DWL51, and the column-selecting line CSLa—all at the low level. As a result of this, the switching elements 511, 542, 571, and 572 are turned off. Then, the pre-charge driver 55 outputs a drive signal, which sets the pre-charge line PC at the high level. Hence, data can be written into the memory cell 51 of one column memory array.

To write data continuously into the memory cell 51 of any other column memory array, it suffices to repeat the sequence of the operations described in the preceding paragraph. In other words, it is unnecessary to set the semiconductor memory back into the pre-charge condition in preparation for writing data into another column memory array.

In the instance described above, data is written into a column memory array after the pair of bit lines, i.e., BLa and $\overline{BLa}$, have been set to specified potentials of the data input/output lines I/O and $\overline{I/O}$. Thus, the ferroelectric capacitor 512 accumulates a charged, storing a "1" bit, if the data input/output line I/O is set at the high level, and accumulates no charge, storing a "0" bit, if the data input/output line I/O is set at the low level.

In the instance described above, data is written into the memory cell 51 after the bit lines BLa and $\overline{BLa}$ have been set at the specific potentials.

(b) Data-Reading Operation

The same sequence of operations is performed, as in the data-writing operation, up until the bit lines BLa and $\overline{BLa}$ of any selected column memory array are set at specified potentials. Thereafter, the column-selecting line driver 573 outputs a high-level signal to the column-selecting line CSLa. The switching elements 571 and 572 are thereby turned on. Hence, the data detected by the sense amplifier 56 is output to the data input/output lines I/O and $\overline{I/O}$. Thus, the data is read from the selected column memory array.

(2) Nonvolatile Mode

While the semiconductor memory (FIG. 5) is set in the nonvolatile mode, which data bit each memory cell 51 stores is determined by the direction in which the ferroelectric capacitor 512 is polarized. More precisely, each memory cell 51 stores a "1" bit when the capacitor 512 is polarized toward the plate line PL51, and stores a "0" bit when the capacitor 512 is polarized toward the bit line $\overline{BLa}$.

(a) Data-Writing Operation

When the memory remains in wait state, the pre-charge line PC is held at the high level, whereas the bit lines BLa and $\overline{BLa}$ of each pair are held at the Vcc level, just as in the case where the memory is set in the volatile mode. The voltage Vd2 (=Vss) is applied at one end to the reference capacitor 541, in respect to the reference potential Vss at the other end. The reference capacitor 541 is therefore short-circuited. The plate-line switching driver 533 generates a signal, which sets the plate-switching line DC51 at the low level and sets the plate-switching line DC52 at the high level. When this signal turns the switching element 532 on, the plate line PL51 is connected to the plate-line driving unit 534.

The semiconductor is activated by a chip enable signal $\overline{CE}$ supplied from an external device (not shown). Then, the pre-charge line PC is set at the low level, whereby the bit lines BLa and $\overline{BLa}$ of the selected column memory array are set at the Vcc level and brought into floating state. In accordance with the address signal for one of the memory cell 51 and the word line WL51 and the dummy word line DWL51, both corresponding to the memory cell 51, are set at the high level. The switching element 511 of the cell 51 and the switching element 542 connected to the dummy word line DWL51 are thereby turned on. Hence, the ferroelectric capacitor 512 and the reference capacitor 541 are electrically connected to the bit lines BLa and $\overline{BLa}$, respectively. The potentials of the bit lines decrease in accordance with the charges flowed to the capacitors 512 and 541. When the sense amplifier 56 is activated, the bit lines BLa and $\overline{BLa}$ are set at complementary levels, i.e., the high level and the low level, respectively.

Let us assume that the memory cell 51 stores a "1" bit. In this case, the ferroelectric capacitor 512 is polarized toward the plate line PL51. That is, the capacitor 512 is polarized such that the bit line BLa is set at the high potential. Hence, an electric charge equivalent to the capacitance (Cm) of the capacitor 512 is applied to the ferroelectric capacitor 512. This is because the bit line BLa is polarized in the same direction as the capacitor 512 even if the ferroelectric capacitor 512 is connected to the bit line BLa held in the floating state. By contrast, the reference capacitor 541 accumulates an electric charge equivalent to its capacitance (2Cm).

Hence, the potential of the bit line $\overline{BLa}$ coupled to the reference capacitor 541 through the switching element 542 falls more than the potential of the bit line BLa. As a result, the bit lines BLa and $\overline{BLa}$ are set at the high level and the low level, respectively, while the memory cell 51 is storing a "1" bit.

Let us now assume that the memory cell 51 stores a "0" bit. In this case, the ferroelectric capacitor 512 is polarized toward the bit line BLa. Hence, when the capacitor 512 is connected to the bit line BLa which is set at the Vcc level and thus held in the floating state, an electric field having the polarity opposite to the polarity of the capacitor 512 is applied to the ferroelectric capacitor 512. The capacitor 512 is thereby polarized reversely. As a result of this, a great charge is applied to the ferroelectric capacitor 512. On the other hand, an electric charge equal to that charge applied to the capacitor 512 when the memory cell 51 stores a "1" bit is applied to the reference capacitor 541. Therefore, the potential of the bit line BLa falls more than that of the bit line $\overline{BLa}$. In other words, the bit lines BLa and BLa are set at the low level and the high level, respectively, while the memory cell 51 is storing a "0" bit.

Thereafter, when the column-selection line driver 573 drives the column-selecting line CSLa, raising the potential of this line to the high level the switching elements 371 and 372 are turned on. The bit lines BLa and $\overline{BLa}$ are thereby connected to the data input/output lines I/O and $\overline{I/O}$, respectively. As a result of this, the bit lines BLa and $\overline{BLa}$ are set at the potentials of the lines I/O and $\overline{I/O}$. As has been described, the plate line PL51 is initially set at the low level. Hence, the ferroelectric capacitor 512 is polarized in such a direction that the memory cell 51 stores a "1" bit when the data input/output line I/O is set at the high potential.

The ferroelectric capacitor 512 is not polarized reversely when the data input/output line I/O is held at the low potential. This is because both ends of the capacitor 512 are at the low level as long as the line I/O remains at the low potential. In this condition, the capacitor 512 is polarized such that the memory cell 51 stores a "1" bit. When the plate-line driving unit 534 applies a Vcc-level voltage to the capacitor 512, this voltage has the polarity opposite to the polarity of the capacitor 512. As a result, the ferroelectric capacitor 512 is polarized reversely, so that memory cell 51 stores a "0" bit.

To set the semiconductor memory back into the pre-condition, a chip enable signal $\overline{CE}$ at the high level is supplied to the memory from the external device (not shown). At the same time, for the same purpose, the word-line driver 51, the dummy word-line driver 59, and the column-selection line driver 573 output drive signals, which set the word line WL51, the dummy word line DWL51, and the column-selecting line CSLa—all at the low level. As a result of this, the switching elements 511, 542, 571, and 572 are turned off. Then, the pre-charge driver 55 outputs a drive signal, which sets the pre-charge line PC at the high level. Hence, data can be written into the memory cell 51 of one column memory array.

To write data continuously into the memory cell 51 of any other column memory array, it suffices to repeat the sequence of the operations described in the preceding paragraph. In other words, it is unnecessary to set the semiconductor memory back into the pre-charge condition in preparation for writing data into another column memory array.

In the instance described above, data is written into a column memory array after the pair of bit lines, i.e., BLa and $\overline{BLa}$, have been set to specified potentials. Nevertheless, according to the invention, data can be written through the data input/output lines I/O and $\overline{I/O}$ before the bit lines BLa and BLa are not set at the specified potentials.

(b) Data-Reading Operation

The same sequence of operations is performed, as in the data-writing operation, up until the bit lines BLa and $\overline{BLa}$ of any selected column memory array are set at specified potentials. Thereafter, the column-selecting line driver 573 outputs a high-level signal to the column-selecting line CSLa. The switching elements 571 and 572 are thereby turned on. Hence, the data detected by the sense amplifier 56 is output to the data input/output lines I/O and $\overline{I/O}$.

The semiconductor memory is set back into the pre-charge condition, exactly in the same way as in the data-writing operation.

It will now be explained how to switch the operation mode of the semiconductor memory illustrated in FIG. 5.

(3) Volatile Mode to Nonvolatile Mode

Assuming that the data is read from the memory while the memory is set in the volatile mode, the bit lines BLa and $\overline{BLa}$ of any selected column memory array are set at high and low potentials, respectively, if the memory cell 51 of this array stores a "1" bit, or are set at low and high potentials, respectively, if the memory cell 51 stores a "0" bit.

When the plate-line switching driver 533 generates a signal, which sets the plate-switching lines DC51 and DC52 at the low level and the high level, the switching elements 531 and 532 are turned off and on, respectively, connecting the plate lines PL51 to the plate-line driving unit 534. As a result, the operation mode of the memory is switched from the volatile mode to the nonvolatile mode.

(4) Nonvolatile Mode to Volatile Mode

Assuming that the memory is set in the nonvolatile mode, data can be read from each memory cell 51, and can be written into the memory cell 51. The data is either a "1" bit or a "0" bit in accordance with the potentials of the bit lines BLa and $\overline{BLa}$. In the nonvolatile mode, the plate line PL51 is initially set at the low level. Hence, the ferroelectric capacitor 512 is polarized so that the memory cell 51 stores a "1" bit. Even if the plate-line driving unit 534 applies the Vcc-level voltage to the capacitor 512, the capacitor 512 remains polarized in the same direction, thus storing the "1" bit. This is because the Vcc-level voltage does nothing but equalize the potentials at both ends of the ferroelectric capacitor 512. When the memory cell 51 stores a "0" bit, the bit line BLa is at the low level, whereby both ends of the ferroelectric capacitor 512 are set at the low level. Hence, the capacitor 512 is not polarized reversely. If the plate-line driver unit 534 applies the Vcc-level voltage to the capacitor 512 at this time, an electric field having the polarity opposite to the polarity of the capacitor 512 is applied to the ferroelectric capacitor 512. The capacitor 512 is thereby polarized reversely, whereby the memory cell 51 stores a "0" bit.

When the plate-line switching driver 533 generates a signal, which sets the plate-switching line DC51 at the high level, the switching elements 531 and 532 are turned on and off, respectively. The plate lines PL51 is thereby set at the Vss level, and the operation mode of the memory is switched from the nonvolatile mode to the volatile mode. Then, data can be written into the memory cell 51 in the volatile mode. Namely, the ferroelectric capacitor 512 accumulates an electric charge if the bit line BLa is held at the high level, and accumulates no charge if the bit line BLa is held at the low level. Therefore, the memory cell 51 functions as a volatile cell, storing the same data which it has stored while acting as a nonvolatile cell.

As has been explained, when operation mode of the semiconductor memory shown in FIG. 5 can be switched from the volatile mode to the nonvolatile mode or vice versa, the data stored in each memory cell 51 is automatically refreshed, but not altered at all.

In the instance described above, the plate-line driver unit 534 outputs either a low-level voltage or a high-level voltage. Instead, the unit 534 can apply only the high voltage to the plate line PL531, and the plate-switching driver 533 ca outputs a high-level voltage and a low-level voltage. In this case, the potentials of the plate-switching lines DC51 and DC52 are controlled such that the switching element 532 is turned on when the driver 533 outputs the high-level voltage, and the switching element 531 is turned on when the driver 533 outputs no voltage or the low-level voltage.

The above explanation is concerned with only one of the memory cells 51 of each column memory cell array. In the actual operation of the memory shown in FIG. 5, the memory cells 51, provided in great numbers in each column memory array, are sequentially selected by the word line driver 52, and the column memory arrays, provided in great. numbers, too, are sequentially selected by the column-selecting section 57.

The semiconductor memory according to the third embodiment of the present invention will now be described in detail, with reference to FIG. 7.

As FIG. 7 shows, if viewed in comparison with FIGS. 3 and 5, the memory according to the third embodiment differs from the first and second embodiments in three respects. First, it has no dummy cells. Second, each memory cell 71 has two ferroelectric capacitors having the same characteristic. Third, the data stored in the cell 71 is determined in accordance with presence or absence of an electric charge in the first ferro-electric capacitor, when the memory is set in the non-volatile mode, and in accordance with the direction in which the first ferroelectric capacitor is polarized.

Each memory cell 71 comprises two switching elements 711 and 713 and two ferroelectric capacitors 712 and 714. The capacitor 712 has an electrode connected to a bit line BLa by the switching element 711. The capacitor 714 has an electrode connected to a bit line $\overline{BLa}$ by the switching element 713. Both switching elements 711 and 713 are coupled to a word line WL71 and can be driven by a word line driver 72. The capacitors 712 and 714 are connected, at the other electrode, to a plate line driver 73 by a plate line PL71. The plate line PL71 is connected to a Vss potential source by a switching element 731 which is driven by the signal supplied from a plate-switching driver 733 to a plate-switching line DC71. It is also connected to a plate-line driving unit 734 by a switching element 732 which is driven by the signal on a plate-switching line DC72.

Each pair of bit lines BLa and $\overline{BLa}$ are connected at one end to the corresponding sense amplifier 76, and at the other end to the switching elements 771 and 772 of a column-selecting section 77. These elements 771 and 772 are connected to a data input/output circuit 78 by means of two input/output lines I/O and $\overline{I/O}$, respectively. The column-selecting section 77 has a column-selecting line driver 773, besides the switching elements 771 and 772. The bit lines BLa and $\overline{BLa}$ are coupled to a Vcc potential source by switching elements SW71 and SW72, respectively. The bit lines BLa and $\overline{BLa}$ are connected to each other by a switching element SW73 which is driven by a signal on a pre-charge line PC.

As is evident from FIG. 7, a number of memory cells 7 are connected to each sense amplifier 7 and constitute a column memory array.

Figure 8A:
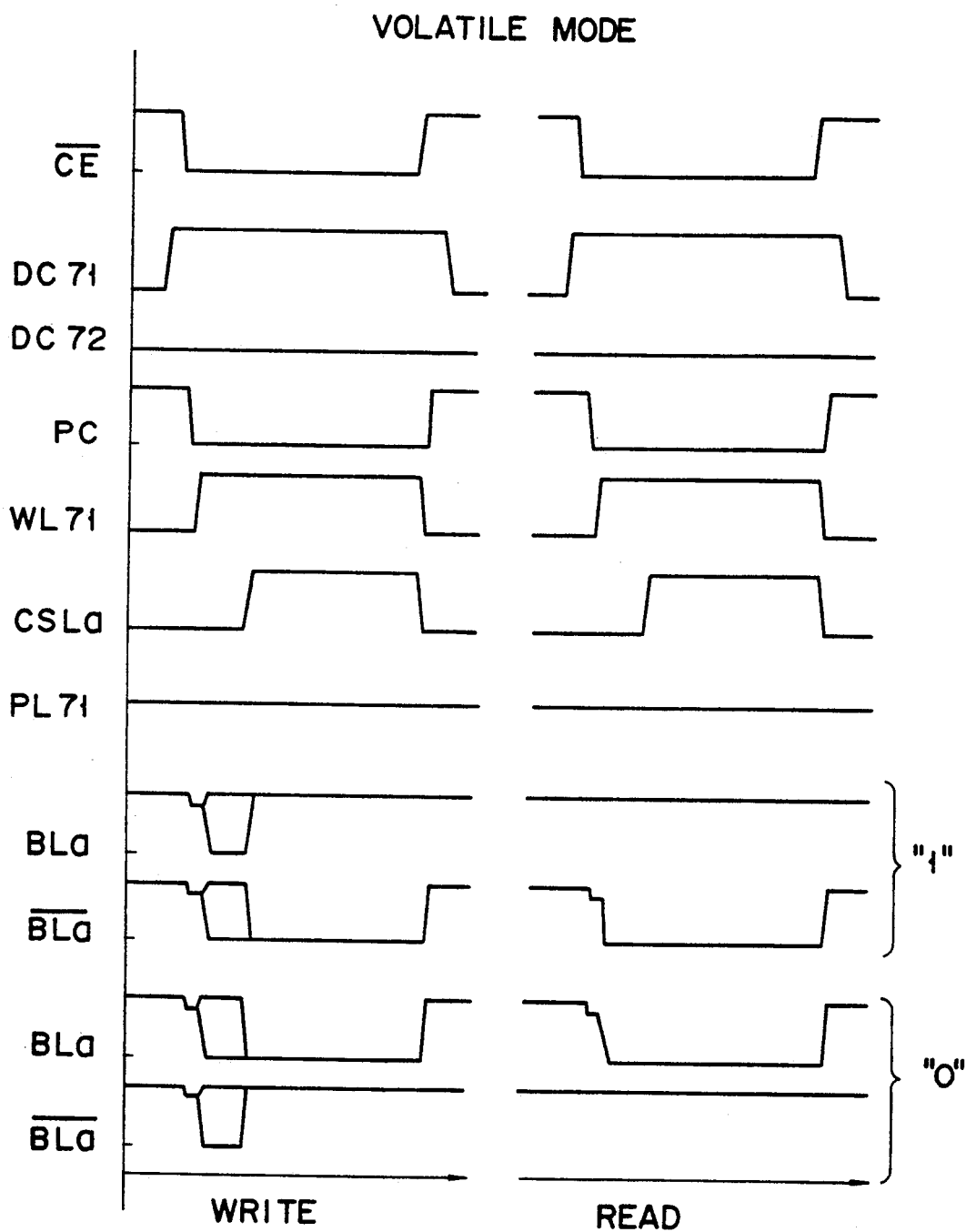
Figure 8B:
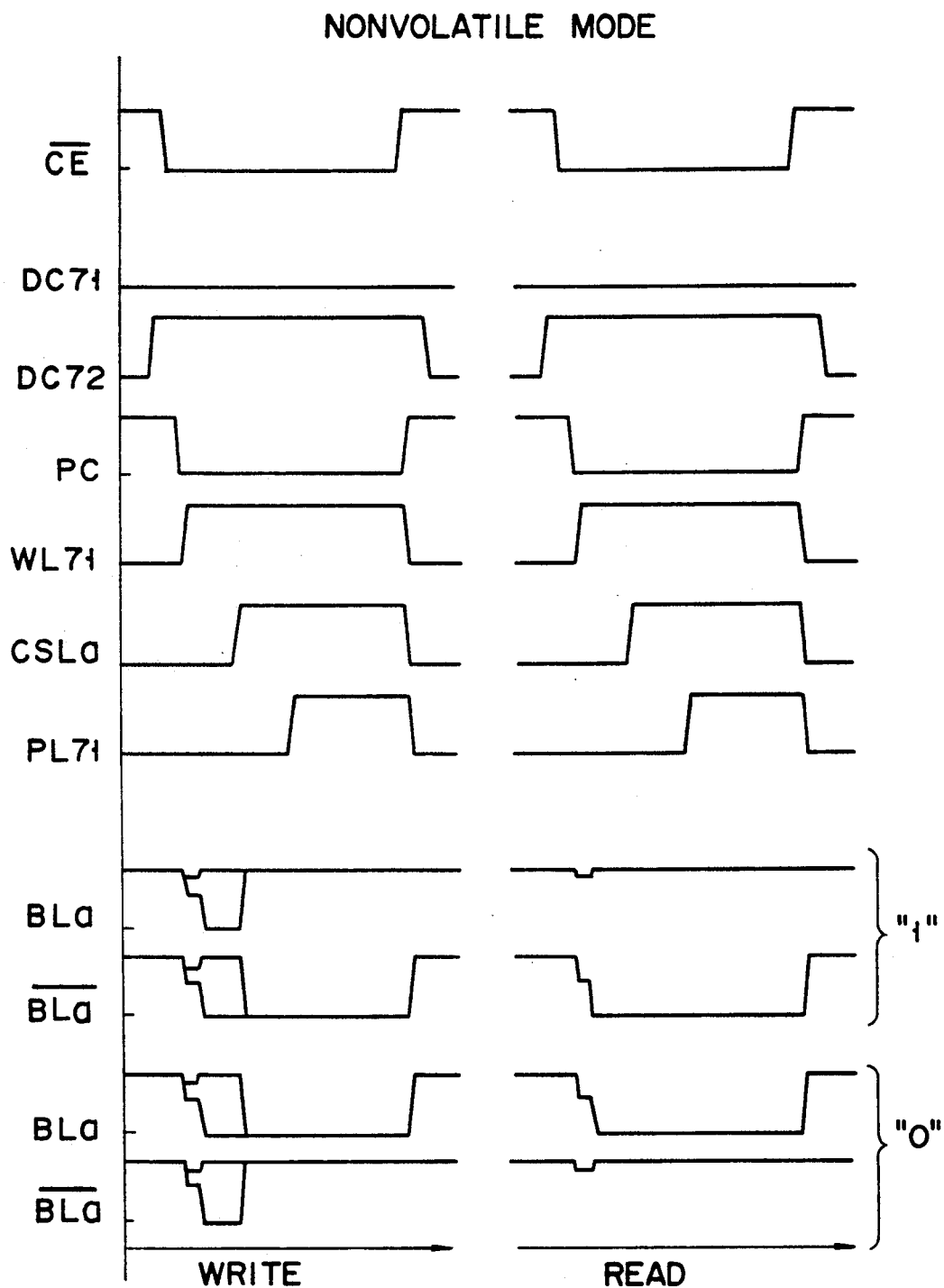

The operation of the semiconductor memory shown in FIG. 7 will be explained, with reference to the timing charts of FIGS. 8A to 8C.

(1) Volatile Mode

By definition, each memory cell 71 is assumed to store a "1" bit when the ferroelectric capacitor 712 accumulates an electric charge, and to store a "0" bit when the capacitor 712 accumulates no electric charge. The capacitor 712 accumulates a charge when a voltage is applied to the capacitor 712 in one direction, without polarizing the same in the reverse direction. The ferroelectric capacitors 712 and 714, which make a pair, accumulate charges complementarily.

(a) Data-Writing Operation

When the memory remains in wait state, the pre-charge line PC is held at the high level, whereas the bit lines BLa and $\overline{BLa}$ of each column memory array are held at the Vcc level. The plate-line switching driver 733 generates a signal, which sets the plate-line switching line DC71 at the high level. As a result, the switching elements 731 of the plate line driver 73 are turned on, setting the plate lines PL71 at the Vss level.

The semiconductor is activated by a chip enable signal $\overline{CE}$ supplied from an external device (not shown). Then, the pre-charge line PC is set at the low level, whereby the bit lines BLa and $\overline{BLa}$ of each column memory array are set at the Vcc level and brought into floating state. In accordance with the address signal for each memory cell 71 and the selected operation mode of the memory, the word line WL71 corresponding to the memory cell 71 is set at the high level. The switching elements 711 and 713 of the cell 71 are thereby turned on. Hence, the ferroelectric capacitors 712 and 714 are electrically connected to the bit lines BLa and $\overline{BLa}$, respectively. The potentials of the bit lines decrease in accordance with the charges accumulated in the capacitors 712 and 714. When the sense amplifier 76 is activated, the bit lines BLa and $\overline{BLa}$ are set at complementary levels, i.e., the high level and the low level, respectively.

Let us assume that the memory cell 71 stores a "1" bit. In this case, the potential of the bit line BLa falls but a little since the ferroelectric capacitor 712 accumulates an electric charge. The ferroelectric capacitor 714 accumulates no electric charge since the capacitors 712 and 714 are accumulate charges complementarily as has been described above. As a result, the potential of the bit line BLa is greater than that of the bit line $\overline{BLa}$. Hence, the bit lines BLa and BLa are set at the high level and the low level, respectively, while the memory cell 71 is storing a "1" bit.

Let us now assume that the memory cell 71 stores a "0" bit. In this case, the capacitor 712 accumulates no electric charge, whereas the capacitor 714 accumulates an electric charge. Hence, the potential of the bit line BLa falls more than that of the bit line $\overline{BLa}$. The bit lines BLa and $\overline{BLa}$ are, therefore, set at the low level and the high level, respectively, while the memory cell 71 is storing a "0" bit.

Thereafter, when the column-selection line driver 773 drives the column-selecting line CSLa, raising the potential of this line to the high level, the switching elements 771 and 772 are turned on. The bit lines BLa and $\overline{BLa}$ are thereby connected to the data input/output lines I/O and $\overline{I/O}$, respectively. As a result of this, the bit lines BLa and $\overline{BLa}$ are set at the potentials of the lines I/O and $\overline{I/O}$. Hence, the ferroelectric capacitor 712 accumulates an electric charge, thus storing a "1" bit, if the data input/output line I/O is at the high potential, and accumulates no charge, storing a "0" bit, if the line I/O is at the low potential.

To set the semiconductor memory back into the pre-condition, a chip enable signal $\overline{CE}$ at the high level is supplied to the memory from the external device (not shown). At the same time, for the same purpose, the word-line driver 72 and the column-selection line driver 773 output drive signals, which set the word line WL71 and the column-selecting line CSLa, both at the low level. As a result of this, the switching elements 711, 713, and 772 are turned off. Then, the pre-charge driver 75 outputs a drive signal, which sets the precharge line PC at the high level. Hence, data can be written into the memory cell 71 of one column memory array.

To write data continuously into the memory cell 71 of any other column memory array, it suffices to repeat the sequence of the operations described in the preceding paragraph. In other words, it is unnecessary to set the semiconductor memory back into the pre-charge condition in preparation for writing data into another column memory array.

In the instance described above, data is written into a column memory array after the pair of bit lines, i.e., BLa and $\overline{BLa}$, have been set to specified potentials. Nevertheless, according to the invention, data can be written through the data input/output lines I/O and $\overline{I/O}$ before the bit lines BLa and $\overline{BLa}$ are not set at the specified potentials.

(b) Data-Reading Operation

The same sequence of operations is performed, as in the data-writing operation, up until the bit lines BLa and $\overline{BLa}$ of any selected column memory array are set at specified potentials. Thereafter, the column-selecting line driver 773 outputs a high-level signal to the column-selecting line CSLa. The switching elements 771 and 772 are thereby turned on. Hence, the data detected by the sense amplifier 76 is output to the data input/output lines I/O and $\overline{I/O}$. Thus, the data is read from the selected column memory array.

(2) Nonvolatile Mode

While the semiconductor memory (FIG. 7) is set in the nonvolatile mode, which data bit each memory cell 71 stores is determined by the direction in which the ferroelectric capacitor 712 is polarized. To be more precise, the memory cell 71 stores a "1" bit when the capacitor 712 is polarized toward the plate line PL71, and stores a "0" bit when the capacitor 712 is polarized toward the bit line BLa.

(a) Data-Writing Operation

When the memory remains in wait state, the bit lines BLa and $\overline{BLa}$ of each pair are held at the Vcc level, just as in the case where the memory is set in the volatile mode. The plate-line switching driver 733 generates a signal, which sets the plate-switching line DC72 at the high level. When this signal turns the switching element 732 on, the plate line PL71 is connected to the plate-line driving unit 734. The plate line PL71 is initially set to the low potential, i.e., Vss.

The semiconductor is activated by a chip enable signal $\overline{CE}$ supplied from an external device (not shown). Then, the pre-charge line PC is set at the low level, whereby the bit lines BLa and $\overline{BLa}$ of the selected column memory array are set at the Vcc level and brought into floating state. In accordance with the address signal for one of the memory cell 71 and the word line WL71 corresponding to the memory cell 71 is set at the high level. Both switching element 711 and 713 are therefore turned on. As a result of this, the ferroelectric capacitors 712 and 714 are electrically connected to the bit lines BLa and $\overline{BLa}$, respectively. The potentials of the bit lines decrease. When the sense amplifier 76 is activated, the bit lines BLa and $\overline{BLa}$ are set at complementary levels, i.e., the high level and the low level, respectively.

Let us assume that the memory cell 71 stores a "1" bit. In this case, the ferroelectric capacitor 712 is polarized toward the plate line PL71. That is, the capacitor 712 is polarized such that the bit line BLa is set at the high potential. Hence, an electric charge which is equivalent to the capacitance (Cm) of the capacitor 71 flows to the ferroelectric capacitor 712. This is because the bit line BLa is polarized in the same direction as the capacitor 712 even if the ferroelectric capacitor 71 is connected to the bit line BLa held in the floating state. By contrast, the ferroelectric capacitor 714 is polarized reversely when connected to the bit line $\overline{BLa}$ set at the Vcc level, since it is polarized in the opposite direction. As a result, a great electric charge flows to the capacitor 714. Hence, the potential of the bit line $\overline{BLa}$ coupled to the reference capacitor 714 by the switching element 713 falls more than the potential of the bit line BLa. As a result, the bit lines BLa and BLa are set at the high level and the low level, respectively, while the memory cell 71 is storing a "1" bit.

Let us now assume that the memory cell 71 stores a "0" bit. In this case, the ferroelectric capacitor 712 is polarized toward the bit line BLa. Hence, when the bit line BLa, which is set at the Vcc level and thus held in the floating state, is connected to the ferroelectric capacitor 712, an electric field having the polarity opposite to the polarity of the capacitor 712 is applied to the ferroelectric capacitor 712. The capacitor 712 is thereby polarized reversely. As a result of this, a great charge flows to the ferroelectric capacitor 712. Therefore, the potential of the bit line BLa falls more than that of the bit line $\overline{BLa}$. In other words, the bit lines BLa and $\overline{BLa}$ are set at the low level and the high level, respectively, while the memory cell 71 is storing a "0" bit.

Thereafter, when the column-selection line driver 773 drives the column-selecting line CSLa, raising the potential of this line to the high level, the switching elements 771 and 772 are turned on. The bit lines BLa and $\overline{BLa}$ are thereby connected to the data input/output lines I/O and $\overline{I/O}$, respectively. As a result of this, the bit lines BLa and $\overline{BLa}$ are set at the potentials of the lines I/O and Ī/Ō. As has been described, the plate line PL71 is initially set at the low level. Hence, the ferroelectric capacitor 712 is polarized in such a direction that the memory cell 71 stores a "1" bit when the data input/output line I/O is set at the high potential.

The ferroelectric capacitor 712 is not polarized reversely when the data input/output line I/O is held at the low potential. This is because both ends of the capacitor 712 are at the low level as long as the line I/O remains at the low potential. In this condition, the capacitor 712 is polarized such that the memory cell 71 stores a "1" bit, when the plate-line driving unit 734 applies a Vcc-level voltage to the capacitor 712. This voltage has the polarity opposite to the polarity of the capacitor 712. As a result, the ferroelectric capacitor 712 is polarized reversely, so that memory cell 71 stores a "0" bit.

To set the semiconductor memory back into the pre-condition, a chip enable signal $\overline{CE}$ at the high level is supplied to the memory from the external device (not shown). At the same time, for the same purpose, the word-line driver 72 and the column-selection line driver 773 output drive signals, which set the word line WL71 and the column-selecting line CSLa, both at the low level. As a result of this, the switching elements 711, 713, and 772 are turned off. Then, the pre-charge driver 75 outputs a drive signal, which sets the precharge line PC at the high level. Hence, data can be written into the memory cell 71 of one column memory array.

To write data continuously into the memory cell 71 of any other column memory array, it suffices to repeat the sequence of the operations described in the preceding paragraph. In other words, it is unnecessary to set the semiconductor memory back into the pre-charge condition in preparation for writing data into another column memory array.

In the instance described above, data is written into a column memory array after the pair of bit lines, i.e., BLa and $\overline{BLa}$, have been set to specified potentials. Nevertheless, according to the invention, data can be written through the data input/output lines I/O and Ī/Ō before the bit lines BLa and BLa are not set at the specified potentials.

(b) Data-Reading Operation

The same sequence of operations is performed, as in the data-writing operation, up until the bit lines BLa and $\overline{BLa}$ of any selected column memory array are set at specified potentials. Thereafter, the column-selecting line driver 773 outputs a high-level signal to the column-selecting line CSLa. The switching elements 771 and 772 are thereby turned on. Hence, the data detected by the sense amplifier 76 is output to the data input/output lines I/O and Ī/Ō. Thus, the data is read from the selected column memory array.

The semiconductor memory is set back into the pre-charge condition, exactly in the same way as in the data-writing operation.

It will now be explained how to switch the operation mode of the semiconductor memory shown in FIG. 7.

(3) Volatile Mode to Nonvolatile Mode

Assuming that the data is read from the memory while the memory is set in the volatile mode, the bit lines BLa and $\overline{BLa}$ of any selected column memory array are set at high and low potentials, respectively, if the memory cell 71 of this array stores a "1" bit, or are set at low and high potentials, respectively, if the memory cell 71 stores a "0" bit.

When the plate-line switching driver 733 generates a signal, which sets the plate-switching lines DC71 and DC72 at the low level and the high level, the switching elements 731 and 732 are turned off and on, respectively, thus connecting the plate lines PL71 to the plate-line driving unit 734. As a result, the operation mode of the memory is switched from the volatile mode to the nonvolatile mode.

In the nonvolatile mode, the pate line PL71 is initially set at the low level. Hence, the ferroelectric capacitor 712 is polarized so that the memory cell 71 stores a "1" bit. Even if the plate-line driving unit 734 applies the Vcc-level voltage to the capacitor 712, the capacitor 712 remains polarized in the same direction, thus storing the "1" bit. This is because the Vcc-level voltage does nothing but equalize the potentials at both ends of the ferroelectric capacitor 712. When the memory cell 71 stores a "0" bit, the bit line BLa is at the low level, whereby both ends of the ferroelectric capacitor 712 are set at the low level. Hence, the capacitor 712 is not polarized reversely. If the plate-line driver unit 734 applies the Vcc-level voltage to the capacitor 712 at this time, an electric field having the polarity opposite to the polarity of the capacitor 712 is applied to the ferroelectric capacitor 712. The capacitor 712 is thereby polarized reversely, whereby the memory cell 71 stores a "0" bit.

(4) Nonvolatile Mode to Volatile Mode

Assuming that the data is read from the memory while the memory is set in the nonvolatile mode, the bit lines BLa and $\overline{BLa}$ of any selected column memory array are set at high and low potentials, respectively, if the memory cell 71 of this array stores a "1" bit, or are set at low and high potentials, respectively, if the memory cell 71 stores a "0" bit.

When the plate-line switching driver 733 generates a signal, which sets the plate-switching lines DC71 at the high level, and the plate-switching lines DC72 at the low level, the switching elements 731 and 732 are turned on and off, respectively, thus setting the plate lines PL71 at the Vss level. As a result, the operation mode of the memory is switched from the volatile mode to the nonvolatile mode. Hence, data ca be written into the memory cell 71 in the same way as in the volatile mode, as described above. That is, the ferroelectric capacitor 712 accumulates a charge, thus storing a "1" bit, when the bit line BLa is at the high level, and accumulates no charge, thus storing a "0" bit, when the bit line BLa is at the low level.

As has been explained, when operation mode of the semiconductor memory shown in FIG. 7 can be switched from the volatile mode to the nonvolatile mode, or vice versa, the data stored in each memory cell 71 is automatically refreshed, but not altered at all.

In the instance described above, the plate-line driver unit 734 outputs either a low-level voltage or a high-level voltage. Instead, the unit 734 can apply only the high voltage, and the plate-switching driver 733 can outputs a high-level voltage and a low-level voltage. In this case, the potentials of the plate-switching lines DC71 and DC72 are controlled such that the switching element 732 is turned on when the driver 733 outputs the high-level voltage, and the switching element 731 is turned on when the driver 733 outputs no voltage or the low-level voltage.

The above explanation is concerned with only one of the memory cells 71 of each column memory cell array. In the actual operation of the memory shown in FIG. 7, the memory cells 71, provided in great numbers in each column memory array CSLa, are sequentially selected by the word line driver 72, and the column memory arrays, provided in great numbers, too, are sequentially selected by the column-selecting section 77.

In the first, second, and third embodiments, all described above, the operation mode can be switched by a signal supplied from an external device. Alternatively, the mode can be switched under the control of a CPU incorporated in the memory. In this case, the CPU is so programmed as to set the memory in the nonvolatile mode when the power switch of the memory is turned on, to switch the mode to the volatile mode automatically thereafter, and to switch the mode back to the nonvolatile mode when the power switch is turned off or when the power supply fails by accident.

Figure 9:
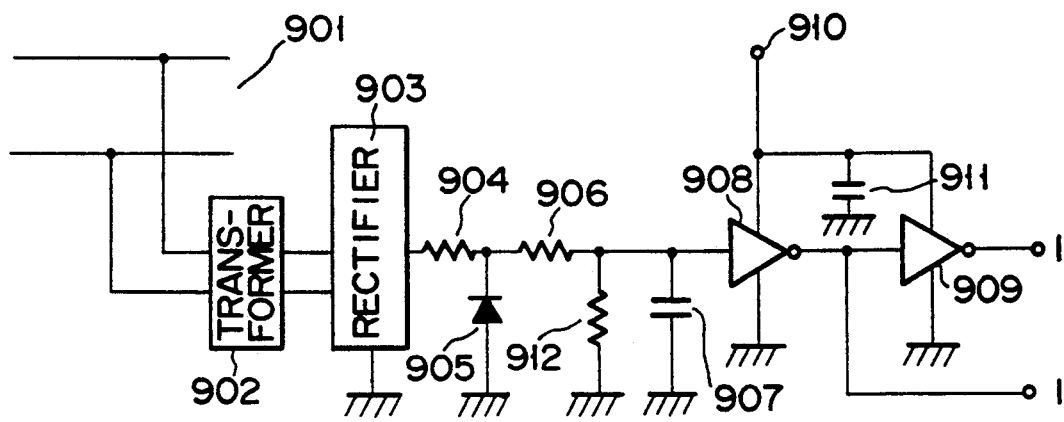
FIG. 9 is a diagram illustrating a power-supply detecting circuit designed to generate a switching signal for automatically change the operating mode of any memory of this invention to a nonvolatile mode.

FIG. 9 illustrates a power-supply detecting circuit designed to generate a switching signal for automatically change the operating mode of any memory described above. In this circuit, a transformer 902 reduces the voltage applied through a power-supply line 901. A rectifier 903 performs full-wave rectification on the output voltage of the transformer 902. The rectified voltage is applied via a resistor 904 to a diode 905. The diode 905 adjusts the peak value of the voltage, thereby changing it to a constant voltage. The constant voltage thus provided is applied through a resistor 906 to a capacitor 907. The capacitor 907 is coupled to an inverter 908, which outputs a signal at the level determined by the voltage across the capacitor 907. The signal output by the inverter 908 is supplied to an inverter 909, which generates a signal at the reverse logic level. The power-supply terminal 110 of the inverter 908 is connected to the inverter 909 by a line. The voltage across this line is backed up by a capacitor 911.

When the voltage on the power-supply line 901 drops, the charge is released from the capacitor 907 through a resistor 912, whereby the voltage across the capacitor 907 decreases. As a result, the inverter 908 outputs a positive logic-level signal I, whereas the inverter 909 outputs a negative logic-level signal $\bar{I}$. These signals I and $\bar{I}$ are used as power-supply stop signals. They can also be used as power-supply detecting signals.

Figure 10:
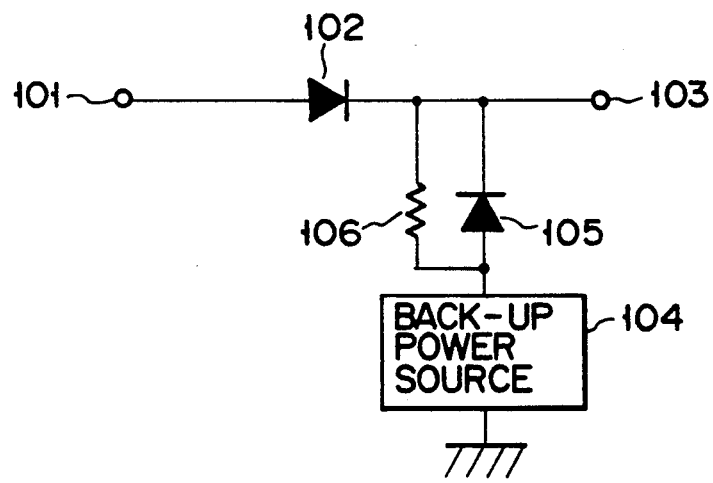
FIG. 10 is a diagram showing a back-up circuit for use in any memory of this invention, which operates when the power switch of the memory is turned off.

FIG. 10 shows a back-up circuit for use in any semiconductor memory described above. This circuit is designed to operate when the power switch of the memory is turned off. As is shown in FIG. 10, a DC voltage input terminal 101 is connected to a rectifier element 102. The element 101 is coupled to a voltage-applying terminal 103, which is connected to a semiconductor memory according to the first, second or third embodiment of the invention. A back-up power source 104, such as a battery or a capacitor, is connected to the rectifier element 102 by a rectifier element 105 and a resistor 106. The rectifier element 105 and the resistor 106 are connected in parallel to each other. No sooner has the supply of power to the input terminal 101 been stopped, than the back-up power source 104 starts applying a voltage to the voltage-applying terminal 103.

The circuits shown of FIGS. 9 and 10 can be used in the memory illustrated in FIG. 3, 5, or 7. Assuming that these circuit are incorporated in the memory, the power-supply detecting circuit (FIG. 9) outputs a power-supply detecting signal when the power switch of the memory is turned on. This signal sets the memory in the nonvolatile mode, and the data is read from the memory. Upon completion of the reading of data, the operation mode of the memory is switched to the volatile mode. When the power switch of the memory is turned off, the circuit (FIG. 9) outputs a power-supply stop signal. The power-supply stop signal switches the operation mode of the memory, from the volatile mode to the nonvolatile mode. At the same time, the power-supply stop signal is supplied to the input terminal 101 of the back-up circuit (FIG. 10). Upon receipt of this signal, the backup circuit starts applying a voltage to the memory through the voltage-applying terminal 103. Then, the memory operates in the nonvolatile mode, refreshing the data.

Thus, if the circuits of FIGS. 9 and 10 are used in the memory according to the invention, the memory operates in the volatile mode as long as the power switch remains on. Its operation mode is switched to the nonvolatile when the power switch is turned off. Hence, the memory, though a type of a DRAM, can be used as a nonvolatile memory in practice.

To demonstrate the long lifetime of the semiconductor memory according to the invention, the inventors conducted the following experiment. Used in the experiment was the circuit shown in FIG. 11 which is designed to measure the remaining lifetime of the ferroelectric capacitors incorporated in the memory. As is evident from FIG. 11, the circuit comprises a current detecting resistor 112, a pulse generator 113, and an impedance-matching resistor 114.

A ferroelectric capacitor 111 (i.e., a test piece) is arranged, with its first electrode coupled to the resistor 112 and its second electrode connected to the pulse generator 113 and the resistor 114. The ferro-electric plate of the capacitor 111 is made of $Pb(Zr, Ti)O_3$ series material.

Figure 11:
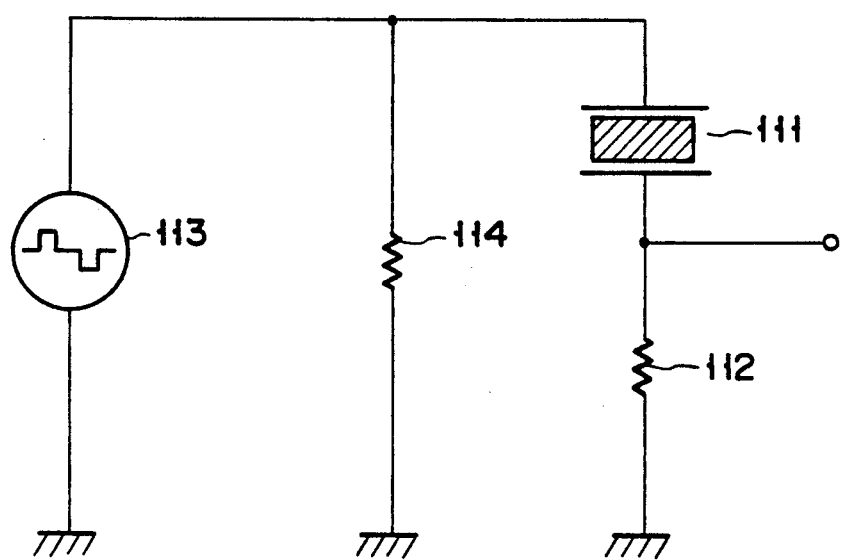
FIG. 11 is a diagram showing a circuit for measuring the remaining lifetime of the ferroelectric capacitors incorporated in any memory according to the present invention.
Figure 12:
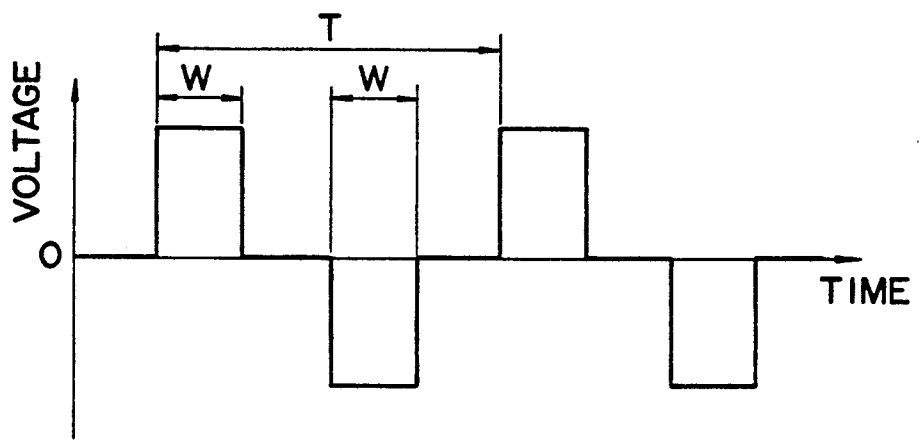
FIG. 12 is a diagram representing the pattern of a pulse signal used to change the direction in which to polarize the ferroelectric capacitors.
Figure 13:
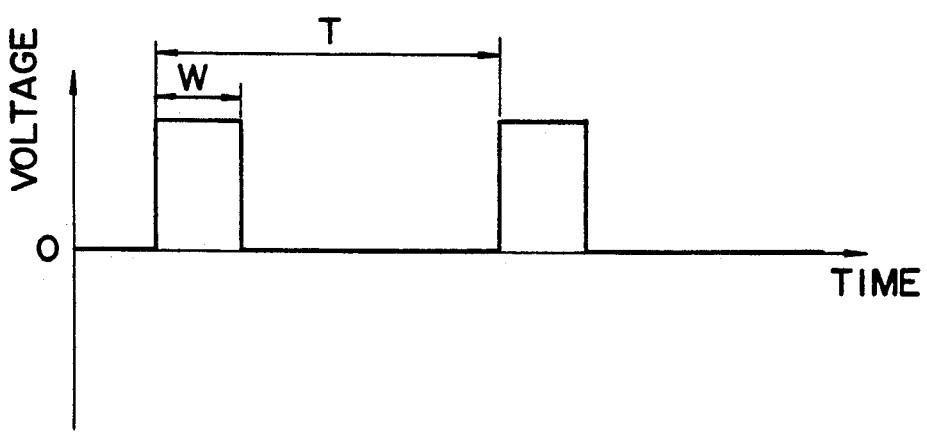
FIG. 13 is a diagram showing the patterns of a pulse signal used not to change the direction in which to polarize the ferroelectric capacitors.

Two identical circuits of the type shown in FIG. 11 were used in the experiment. In the first circuit, a positive voltage pulse and a negative voltage pulse, having the same width W, were alternately and repeatedly applied from the pulse generator 113 to the capacitor 111, as is illustrated in FIG. 12, thereby repeatedly polarizing the capacitor 111, alternately in forward and reverse directions. In the second circuit, a positive voltage pulse having the width W was repeatedly applied from the pulse generator 113 to the capacitor 111, as is illustrated in FIG. 13, thereby repeatedly polarizing the capacitor 111 in the forward direction only. Either circuit kept on measuring the residual polarization (Pr) of the capacitor 111 as the capacitor 111 was repeatedly polarized. Pr was measured by the following equation:

$$Pr = (Qr - Qn)/2$$

where Qr is the electric charge which polarizes the capacitor in the reverse direction, and Qn is the electric charge which polarizes the capacitor in the forward direction.

FIG. 14 represents how the residual polarization (Pr) of either capacitor 111 changed as the capacitor was repeatedly polarized. More precisely, the curve A shows how Pr of the capacitor set in the second circuit decreased as the capacitor was repeatedly polarized in the forward direction by the $10^5$th pulse to the $10^{15}$th pulse, and the curve B indicates how Pr of the capacitor 111 set in the first circuit decreased as it was repeatedly polarized in the reverse direction by the $10^5$th pulse to the $10^{15}$th pulse. As is evident from curve A in FIG. 14, the capacitor repeatedly polarized in only the forward direction had its Pr reduced little even after it had been polarized $10^{12}$ times. By contrast, as curve B reveals, the capacitor repeatedly polarized in the forward and reverse directions had its Pr decreased prominently after it had been polarized $10^{12}$ times.

In any above-described semiconductor memory of the invention, each ferroelectric capacitor has its Pr reduced as curve A (FIG. 14) shows when the memory operates in the volatile mode, and has its Pr reduced as curve B (FIG. 14) shows when the memory operates in the nonvolatile mode. Since the memory operates in the volatile mode almost all time, and temporarily operates in the Nonvolatile mode only when necessary, each ferro-electric capacitor has a long lifetime. Ultimately, the semiconductor memory of the invention has a sufficiently long lifetime.

In the first, second and third embodiments described above, each ferroelectric capacitor has its first electrode coupled to a sense amplifier by a switching element and a bit line, and its second electrode connected to the plate line driver by a plate line. The ferroelectric capacitor is therefore polarized in one direction or the other, in accordance with the potentials of the bit line and the plate line. Obviously, the memory needs as many plate lines as the word lines. The more plate lines, the more complex the peripheral circuit of the memory-cell array would be.

According to the present invention, there are provided semiconductor memories, each having circuits which are arranged around a memory-cell array and are simple in structure. These memories will now be described.

FIG. 15 illustrates a semiconductor memory according to a fourth embodiment of the invention. This memory comprises a plurality of bit-line pairs BL1 and $\overline{BL1}$, ... BLn and $\overline{BLn}$, a plurality of word-lines WL1 to WLm, and a pair of dummy word lines DWL and DWL' extending in the row direction. The bit lines BL1, $\overline{BL1}$, ... BLn and $\overline{BLn}$ extend in the column direction. The word lines WL1 to WLm, and the dummy word lines DWL and $\overline{DWL}$ extend in the row direction, and hence inter sect with the bit lines BL1, $\overline{BL1}$, ... BLn and $\overline{BLn}$ at right angles. At the intersections of the bit lines BL1, $\overline{BL1}$, ... BLn and $\overline{BLn}$ and the word lines WL1 to WLm, there are arranged ferroelectric memory cells, each comprising a ferroelectric capacitor and a transistor. At the intersections of the bit lines BL1, $\overline{BL1}$, ... BLn and $\overline{BLn}$ and the dummy word lines DWL and $\overline{DWL}$, there are arranged dummy cells, each comprising a reference dielectric capacitor and a transistor. When the word line WL1 and the dummy word line DWL are selected and driven, the memory cell connected to the bit line BL1 of each pair, and the dummy cell coupled to the bit line $\overline{BL1}$ of each pair are selected. For the sake of simplicity, the following description will center around two memory cells located at the intersections of the bit lines BL1 and $\overline{BL1}$ and the word lines WL1 and WL2, and two dummy cells located at the intersections of the bit lines BL1 and $\overline{BL1}$ and the dummy lines DWL and $\overline{DWL}$.

The memory cell located at the intersection of the bit line BL1 and the word line WL1 comprises a ferroelectric capacitor MC and a switching transistor MF. The ferroelectric capacitor MC comprises a ferroelectric layer made of, for example, Pb(Zr, Ti)O$_3$ and formed by sputtering, and two electrodes made of, for example, platinum and formed on the major surfaces of the ferroelectric layer. The first electrode of the capacitor MC is connected to the bit line BL1 by the switching transistor MF. The second electrode of the capacitor MC is connected to a plate line PL. The gate of the switching transistor MF is coupled to the word line WL1.

In the semiconductor memory shown in FIG. 15, Vss level and Vcc levels are used as low level and high level, respectively. A potential of Vcc/2 is applied to the plate line PL by means of the voltage division performed by a resistor (not shown) incorporated in the memory. Alternatively, the potential of Vcc/2 can be applied to the plate line PL from an external device.

The memory cell located at the intersection of the bit line $\overline{BL1}$ and the word line WL2 comprises a ferroelectric capacitor MC' and a switching transistor MF' which are identical to the capacitor MC and the transistor MF, respectively. The first electrode of the capacitor MC' is coupled to the bit line $\overline{BL1}$ by the switching transistor MF'. The second electrode of the capacitor MC' is connected to the plate line PL. The gate of the switching transistor MF' is connected to the word line WL2.

The dummy cell located at the intersection of the bit line BL1 and the dummy word line $\overline{DWL}$ comprises a reference dielectric capacitor DC and a switching transistor DF. The capacitor DC comprises a dielectric layer and two electrodes made of, for example, platinum and formed on the major surfaces of the dielectric layer. The dielectric layer has such a capacitance that a current flows into it, which is less than the current flowing into the ferroelectric capacitor MC when the capacitor MC is not reversely polarized and greater than the current flowing into the capacitor MC when the capacitor MC is reversely polarized. The first electrode of the capacitor DC is coupled to the bit line BL1 by the switching transistor DF. The second electrode of the capacitor DC is connected to the plate line PL. The gate of the switching transistor DF is connected to the dummy word line $\overline{DWL}$.

The dummy cell located at the intersection of the bit line $\overline{BL1}$ and the dummy word line DWL comprises a dielectric capacitor DC' and a switching transistor DF' which are identical to the capacitor DC and the transistor DF, respectively. The first electrode of the capacitor DC' is connected to the bit line $\overline{BL1}$ by the switching transistor DF'. The second electrode of the capacitor DC' is connected to the plate line PL. The gate of the switching transistor DF' is coupled to the dummy word line $\overline{DWL}$.

The memory shown in FIG. 15 has peripheral circuits are designed to write data into and read data from the memory-cell array. These peripheral circuits are of the same type as those used in the conventional dynamic random-access memory (DRAM). More specifically, as is shown in FIG. 15, the word lines WL1, $\overline{WL1}$, ... WLm are connected to a row decoder/word-line driver 201, and the dummy word lines DWL and $\overline{DWL}$ are coupled to a dummy word-line decoder/driver 202.

The bit lines BL1 and $\overline{BL1}$ of each pair are connected to a first equalizer 203 and a second equalizer 204. The first equalizer 203 is used to pre-charge the bit lines BL1 and $\overline{BL1}$ to potential $V_{PC}$. The second equalizer 204 is used to set the bit lines BL1 and $\overline{BL1}$ at Vcc/2 which is equal to the potentials of the second electrodes of the capacitors MC and MC', thereby to cancel the charge in the memory cell. The first equalizer 203 is driven by a first clock signal $\phi_1$, to apply the pre-charge potential $V_{PC}$ which can either be Vcc and Vss. The second equalizer 204 is driven by a second clock signal $\phi_2$, and is connected to a sense amplifier 205. The sense amplifier 205 is driven by sense-amplifier signal $\phi_{ACT}$ and $\overline{\phi_{ACT}}$. The bit lines BL1 and $\overline{BL1}$ are connected to column-selecting switching transistors CF1a and CF1b, respectively. These transistors CF1a and CF1b are coupled to an data input/output section (not shown) by input/output data lines I/O and $\overline{I/O}$, respectively. The gates of the switching transistors CF1a and CF1b are connected to a column decoder/column-selecting line driver 206 by a column-selecting line CSL1.

A potential-switching circuit 207 is connected to the memory-cell array. The circuit 207 is designed to switching the potential of the second electrode of the ferroelectric capacitor of each memory cell. The circuit 207 comprises two power supplies and two switching transistors FR1 and FR2. The first power supply outputs a potential Vcc/2, and the second power supply outputs a potential $V_{PL}$. When the switching transistors FR1 and FR2 are turned on and off, respectively, the plate line PL is set at the first potential Vcc/2, whereby the memory cells function as nonvolatile ones. On the other hand, when the switching transistors FR1 and FR2 are turned off and on, respectively, the plate line PL is set at the potential of $V_{PL}$, which is either Vcc or Vss. In this case, the memory cells function as volatile ones and store one bit each, just like the memory cells of a DRAM which have an ordinary capacitor. More precisely, each memory cell stores a "1" bit if it accumulates an electric charge, or a "0" bit if it accumulates no electric charge.

As is shown in FIG. 15, the memory further comprises a pair of DRAM-mode dummy word lines dDWL and $\overline{dDWL}$, and two DRAM-mode dummy cells. Both DRAM-mode dummy word lines dDWL and $\overline{dDWL}$ are connected to the dummy word-line decoder/driver 202. The first DRAM-mode dummy cell is located at the intersection of the bit line BL1 and the dummy word line $\overline{dDWL}$. The second DRAM-mode dummy cell is arranged at the intersection of the bit line $\overline{BL1}$ and the dummy word line dDWL.

The first DRAM-mode dummy cell comprises a dielectric capacitor dDC and a switching transistor dDF. The capacitor dDC has half the capacitance of the ferro-electric capacitors MC and MC'. The first electrode of the capacitor dDC is connected to the bit line BL1 by the switching transistor dDF. The second electrode of the capacitor dDC is coupled to the plate line PL. The gate of the switching transistor dDF is connected to the DRAM-mode dummy word line $\overline{dDWL}$.

The second DRAM-mode dummy cell comprises a dielectric capacitor dDC' and a switching transistor dDF' which are identical to the capacitor dDC and the transistor dDF, respectively. The first electrode of the capacitor dDC' is connected to the bit line $\overline{BL1}$ by the switching transistor dDF'. The second electrode of the capacitor dDC' is connected to the plate line PL. The gate of the switching transistor dDF' is coupled to the DRAM-mode dummy word line $\overline{dDWL}$.

The semiconductor memory shown in FIG. 15 functions as a ferroelectric nonvolatile memory when set in a mode called "nonvolatile" mode, and functions as a DRAM (Dynamic Random-Access Memory) when set in another mode called "DRAM mode." It will now be explained how the operation mode of this memory is switched from the nonvolatile mode to the DRAM mode, and vice versa, in accordance with a DRAM-mode signal $\overline{DR}$ which is supplied to external devices and a mode-switching signal $\overline{CHG}$ which is supplied to the memory from the external devices.

Nonvolatile Mode to DRAM Mode

As has been pointed out, the pre-charge potential $V_{PC}$ applied to the first equalizer 203 which is driven by the first clock signal $\phi_1$ while the memory is operating in the nonvolatile mode can be either Vcc or Vss. While the memory is in DRAM mode, the potential $V_{PL}$ of the plate line PL can also be either Vcc or Vss. Hence, there are the following four alternative combinations of the potentials $V_{PC}$ and $V_{PL}$.

(1) Mode Switching When $V_{PC}$ and $V_{PL}$ Are Vcc

Figure 16:
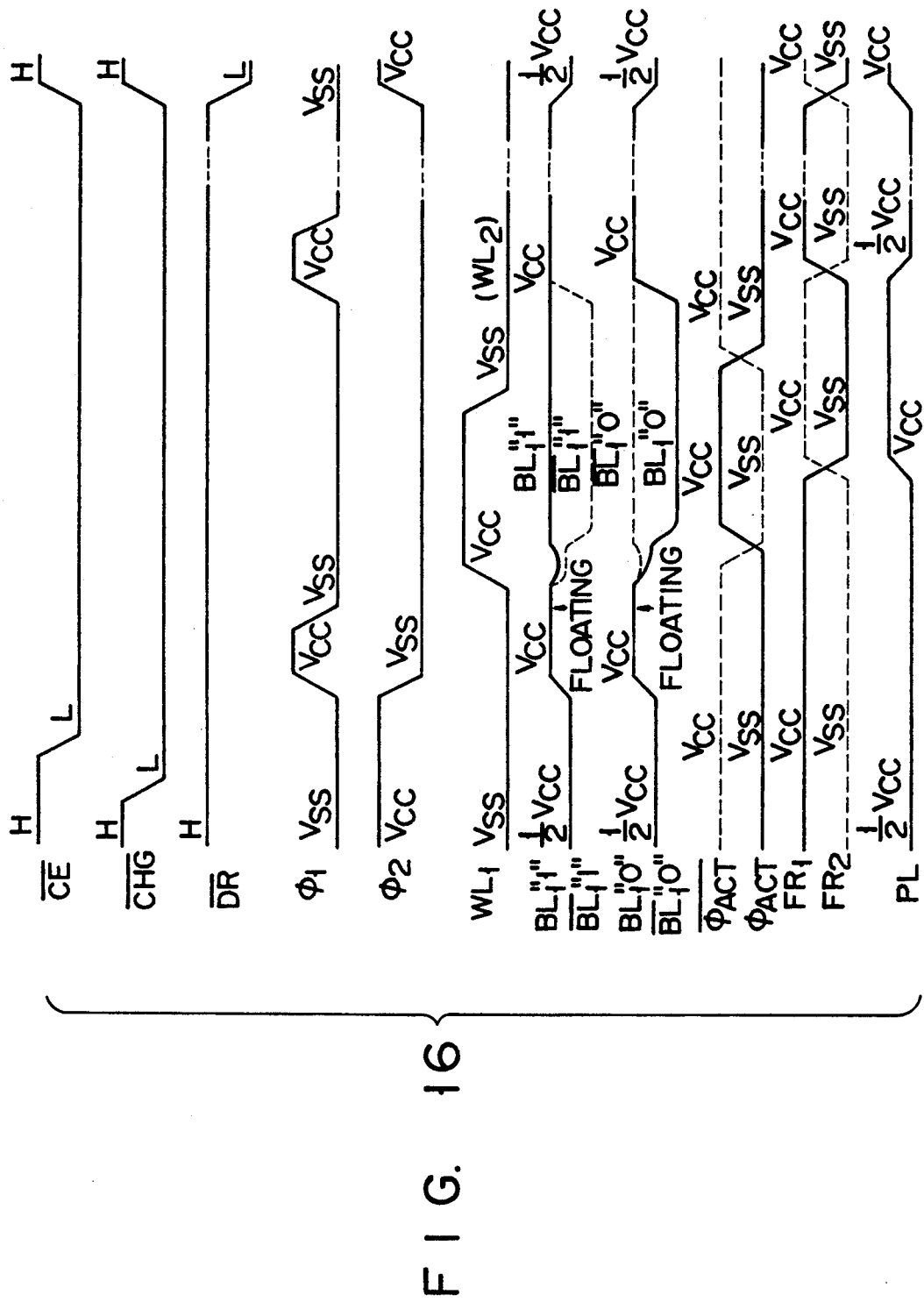

With reference to the timing chart of FIG. 16, it will be explained how the memory operates when both the pre-charge potential $V_{PC}$ and the plate-line potential $V_{PL}$ are set at Vcc.

The DRAM-mode signal $\overline{DR}$ is held at the high level in the nonvolatile mode. The mode-switching signal $\overline{CHG}$ is set at the low level before the chip enable signal $\overline{CE}$ is lowered to the low level. The cycle of switching the operation mode, from the nonvolatile mode to the DRAM mode is thereby initialized.

First, the row addresses of the memory are scanned sequentially, in the same way as in a DRAM in order to refresh the DRAM. As a result of this, the data items, which are defined by the directions in which the ferroelectric memory cells coupled to each word line are polarized, are rewritten to data items defined by the presence and absence of charges in the ferroelectric memory cells. When this data-rewriting is completed for all word lines, the semiconductor memory is refreshed. The memory has a refresh counter, which is used to count the row addresses. Alternatively, the memory has a counter which is used exclusively for counting the row addresses.

When the memory chip is not selected, the second equalizer 204 equalizes the bit lines BL1 and $\overline{BL1}$, setting them at the same potential of Vcc/2. The second clock signal $\phi_2$ is set at Vss. Then, the first clock signal $\phi_1$ is set from Vss to Vcc when the second equalizer 204 stops equalizing the bit lines BL1 and $\overline{BL1}$. Therefore, the first clock signal $\phi_1$ is lowered to the low level Vss, and both bit lines BL1 and $\overline{BL1}$ are held in Vcc-floating condition. When the row decoder/word-line driver 201 operates in response to an address signal, the potential of the first word line WL1 is raised from Vss to Vcc. Simultaneously, the dummy word-line decoder/driver 202 starts operating, thus connecting the dummy cell comprising the dielectric capacitor DC' and the switching transistor DF', to the bit line $\overline{BL1}$ which is complementary to the bit line BL1 to which the ferroelectric memory cell is connected. In other words, the dummy word line DWL is selected, and the potential of the dummy word line DWL is raised from Vss to Vcc, thereby connecting the dummy cell is connected to the bit line $\overline{BL1}$. The data defined by the direction of polarization is read from the ferroelectric memory cell connected to the bit line BL1, and the sense amplifier 205 determines the potentials of the bit lines BL1 and $\overline{BL1}$. Under this condition, the switching transistors FR1 and FR2 of the potential-switching circuit 207 are turned off and on, respectively, thus raising the potential of the plate line PL from Vcc/2 to Vcc.

If the ferroelectric memory cell stores a "1" bit while the memory is operating in the nonvolatile mode, the plate line PL is set at the same potential a the bit line BL1. (This is because the bit line BL1 is set at Vcc as long as the memory cell stores a "1" bit.) As a result of this, the electric charge is canceled out in the ferroelectric capacitor MC of the memory cell. If the ferroelectric memory cell stores a "0" bit while the memory is operating in the nonvolatile mode, the plate line PL is set at Vcc, whereas the bit line BL1 is set at Vss as long as the memory cell stores a "0" bit. Hence, the ferroelectric capacitor MC accumulates an electric charge equivalent to the difference between Vcc and Vss.

In this way, the data defined by the direction in which the capacitor MC is polarized is changed to one which is defined by the presence or absence of an electric charge in the capacitor MC. The ferroelectric capacitor MC is not polarized reversely when the memory cell is refreshed, that is, when the same data is written again into the cell while the memory is operating in the DRAM mode. This is because the pre-charge potential $V_{PC}$ and the plate-line potential $V_{PL}$ are equal to each other. Thus, there is no problem with the DRAM-mode operation of the semiconductor memory.

It is true that the ferroelectric capacitor MC may be polarized reversely when the data stored in the memory cell is written in the DRAM mode. This reverse polarization, however, does not adversely influence the operation of the memory at all since it takes place during the data-writing operation.

The potential of the word line WL1 is lowered from Vcc to Vss, and the memory cell is electrically disconnected from the bit line BL1. The sense-amplifier signals $\phi_{ACT}$ and $\overline{\phi_{ACT}}$ are controlled, thereby stopping the sense amplifier 205. The potential of the first clock signal $\phi_1$, which has been raised to Vcc, is lowered to Vss. The bit line BL1 is thereby brought into the floating condition. In the meantime, the first switching transistors FR1 and FR2 are turned on and off, lowering the potential of the plate line PL from Vcc to Vcc/2.

Next, the row decoder/word-line driver 201 operates in response to a row-address signal, thereby raising the potential of the second word line WL2 from Vss to Vcc. As a result, the same operations as have been performed on each memory cell connected to the first word line WL are performed on each memory cell which is connected to the second word line WL2. Further, as other address signals are supplied, one after another to the row decoder/word-line driver 201, the driver 201 raises the potentials of the third word line WL3 to the last word line WLm. As a result of this, data is refreshed in the memory cells connected to all word lines WL1 to WLm.

After the data has been refreshed in the memory cells connected to all word lines WL1 to WLm have, the second clock signal $\phi_2$ is set at the potential Vcc. The bit lines BL1 and $\overline{BL1}$ are thereby pre-charged to Vcc/2 and equalized. Simultaneously, the the switching transistors FR1 and FR2 are turned off and on, respectively, whereby the plate line PL is set at the potential of Vcc. At this time, the DRAM-mode signal $\overline{DR}$ is lowered from the high level to the low level. As a result, it is shown that the operation mode of the semiconductor memory is switched from the nonvolatile mode to the DRAM mode.

When DRAM-mode signal $\overline{DR}$ is lowered, it is necessary to activate the refresh circuit. At the same time, the dummy cells for the DRAM mode are set in response to this signal. When the mode-switching signal CHG and the chip enable signal $\overline{CE}$ are set at a high level, the switching from the nonvolatile mode to the DRAM mode is completed.

(2) Switching when $V_{PC}=Vss$, and $V_{PL}=Vcc$

Figure 17:
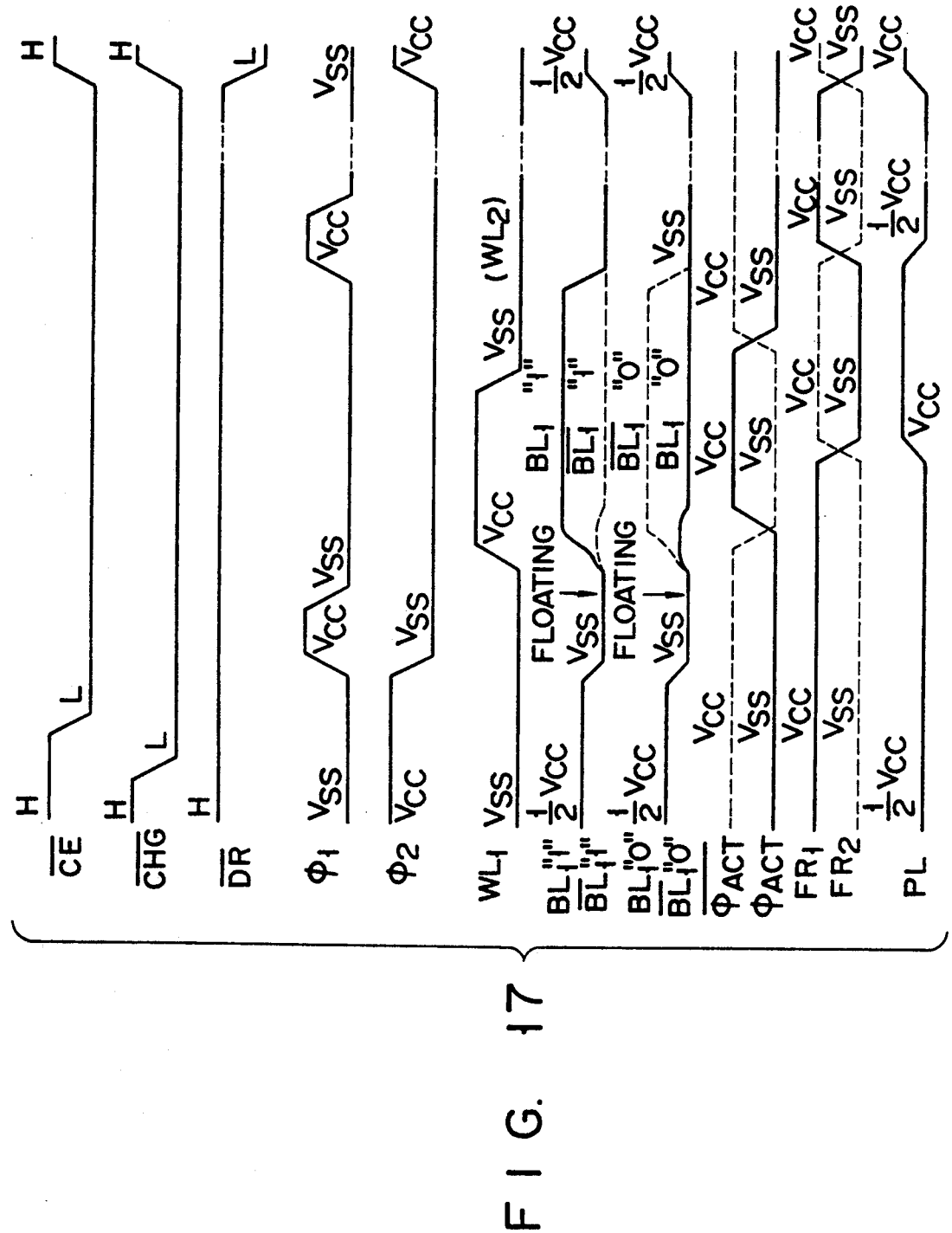

With reference to the timing chart of FIG. 17, it will be explained how the memory operates when the precharge potential $V_{PC}$ and the plate-line potential $V_{PL}$ are set at Vss and Vcc, respectively.

After data has been read from the memory set in the nonvolatile mode, by virtue of the Vss-floating of the bit lines BL1 and $\overline{BL1}$ of each pair, the sense amplifier 205 determines the potentials of these bit lines. Under this condition, the switching transistors FR1 and FR2 of the potential-switching circuit 207 are turned off and on, respectively, thereby raising the potential of the plate line PL from Vcc/2 to Vcc. Thereafter, the sequence of the same operations is carried out as in switching the operation mode of the memory from the nonvolatile mode to the DRAM mode. Thus, the data defined by the direction in which the ferroelectric capacitor MC of each memory cell is polarized is changed to one which is defined by the presence or absence of an electric charge in the ferroelectric capacitor MC.

No matter whether the data is defined by the presence or absence of a charge, or by the direction of the polarization, the ferroelectric capacitor MC may be polarized reversely when the data stored in the memory cell is a "1" bit and read therefrom, or when the data is refreshed. This is because the precharge potential VPC and the plate-line potential VPL have already been set to Vss and Vcc, respectively. Nonetheless, this reverse polarization does not adversely influence the operation of the memory at all since the polarization is reversed to increase the difference BL1 and $\overline{BL1}$. In other words, the memory can correctly operate even if the ferroelectric capacitor MC is reversely polarized during the data-writing operation.

(3) Switching when $V_{PC}=Vcc$, and $V_{PL}=Vss$

Figure 18:
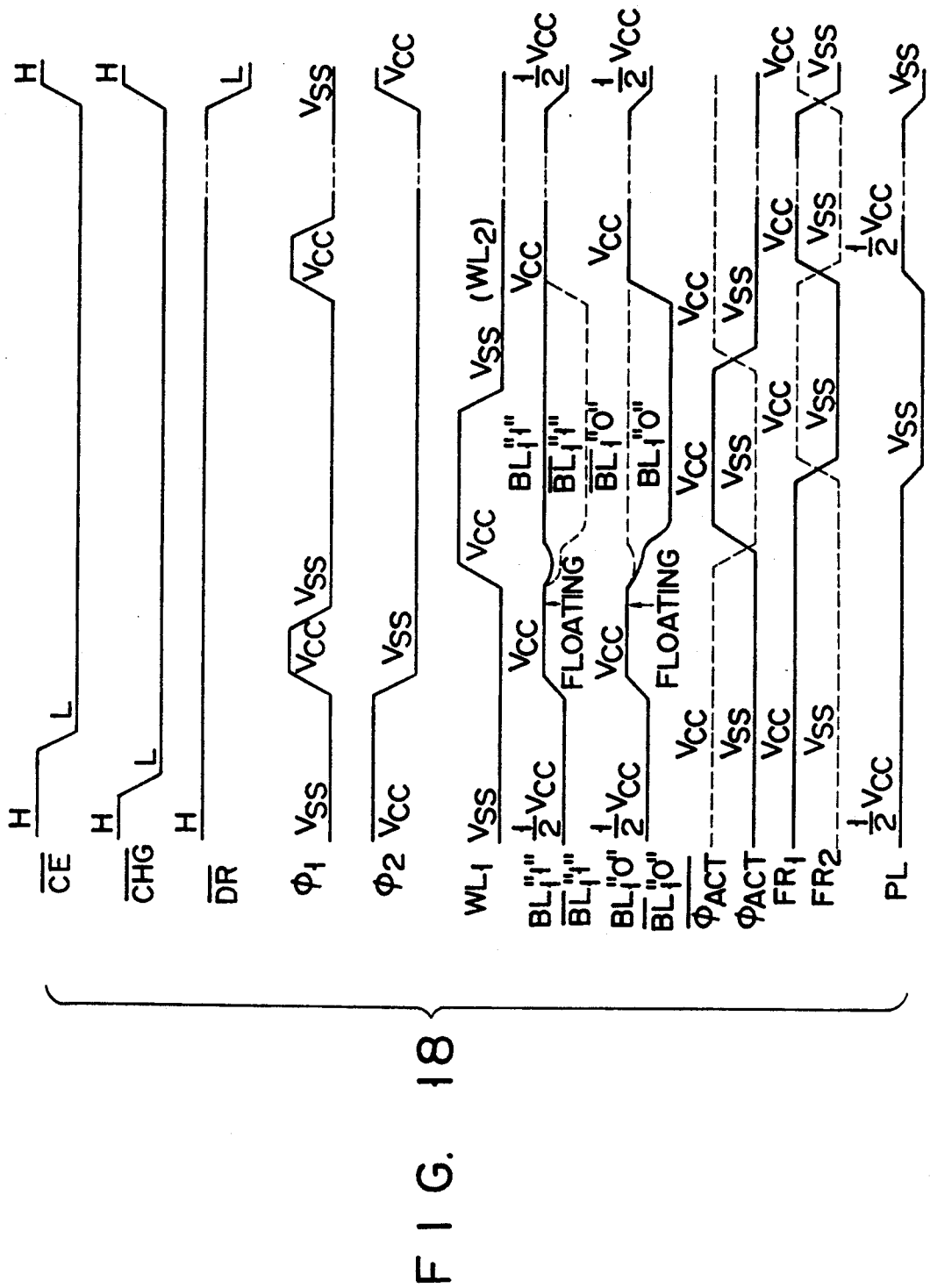

With reference to the timing chart of FIG. 18, it will be explained how the memory operates when the precharge potential $V_{PC}$ and the plate-line potential $V_{PL}$ are set at Vss and Vcc, respectively.

After data has been read from the memory set in the nonvolatile mode, by virtue of the Vcc-floating of the bit lines BL1 and $\overline{BL1}$ of each pair, the sense amplifier 205 determines the potentials of these bit lines. Under this condition, the switching transistors FR1 and FR2 of the potential-switching circuit 207 are turned off and on, respectively, thereby lowering the potential of the plate line PL from Vcc/2 to Vss. Then, if the memory cell has stored a "1" bit in the nonvolatile mode and, hence, the bit line BL1 has been set at Vcc, the ferroelectric capacitor MC of the memory cell accumulates an electric charge which is equivalent to the difference between Vcc and Vss. On the other hand, if the memory cell has stored a "0" bit and, hence, the bit line BL1 has been set at Vss, the bit line BL1 and the plate line PL are at the same potential. In this case, the ferroelectric capacitor MC accumulates no electric charge. As a result, the data defined by the direction in which the ferroelectric capacitor MC of each memory cell is polarized is changed to one which is defined by the presence or absence of an electric charge in the ferroelectric capacitor MC.

No matter whether the data is defined by the presence or absence of a charge, or by the direction of the polarization, the ferroelectric capacitor MC may be polarized reversely when the data stored in the memory cell is a "0" bit since the bit line BL1 is at Vss, and read therefrom, or when the data is refreshed. This is because the pre-charge potential $V_{PC}$ and the plate-line potential $V_{PL}$ have already been set to Vcc and Vss, respectively. Nonetheless, this reverse polarization does not adversely influence the operation of the memory at all since the polarization is reversed to increase the difference BL1 and $\overline{BL1}$. That is, the memory can correctly operate even if the ferroelectric capacitor MC is reversely polarized during the data-writing operation.

(4) Switching when $V_{PC}$=Vss, and $V_{PL}$=Vss

Figure 19:
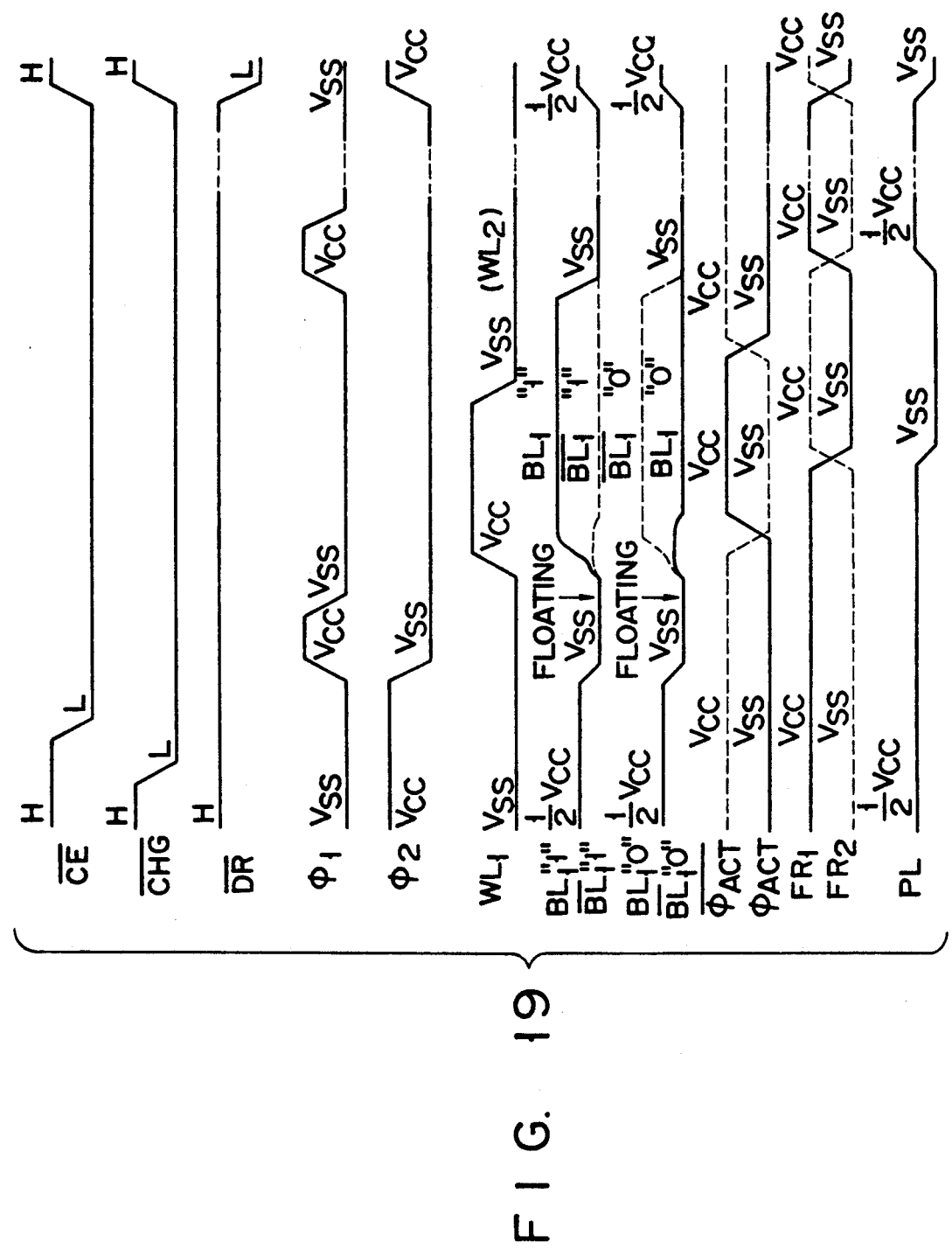

With reference to the timing chart of FIG. 19, it will be explained how the memory operates when both the pre-charge potential $V_{PC}$ and the plate-line potential $V_{PL}$ are set at Vss.

After data has been read from the memory set in the nonvolatile mode, by virtue of the Vss-floating of the bit lines BL1 and $\overline{BL1}$ of each pair, the sense amplifier 205 determines the potentials of these bit lines. Under this condition, the switching transistors FR1 and FR2 of the potential-switching circuit 207 are turned off and on, respectively, thereby lowering the potential of the plate line PL from Vcc/2 to Vss. Then, if the memory cell has stored a "1" bit in the nonvolatile mode and, hence, the bit line BL1 has been set at Vcc, the ferroelectric capacitor MC of the memory cell accumulates an electric charge which is equivalent to the difference between Vcc and Vss. On the other hand, if the memory cell has stored a "1" bit and, hence, the bit line BL1 has been set at Vss, the bit line BL1 and the plate line PL are at the same potential. In this case, the electric charge is canceled in the ferroelectric capacitor MC. As a result, the data defined by the direction in which the ferroelectric capacitor MC of each memory cell is polarized is changed to one which is defined by the presence or absence of an electric charge in the ferroelectric capacitor MC.

No matter whether the data is defined by the presence or absence of a charge, or by the direction of the polarization, the ferroelectric capacitor MC is not polarized reversely since the pre-charge potential $V_{PC}$ and the plate-line potential $V_{PL}$ have already been set at the same potential Vss. The memory therefore operates correctly. The capacitor MC may be polarized reversely when the data is rewritten in the DRAM mode, but this reverse polarization does not adversely influence the operation of the memory since it takes places during the data-writing operation.

DRAM-Mode Operation

With reference to the timing chart of FIG. 20, it will be explained how data is written into the memory of FIG. 15 while the memory is operating in the DRAM mode.

The plate-line potential VPL can be either Vcc or Vss. In this instance, however, the potential $V_{PL}$ is Vcc. As in the conventional DRAM, the write enable signal $\overline{WE}$ is set at the low level before the chip enable signal $\overline{CE}$ is lowered to the low level. A data-writing cycle is thereby initialized.

Let us assume the memory address and the write-in data $D_{IN}$, both supplied from the input/output section of the memory, have been defined before the chip enable signal $\overline{CE}$ is lowered to the low level. When the memory chip is not selected, the second equalizer 204 equalizes the bit lines BL1 and $\overline{BL1}$, setting them at the same potential of Vcc/2. The second clock signal $\phi_2$ is set at Vss. Then, the data input/output lines I/O and $\overline{I/O}$, which connect the memory cells to the external circuits (not shown), are set at Vss or Vcc in accordance with the write-in data $D_{IN}$.

Thereafter, the row decoder/word-line driver 201 operates in response to a row-address signal, thereby raising the potential of the word line WL1 from Vss to Vcc. Under this condition, the memory cell is connected to the bit line BL1. When the column decoder/column-selecting line driver 206 is operated in response to a column-address signal, thus raising the potential of the column-selecting line CSL1, from Vss to Vcc, the column-selecting switching transistors CF1a and CF1b are turned on. The data input/output lines I/O and $\overline{I/O}$ are therefore electrically connected to the bit lines BL1 and $\overline{BL1}$, respectively. As a result of this, the bit line BL1 is set at the same potential as the data input/output line I/O, and the bit line $\overline{BL1}$ is set at the same potential as the data input/output line $\overline{I/O}$. Hence, if the bit line BL1 is at Vcc, there is no potential difference between the bit line BL1 and the plate line PL which is set at Vcc, and the electric charge is canceled in the ferroelectric capacitor MC, whereby a "1" bit is written into the memory cell. Conversely, if the bit line BL1 is at Vss, there is a potential difference between the bit line BL1 and the plate line PL, and the ferroelectric capacitor MC accumulates an electric charge, whereby a "0" bit is written into the memory cell.

After the data, either a "1" bit or a "0" bit, has been written into the memory cell, the potential of the word line WL1 is lowered from Vcc to Vss. Hence, the memory cell is thereby electrically disconnected from the bit line BL1. Further, the potential of the column-selecting line CSL1 is lowered from Vcc to Vss. The bit lines BL1 and $\overline{BL1}$ are electrically disconnected from the data input/output lines I/O and $\overline{I/O}$, respectively. Simultaneously, the the second clock signal $\phi_2$, which has been at Vss, is set at Vcc. The second equalizer 204 therefore equalizes the bit lines BL1 and $\overline{BL1}$ and sets them at Vcc/2. Then, the chip enable signal $\overline{CE}$ and the write enable signal $\overline{WE}$ are set at the high level and the low level, respectively. Thus, the data-writing cycle ends. Data has been written into and held in the ferroelectric memory cell designated by the row-address signal and the column-address signal. It should be noted that the memory must be refreshed as the conventional DRAM, while it is operating in the DRAM mode.

Figure 21:
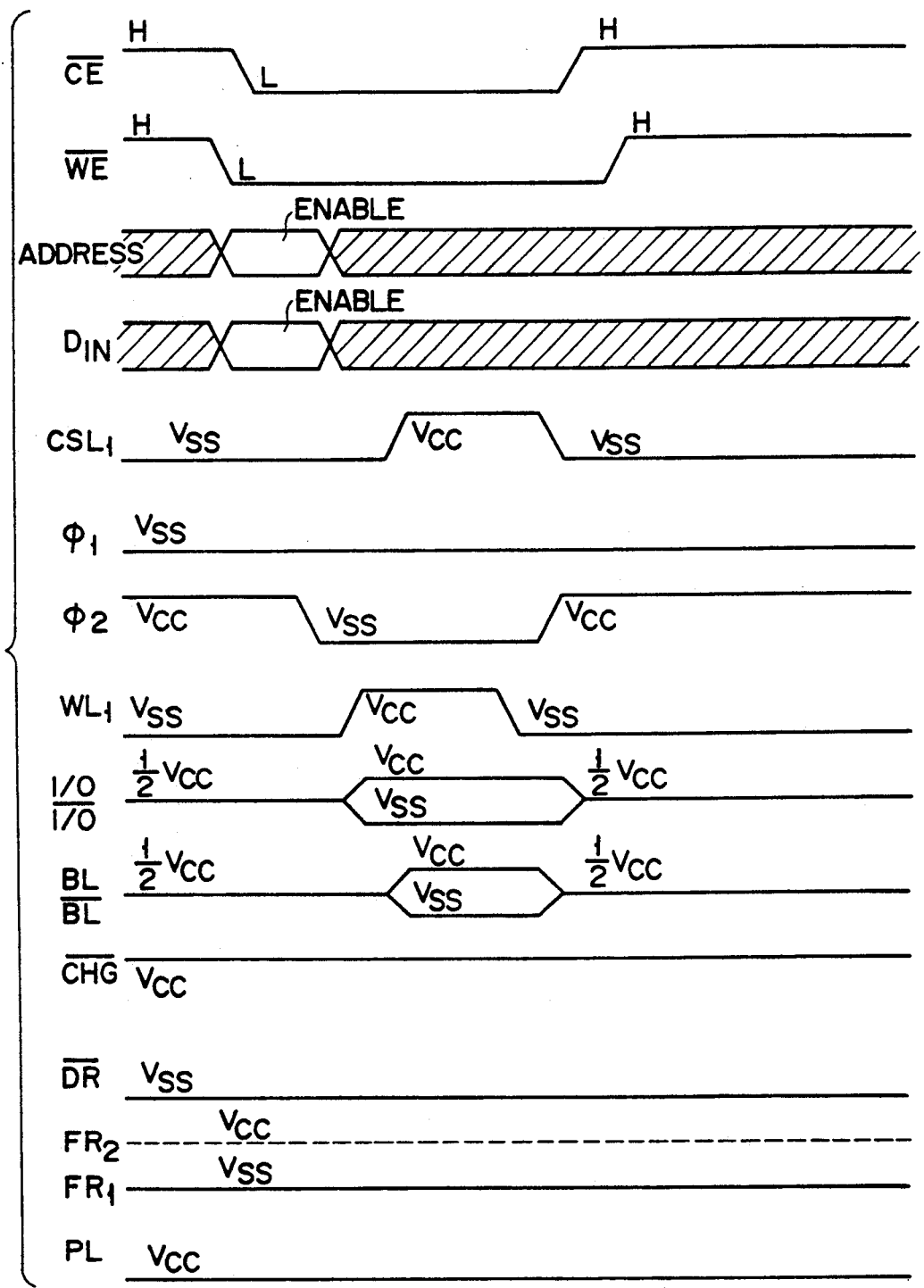

With reference to the timing chart of FIG. 21, it will be described how to write data into any selected memory when the plate-line potential $V_{PL}$ is at Vss.

If the bit line to which the memory cell is connected is set at Vcc, there is a potential difference between this bit line and the plate line PL which is at Vss, and the ferroelectric capacitor MC of the memory cell accumulates an electric charge, thus storing a "1" bit. If the bit line is set at Vss, there is no potential difference between the bit line and the plate line PL, and the electric charge is canceled in the capacitor MC of the memory cell. Except for this point, the same operations are performed as in the the case where the potential $V_{PL}$ is Vcc, in order to write data into the memory cell.

The timing of reading the data from the memory cell will be explained. To read the data from the memory cell, the bit line can be pre-charged either to the pre-charge potential VPC applied from the first equalizer 203, or to the potential Vcc/2 applied from the second equalizer 204. Further, the pre-charge potential can be set at Vcc or Vss. Still further, the plate-line potential $V_{PL}$ can be set at Vcc and Vss. Hence, the following six combinations of $V_{PC}$ and $V_{PL}$ which can be used to read the data from the ferroelectric memory.

(1) Reading Mode: $V_{PC}$=Vcc, $V_{PL}$=Vcc

Figure 22:
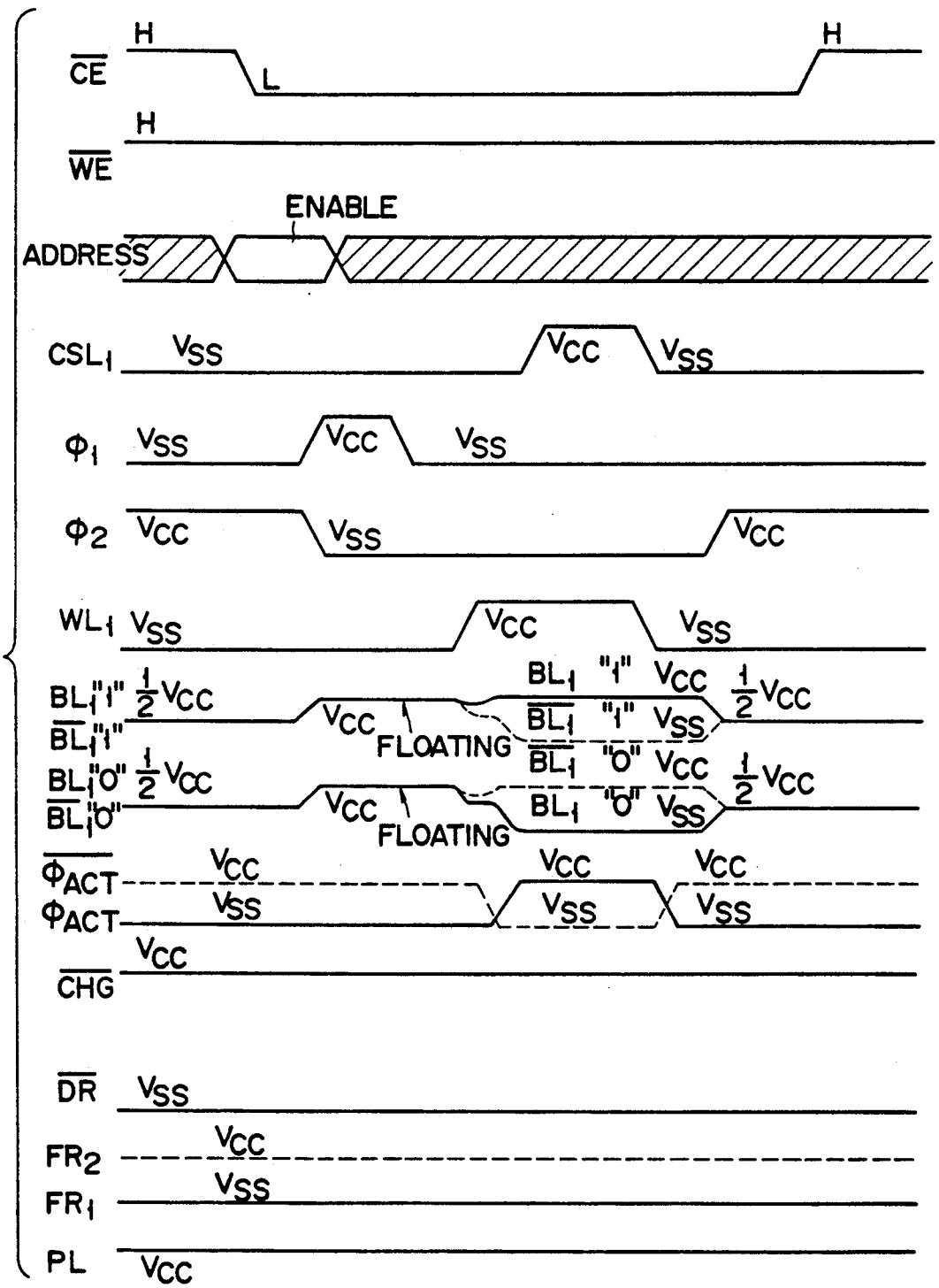

With reference to the timing chart of FIG. 22, it will now be explained how to read data from the memory while both the pre-charge potential VPC applied from the first equalizer 203 and the potential of the plate line PL remain at Vcc.

The write enable signal $\overline{WE}$ is set at the high level when the chip enable signal $\overline{CE}$ is lowered to the low level. A data-reading cycle is thereby initialized.

Let us assume the memory address has been defined before the chip enable signal $\overline{CE}$ is lowered to the low level. When the memory chip is not selected, the second equalizer 204 equalizes the bit lines BL1 and $\overline{BL1}$, setting them at the same potential of Vcc/2. The second clock signal $\phi_2$ is set at Vss, and the second equalizer 204 stops equalizing the bit lines BL1 and $\overline{BL1}$. The moment the second equalizer 204 stops equalizing the bit lines BL1 and $\overline{BL1}$, the first clock signal $\phi_1$ is set at the high level Vcc and lowered to Vss. Then, bit lines BL1 and $\overline{BL1}$ are brought into floating condition, while remaining at Vcc. The row decoder/word-line driver 201 operates in response to a row-address signal, thereby raising the potential of the first word line WL1 from Vss to Vcc. Simultaneously, the dummy word-line decoder/driver 202 starts operating, thus connecting the dummy cell comprising the dielectric capacitor dDC' and the switching transistor dDF', to the bit line $\overline{BL1}$ which is complementary to the bit line BL1 to which the ferroelectric memory cell is connected. In other words, the dummy word line DWL is selected, and the potential of the dummy word line DWL is raised from Vss to Vcc, thereby connecting the second dummy cell is connected to the bit line $\overline{BL1}$. As a result, the potential Vcc of the bit line BL1 and the potential Vcc of the plate line PL are applied to the selected ferroelectric memory cell. At this time, the potential of the bit line drops greatly if the memory cell accumulates an electric charge, and drops a little if the memory cell accumulates no electric charge.

Since the first and second DRAM-mode dummy cells each have a dielectric capacitor, which has half the capacitance of the ferroelectric capacitor MC, the difference between the data items stored in these dummy cells is defined by the potential difference between the bit lines BL1 and $\overline{BL1}$. Under this condition, the sense-amplifier signals $\phi_{ACT}$ and $\overline{\phi_{ACT}}$ are controlled, thereby driving the sense amplifier 205. Therefore, the potential of the bit line, which has dropped a little, is raised to Vcc, whereas the potential of the bit line, which has dropped greatly, is lowered to Vss. As a result, the ferroelectric capacitors loses all charge since destructive reading takes place in the same way as in the conventional DRAM. Nevertheless, the data is written again into the memory cells, since the sense amplifier 205 determines the potentials of these bit lines BL1 and $\overline{BL1}$.

After the potentials of the bit lines BL1 and $\overline{BL1}$ have been thus determined, the column decoder/column-selecting line driver 206 is operated in response to a column-address signal, thus raising the potential of the column-selecting line CSL1, from Vss to Vcc. The data is therefore output through an I/O buffer (not shown). The potential of the column-selecting line CSL1 falls from Vcc to Vss, whereby the data input/output lines I/O and $\overline{I/O}$ are therefore electrically disconnected from the bit lines BL1 and $\overline{BL1}$, respectively. Further, the potential of the word line WL1 is lowered from Vcc to Vss, whereby the memory cells connected to the word line WL1 are electrically disconnected from the bit line BL1. The sense-amplifier signals $\phi_{ACT}$ and $\overline{\phi_{ACT}}$ are controlled, thereby stopping the sense amplifier 205. The potential of the second clock signal $\phi_2$, which has been lowered to Vss, is raised to Vcc. Hence, the bit lines BL1 and $\overline{BL1}$ are equalized to the potential of Vcc/2. Then, the chip enable signal CE is raised to the high level. Thus, the data-reading cycle ends.

(2) Reading Mode: $V_{PC}$=Vss, $V_{PL}$=Vcc

With reference to the timing chart of FIG. 23, it will now be explained how to read data from the memory in the case where the pre-charge potential VPC applied from the first equalizer 203 is set at Vss.

The second clock signal $\phi_2$ is set at Vss. Then, the first clock signal $\phi_1$ is raised from Vss to Vcc when the second equalizer 204 stops equalizing the bit lines BL1 and $\overline{BL1}$. As a result of this, the bit lines BL1 and $\overline{BL1}$ are pre-charged to Vcc and are equalized. When the first clock signal $\phi_1$ is lowered to Vss, the bit lines BL1 and $\overline{BL1}$ are held at the Vss level, and remain in a floating condition. The row decoder/word-line driver 201 operates in response to a row-address signal, thereby raising the potential of the first word line WL1 from Vss to Vcc. Simultaneously, the dummy word-line decoder/driver 202 starts operating, thus connecting the dummy cell comprising the dielectric capacitor dDC' and the switching transistor dDF', to the bit line $\overline{BL1}$ which is complementary to the bit line BL1 to which the ferroelectric memory cell is connected. In other words, the dummy word line dDWL is selected, and the potential of the dummy word line dDWL is raised from Vss to Vcc, thereby connecting the second dummy cell is connected to the bit line $\overline{BL1}$. As a result, the potential Vss of the bit line BL1 and the potential Vcc of the plate line PL are applied to the selected ferroelectric memory cell. At this time, little current flows into the memory cell if the memory cell accumulates an electric charge, and a current flows into the memory cell if the memory cell accumulates no electric charge. The potential of the bit line BL1 rises a little if little current flows into the cell, and rises greatly if a large current flows into the the cell.

The sense-amplifier signals $\phi_{ACT}$ and $\overline{\phi_{ACT}}$ are controlled such that the sense amplifier 205 is driven, raising to Vcc the potential of the bit line BL1 which has risen greatly, and lowering to Vss the bit line BL1 which has risen a little. It should be noted that the DRAM-mode dummy cells are of the type whose pre-charge potential $V_{PC}$ is Vcc. The other operations performed to read data in this mode are identical to those carried out to read data in the mode wherein $V_{PC}$=Vcc and $V_{PL}$=Vcc.

(3) Reading Mode: $V_{PC}$=Vcc, $V_{PL}$=Vss

With reference to the timing chart of FIG. 24, it will now be explained how to read data from the memory shown in FIG. 15, in the case where the pre-charge potential VPC applied from the first equalizer 203 is Vcc, and the plate-line potential VPL is set at Vss.

After the bit lines BL1 and $\overline{BL1}$ have been set at Vcc and, hence, brought into floating condition, the row decoder/word-line driver 201 operates in response to a row-address signal and raises the potential of the selected word line WL1, from Vss to Vcc. Then, the potential Vcc of the bit line BL1 and the potential Vss of the plate line PL are applied to the selected ferroelectric memory cell. At this time, the potential of the bit line drops a little if the memory cell accumulates an electric charge, and drops greatly if the cell accumulates no electric charge. Hence, the sense amplifier 205 holds the bit line at Vcc if the cell accumulates an electric charge, and lowers the potential of the bit line to Vss if the cell accumulates no electric charge.

Thereafter, the same operations will be performed to read data in this mode, as in modes (1) and (2).

(4) Reading Mode: $V_{PC}$=Vss, $V_{PL}$=Vss

Figure 25:
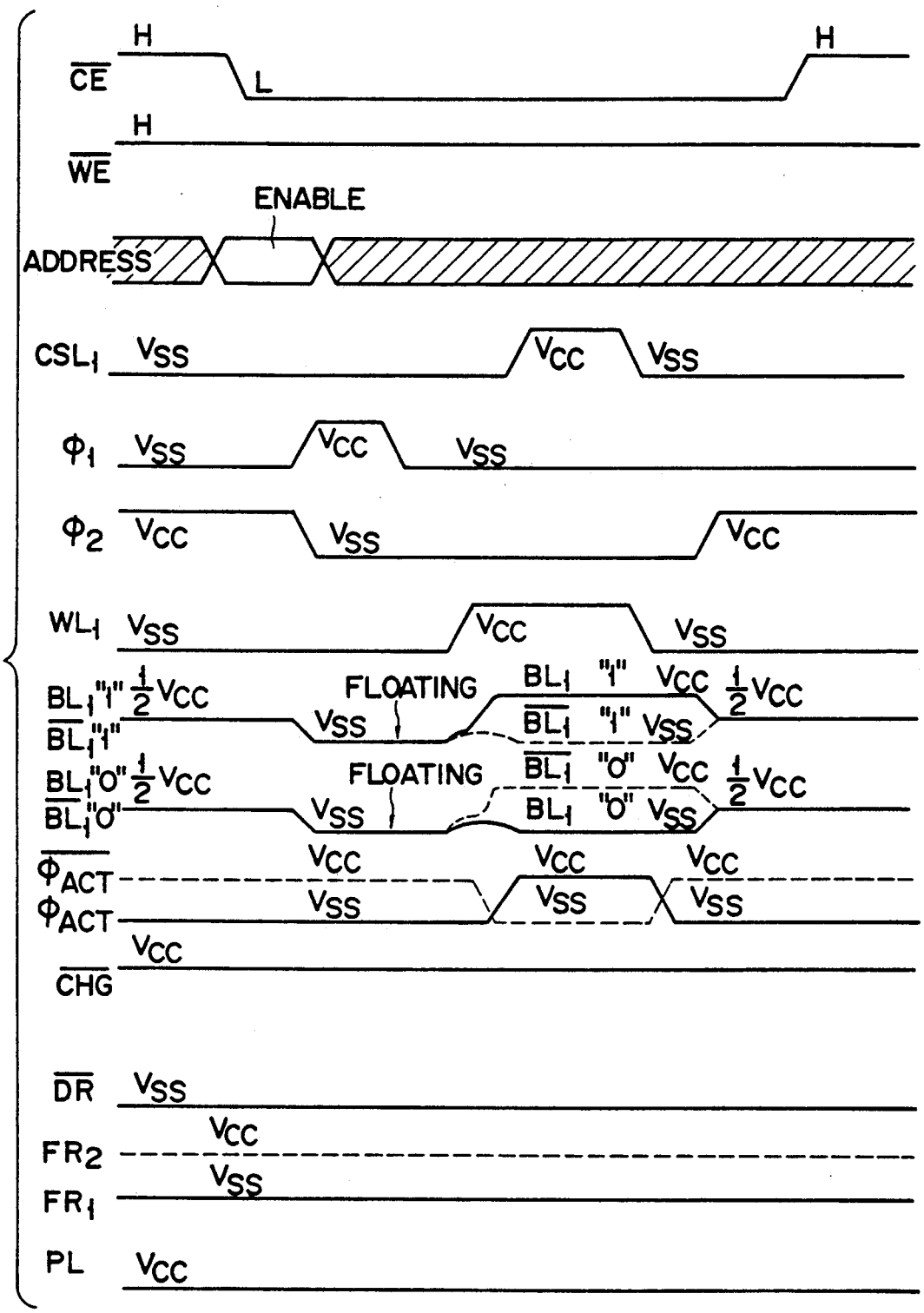

With reference to the timing chart of FIG. 25, it will now be explained how to read data from the memory shown in FIG. 15, in the case where the pre-charge potential VPC applied from the first equalizer 203 is Vss, and the plate-line potential $V_{PL}$ is set at Vss, too.

After the bit lines BL1 and $\overline{BL1}$ have been set at Vcc and, hence, brought into floating condition, the row decoder/word-line driver 201 operates in response to a row-address signal and raises the potential of the selected word line WL1, from Vss to Vcc. Then, the potential Vss of the bit line BL1 and the plate-line potential $V_{PL}$ (also, Vss) are applied to the selected ferroelectric memory cell. At this time, the potential of the bit line increases greatly if the memory cell accumulates an electric charge, and increases a little if the cell accumulates no electric charge. Hence, the sense amplifier 205 raises the potential of the bit line to Vcc if the cell accumulates an electric charge, and lowers the potential of the bit line to Vss if the cell accumulates no electric charge.

Thereafter, the same operations will be performed to read data in this mode, as in modes (1), (2), and (3) described above.

(5) Reading Mode: Pre-charge potential=Vcc/2, $V_{PL}=Vcc$

With reference to the timing chart of FIG. 26, it will now be explained how to read data from the semiconductor memory, in the case where the pre-charge potential is set at Vcc/2 by the second equalizer 204, and the potential $V_{PL}$ of the plate line PL is set at Vcc.

When the memory chip is not selected, the second equalizer 204 equalizes the bit lines BL1 and $\overline{BL1}$, thus setting both bit lines at the potential of Vcc/2. In this case, the first equalizer 203 is not operated. The second clock signal $\phi_2$ is set at Vss. As a result, the bit lines BL1 and $\overline{BL1}$ are no longer equalized, and are brought into floating condition, though both remains at Vcc/2. Then, the row decoder/word-line driver 201 operates in response to a row-address signal and raises the potential of the selected word line WL1, from Vss to Vcc. Then, the potential Vcc/2 of the bit line BL1 and the plate-line potential VPL (=Vcc) are applied to the selected ferroelectric memory cell. At this time, the potential of the bit line falls a little below Vcc/2 if the memory cell accumulates an electric charge, and rises above Vcc/2 if the cell accumulates no electric charge. Hence, the sense amplifier 205 lowers the potential of the bit line to Vss if the cell accumulates an electric charge, and raises the potential of the bit line to Vcc if the cell accumulates no electric charge.

Thereafter, the same operations will be carried out to read data in this mode, as in modes (1), (2), (3), and (4).

(6) Reading Mode: Pre-charge potential=Vss/2, $V_{PL}=Vss$

Figure 27:
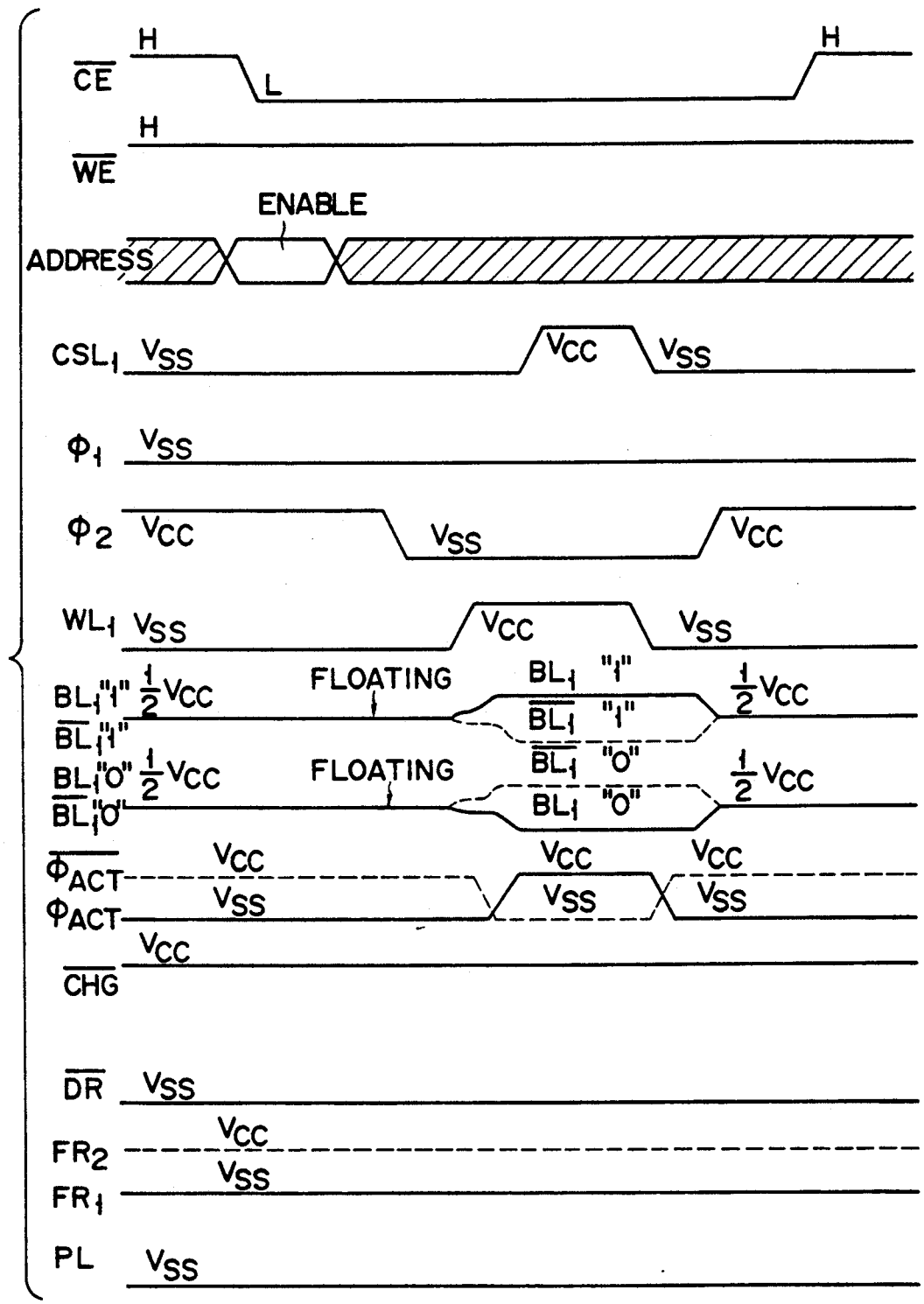

With reference to the timing chart of FIG. 27, it will now be explained how to read data from the semiconductor memory, in the case where the pre-charge potential is set at Vcc/2 by the second equalizer 204, and the penitential $V_{PL}$ of the plate line PL is set at Vss.

When the memory chip is not selected, the second equalizer 204 equalizes the bit lines BL1 and $\overline{BL1}$, thus setting both bit lines at the potential of Vcc/2. In this case, the first equalizer 203 remains to operate. The second clock signal $\phi_2$ is set at Vss. As a result, the bit lines BL1 and $\overline{BL1}$ are no longer equalized, and are brought into floating condition, though both remains at Vcc/2. Then, the row decoder/word-line driver 201 operates in response to a row-address signal and raises the potential of the selected word line WL1, from Vss to Vcc. Then, the potential Vcc/2 of the bit line BL1 and the plate-line potential $V_{PL}$ (=Vss) are applied to the selected ferroelectric memory cell. At this time, the potential of the bit line rises a little above Vcc/2 if the memory cell accumulates an electric charge, and falls below Vcc/2 if the cell accumulates no electric charge. Hence, the sense amplifier 205 raises the potential of the bit line to Vcc if the cell accumulates an electric charge, and lowers the potential of the bit line to Vss if the cell accumulates no electric charge.

Thereafter, the same operations will be performed to read data in this mode, as in modes (1), (2), (3), (4) and (5).

As has been described above, data can be read from the memory shown in FIG. 15 in six modes, in accordance with the values the pre-charge potential and the plate-line potential VPL assume. Whichever data-reading mode is selected, the memory can operates in the DRAM mode perfectly.

DRAM mode to Nonvolatile Mode

As has been explained, data can be read from the memory (FIG. 15) in six modes while the memory is set in the DRAM mode. Hence, there are six modes of switching the operation mode of the memory, from the DRAM mode to the nonvolatile mode. Whichever mode is used to switch the operation mode, the semiconductor memory operates, essentially in the same way.

(1) Mode Switching: $V_{PC}$=Vcc, $V_{PL}$=Vcc

Figure 28:
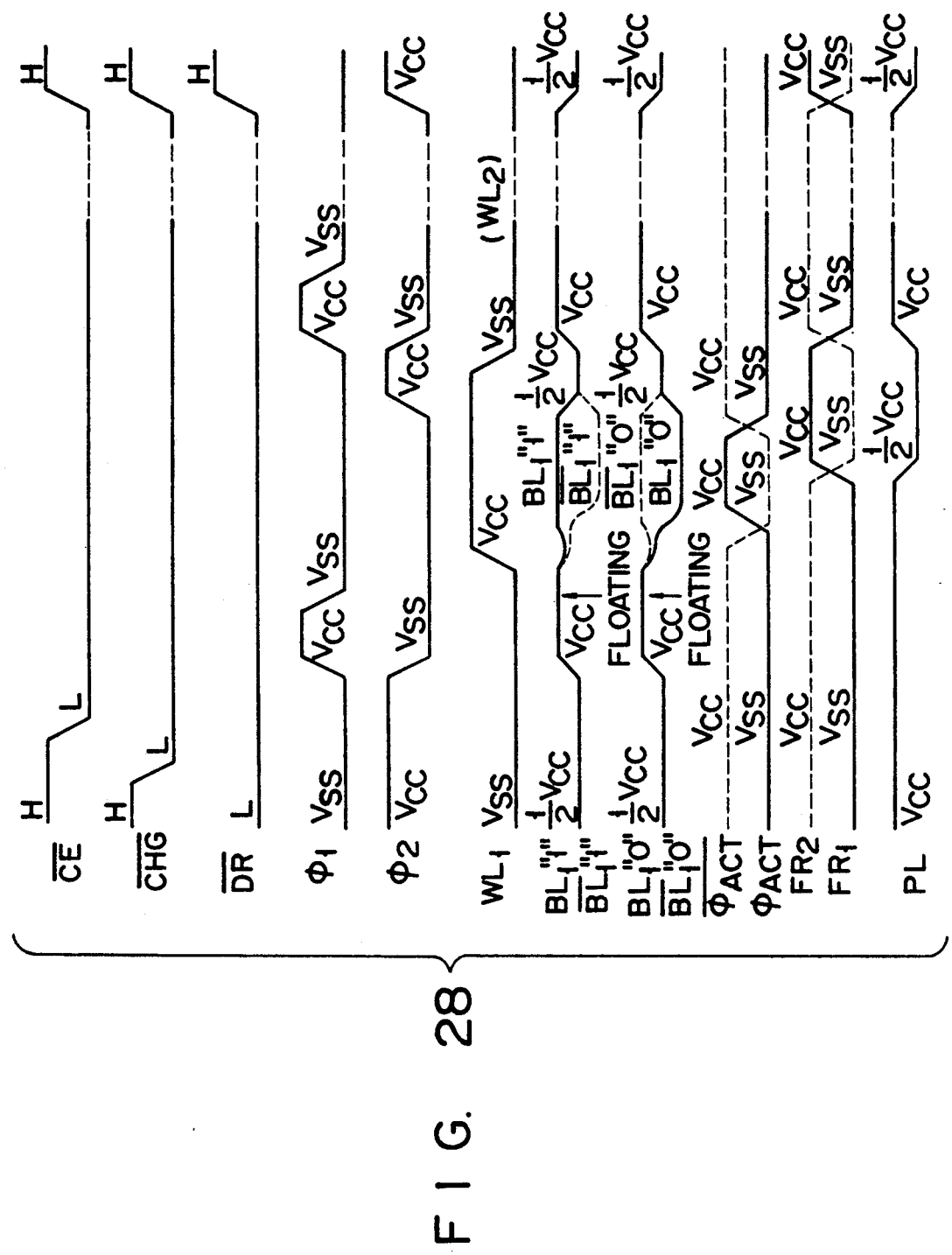

With reference to FIG. 28, it will be explained how to switch the operation mode, from the DRAM mode to the nonvolatile mode, when both the pre-charge potential $V_{PC}$ and the plate-line potential $V_{PL}$ are set at Vcc.

In the DRAM mode, the DRAM-mode signal DR is held at the low level. Therefore, the switching transistors FR1 and FR2 of the potential-switching circuit 207 are turned off and on, respectively. The plate-line potential is, hence, set at Vcc. The mode-switching signal $\overline{CHG}$ is set at the low level before the chip enable signal $\overline{CE}$ is lowered to the low level. The cycle of switching the operation mode, from the DRAM mode to the nonvolatile mode is thereby initialized.

First, the row addresses of the memory are scanned sequentially, in the same way as in a DRAM in order to refresh the DRAM. As a result of this, the data items, which are defined by the presence and absence of charges in the ferroelectric memory cells are rewritten to data items defined by the directions in which the ferroelectric memory cells coupled to each word line are polarized. When this data-rewriting is completed for all word lines, the semiconductor memory is refreshed. As has been pointed out, the memory has a refresh counter, which is used to count the row addresses Alternatively, the memory has a counter which is used exclusively for counting the row addresses.

When the memory chip is not selected, the second equalizer 204 equalizes the bit lines BL1 and $\overline{BL1}$, setting them at the same potential of Vcc/2. The second clock signal $\phi_2$ is set at Vss. Then, the first clock signal $\phi_1$ is set from Vss to Vcc when the second equalizer 204 stops equalizing the bit lines BL1 and $\overline{BL1}$. Therefore, the first clock signal $\phi_1$ is lowered to the low level Vss, both bit lines BL1 and $\overline{BL1}$ are held in Vcc-floating condition. When the row decoder/word-line driver 201 operates in response to an address signal, the potential of the first word line WL1 is raised from Vss to Vcc. Simultaneously, the dummy word-line decoder/driver 202 starts operating, thus connecting the dummy cell comprising the dielectric capacitor dDC' and the transistor dDF', to the bit line $\overline{BL1}$ which is complementary to the bit line BL1 to which the ferroelectric memory cell is connected. The data de fined by the presence and absense of charges is read from the ferroelectric memory cell connected to the bit line BL1, and the sense amplifier 205 determines the potentials of the bit lines BL1 and $\overline{BL1}$. Under this condition, the switching transistors FR1 and FR2 of the potential-switching circuit 207 are turned on and off, respectively, thus reducing the potential of the plate line PL from Vcc to Vcc/2.

If the ferroelectric memory cell stores a "1" bit while the memory is operating in the DRAM mode, the potential of the bit line is set at Vcc. As a result, there occurs a difference between the bit-line potential (=Vcc) and the plate-line potential (=Vcc/2), and the ferroelectric capacitor of the cell is polarized toward the plate line PL. On the other hand, if the memory cell stores a "0" bit while the memory is operating in the DRAM mode, the bit-line potential is set at Vss. In this case, too, there is made a difference between the bit-line potential (=Vss) and the plate-line potential (=Vcc/2), and the ferroelectric capacitor is polarized toward the bit line.

Then, the sense-amplifier signals $\phi_{ACT}$ and $\overline{\phi_{ACT}}$ are controlled, thereby stopping the sense amplifier 205. The potential of the second clock signal $\phi_2$, which has been lowered to Vss, is raised to Vcc. The bit lines BL1 and $\overline{BL1}$ are thereby equalized to Vcc/2. Hence, the potentials of both electrodes of the ferroelectric capacitor are set at Vcc/2, canceling the charge accumulated in the capacitor at the time of data-reading. However, the capacitor is not polarized reversely since there is no potential difference between its electrodes.

Thereafter, the potential of the word line WL1 is lowered from Vcc to Vss, electrically disconnecting the ferroelectric memory cell from the bit line BL1. At the same time the second clock signal $\phi_2$, which has been at Vcc, is set at Vss, the first clock signal $\phi_1$, which has been at Vss, is set at Vcc and then again at Vss. As a result, the bit lines BL1 and $\overline{BL1}$ are brought into floating condition. Meanwhile, the switching transistors FR1 and FR2 of the potential-switching circuit 207 are turned off and on, respectively, thus increasing the potential of the plate line PL from Vcc/2 to Vcc. The row decoder/word-line driver 201 operates in response to a row-address signal, raising the potential of the next word line, i.e., the line WL2, from Vss to Vcc. As a result, the same operations as have been performed on each memory cell connected to the first word line WL1 are performed on each memory cell which is connected to the second word line WL2. Further, as other address signals are supplied, one after another to the row decoder/word-line driver 201, the driver 201 raises the potentials of the third word line WL3 to the last word line WLm. As a result of this, data is refreshed in the memory cells connected to all word lines WL1 to WLm.

After the data has been refreshed in the memory cells connected to all word lines WL1 to WLm, the second clock signal $\phi_2$ is set at the level of Vcc, and the bit lines BL1 and $\overline{BL1}$ are pre-charged to Vcc/2 and thus equalized. At the same time, the switching transistors FR1 and FR2 of the potential-switching circuit 207 are turned off and on, respectively, thus setting the plate-line potential at Vcc/2. Then, the DRAM-mode signal $\overline{DR}$ is raised from the low level to the high level. The operation mode of the memory is thereby switched to the nonvolatile mode. A signal showing this switching of mode is output from the memory. In response to this signal, an external device (not shown) stops the refresh circuit. Simultaneously, the DRAM-mode dummy cells are replaced by the nonvolatile-mode dummy cells in the memory.

Finally, the mode-switching signal CHG is set at the high level, and the chip enable signal CE is set at the high level, too. Thus, the cycle of switching the operation mode, from the DRAM mode to the nonvolatile mode, is completed.

(2) Mode Switching: $V_{PC}$=Vss, $V_{PL}$=Vcc

Figure 29:
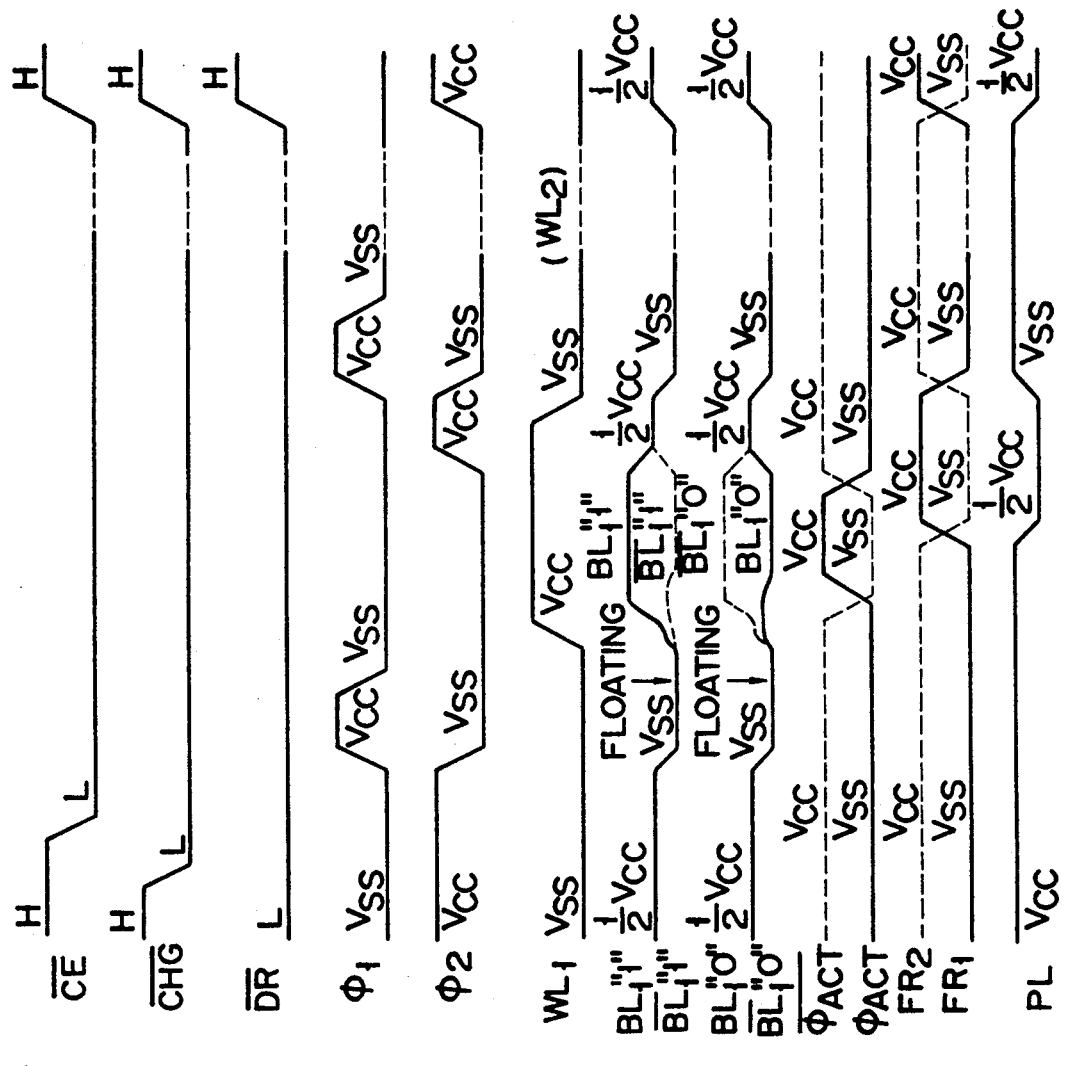

With reference to FIG. 29, it will be explained how to switch the operation mode, from the DRAM mode to the nonvolatile mode, when the pre-charge potential VPC is set at Vss, whereas the plate-line potential VPL is set at Vcc.

After data has been read from the memory operating in the DRAM mode, in the Vss-floating condition, the sense amplifier 205 determines the potentials of the bit lines BL1 and $\overline{BL1}$. Under this condition, the switching transistors FR1 and FR2 of the potential-switching circuit 207 are turned on and off, respectively, thus reducing the potential of the plate line PL from Vcc to Vcc/2.

Thereafter, the same operations will be performed to switch the operation mode, from the DRAM mode to the nonvolatile mode, as in the mode-switching operation (1) described above. As a result of this, the data items, each defined by the presence or absence of charge in each ferroelectric capacitor, are rewritten to data items which are defined by the directions in which the ferroelectric capacitors coupled to each word line are polarized.

(3) Mode Switching: $V_{PC}$=Vcc, $V_{PL}$=Vss

Figure 30:
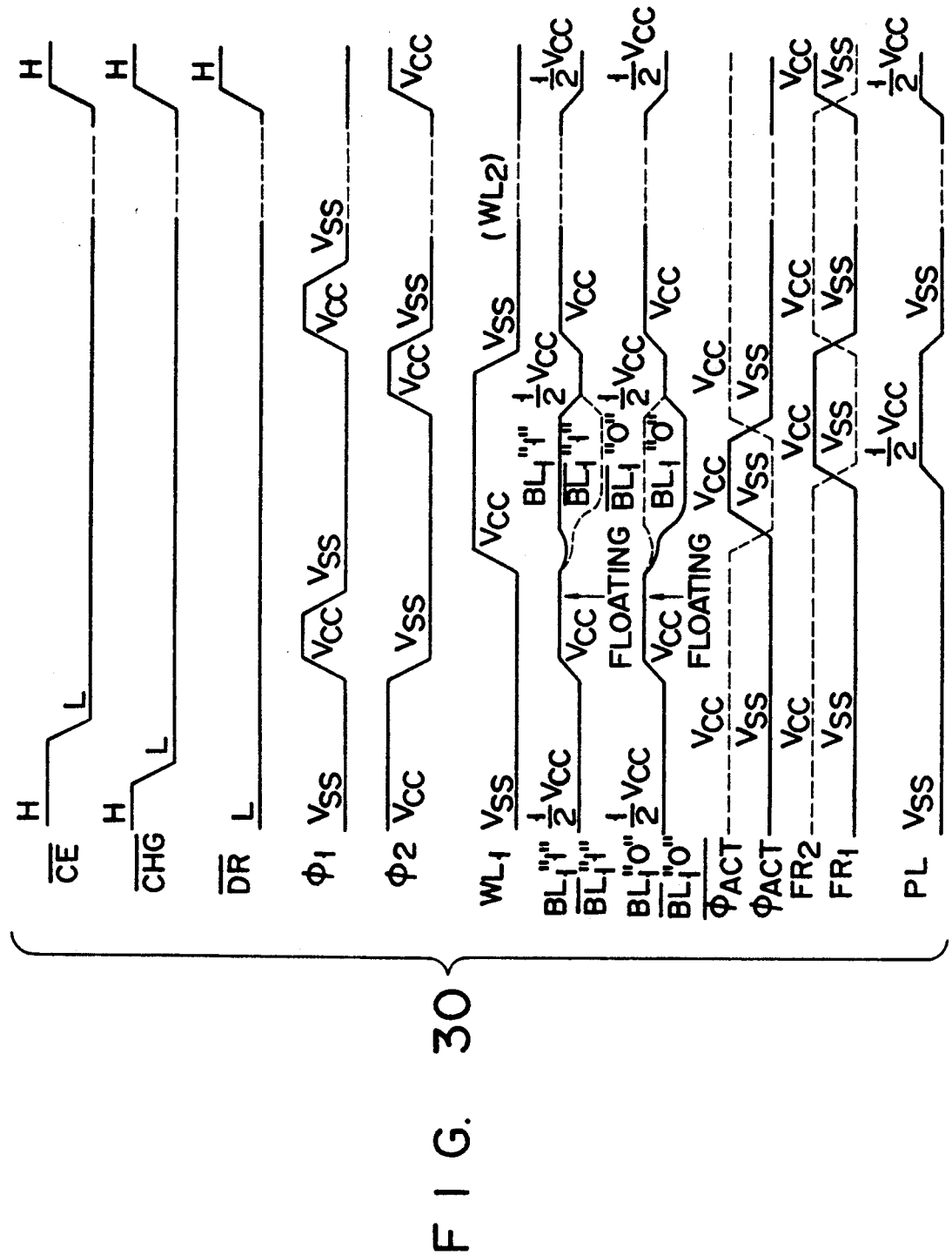

With reference to FIG. 30, it will be explained how to switch the operation mode, from the DRAM mode to the nonvolatile mode, when the pre-charge potential $V_{PC}$ is set at Vcc, whereas the plate-line potential $V_{PL}$ is set at Vss.

After data has been read from the memory operating in the DRAM mode, in the Vcc-floating condition, the sense amplifier 205 determines the potentials of the bit lines BL1 and $\overline{BL1}$. Under this condition, the switching transistors FR1 and FR2 of the potential-switching circuit 207 are turned on and off, respectively, thus raising the potential of the plate line PL from Vs to Vcc/2.

Thereafter, the same operations will be performed to switch the operation mode, from the DRAM mode to the nonvolatile mode, as in the mode-switching operations (1) and (2) described above. As a result, the data items, each defined by the presence or absence of charge in each ferroelectric capacitor, are rewritten to data items which are defined by the directions in which the ferroelectric capacitors coupled to each word line are polarized.

(4) Mode Switching: $V_{PC}=$Vss, $V_{PL}=$Vss

With reference to FIG. 31, it will be described how to switch the operation mode, from the DRAM mode to the nonvolatile mode, when both the pre-charge potential $V_{PC}$ and the plate-line potential $V_{PL}$ are set at Vss.

After data has been read from the memory operating in the DRAM mode, in the Vss-floating condition, the sense amplifier 205 determines the potentials of the bit lines BL1 and $\overline{BL1}$. Under this condition, the switching transistors FR1 and FR2 of the potential-switching circuit 207 are turned on and off, respectively, thus raising the potential of the plate line PL from Vss to Vcc/2.

Thereafter, the same operations will be performed to switch the operation mode, from the DRAM mode to the nonvolatile mode, as in the mode-switching operations (1), (2) and (3) described above. As a result, the data items, each defined by the presence or absence of charge in each ferroelectric capacitor, are rewritten to data items which are defined by the directions in which the ferroelectric capacitors coupled to each word line are polarized.

(5) Mode Switching: Pre-charge potential=Vcc/2, $V_{PL}=$Vcc

With reference to FIG. 32, it will be described how to switch the operation mode, from the DRAM mode to the nonvolatile mode, when the pre-charge potential is Vcc/2, i.e., the potential applied from the second equalizer 204, whereas the plate-line potential VPL is set at Vcc.

When the memory chip is not selected, the second equalizer 204 equalizes the bit lines BL1 and $\overline{BL1}$, setting them at the same potential of Vcc/2.

In this case, the first equalizer 203 is not driven at all, and the second clock signal $\phi_2$ is set at Vss. When the second equalizer 204 stops equalizing the bit lines BL1 and $\overline{BL1}$, the bit lines BL1 and $\overline{BL1}$ are brought into floating condition, while being held at Vcc/2. Thereafter, the sense amplifier 205 deter mines the potentials of these bit lines. Under this condition, the switching transistors FR1 and FR2 of the potential-switching circuit 207 are turned on and off, respectively, thus reducing the potential of the plate line PL from Vcc to Vcc/2.

Thereafter, the same operations will be performed to switch the operation mode, from the DRAM mode to the nonvolatile mode, as in the mode-switching operations (1), (2), (3) and (4) described above. As a result, the data items, each defined by the presence or absence of charge in each ferroelectric capacitor, are rewritten to data items which are defined by the directions in which the ferroelectric capacitors coupled to each word line are polarized.

(6) Mode Switching: Pre-charge potential=Vcc/2, $V_{PL}=$Vss

With reference to FIG. 33, it will be described how to switch the operation mode, from the DRAM mode to the nonvolatile mode, when the pre-charge potential VPC is Vcc/2, whereas the plate-line potential is set at Vss.

After data has been read from the memory operating in the DRAM mode, in the Vcc/2 floating condition, the sense amplifier 205 determines the potentials of the bit lines BL1 and $\overline{BL1}$. Under this condition, the switching transistors FR1 and FR2 of the potential-switching circuit 207 are turned on and off, respectively, thus raising the potential of the plate line PL from Vss to Vcc/2.

Thereafter, the same operations will be performed to switch the operation mode, from the DRAM mode to the nonvolatile mode, as in the mode-switching operations (1), (2), (3), (4) and (5) described above. As a result, the data items, each defined by the presence or absence of charge in each ferroelectric capacitor, are rewritten to data items which are defined by the directions in which the ferroelectric capacitors coupled to each word line are polarized.

As has been described, the semiconductor memory shown in FIG. 15 operates in the DRAM mode while a power-supply voltage is applied to it, so that each ferroelectric capacitor is polarized reversely at low frequency. The memory is then set in the nonvolatile mode shortly before the power-supply switch is turned off, so that the ferroelectric capacitor hold data even after the power-supply switch is turned off.

Another semiconductor memory, which is the fifth embodiment of the invention, will now be described with reference to FIG. 34. The fifth embodiment is different from the fourth embodiment (FIG. 15) in one respect only. That is, each cell unit for storing one bit comprises a memory cell made of a ferroelectric capacitor MC and a switching transistor MF, and a memory cell made of a ferroelectric capacitor MC' and a switching transistor MF'.

Figure 34:
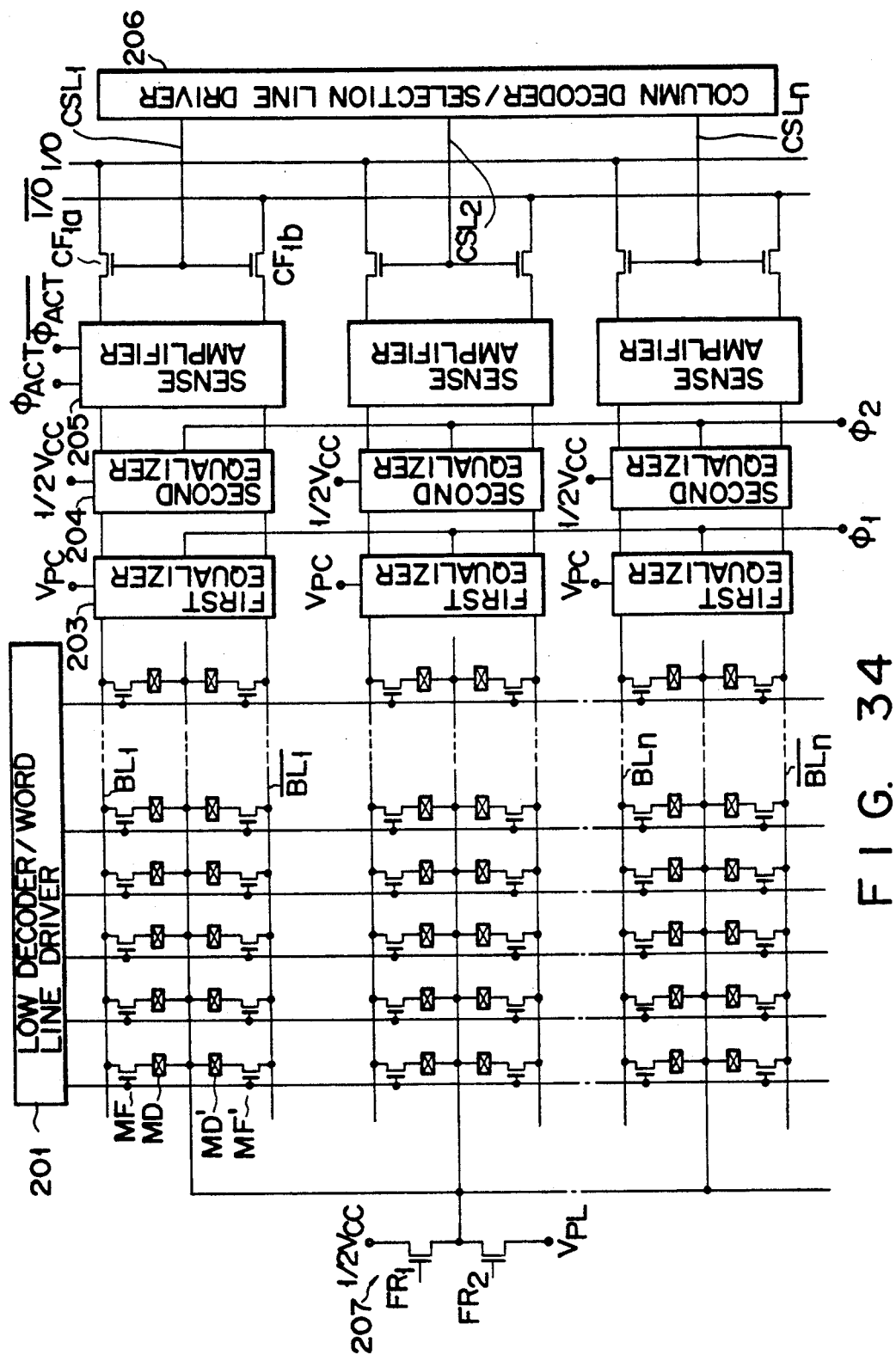
FIG. 34 is a circuit diagram showing a semiconductor memory according to a fifth embodiment of the invention, which has a circuit wherein one drive voltage is fixed, while the other drive voltage is switched thereby to polarize an ferroelectric capacitor in one direction o the other.

In the memory of FIG. 34, the two ferroelectric capacitors of each memory cell unit are polarized in the opposite directions, so that the unit stores a "1" bit or a "0" bit in accordance with the directions in which the capacitors are polarized. A sense amplifier 20 obtains data by determining whether or not the bit lines BL1 and $\overline{BL1}$, which are connected to the two ferroelectric capacitors, are at high potential when the potential of the word lines WLI is raised from Vss to Vcc after the bit lines BL1 and $\overline{BL1}$ have been precharged.

Therefore, the memory does not need dummy cells as the semiconductor memory shown in FIG. 15, and is less influenced by noise and reliable than the memory shown in FIG. 15. In addition, no operation needs to be performed to switch dummy cells in order to change the operation mode, from the nonvolatile mode to the DRAM mode, or vice versa. The bit lines can be precharged to Vss and Vcc in the nonvolatile mode, and to Vss, Vcc, and Vcc/2 in the DRAM mode, just as in the semiconductor memory illustrated in FIG. 15. Further, the plate-line potential $V_{PL}$ can be set at Vss and Vcc.

As has been described, the present invention can provide a high-integration semiconductor memory which has as simple a structure as a DRAM and yet operates in the nonvolatile mode so that it need not be refreshed. Further, the invention can provide a semiconductor memory which can operate in both the DRAM mode and the nonvolatile mode, so that each ferroelectric capacitor need not be frequently polarized in one direction and the other. Hence, the memory maintains a high access speed and has a long lifetime.

The fifth embodiment (FIG. 35) operates in the same way as the fourth embodiment (FIG. 15), as has been described with reference to the timing charts of FIGS. 16 to 33.

Another semiconductor memory, which is the sixth embodiment of the invention, will now be described with reference to FIG. 35. The sixth embodiment is different from the fourth embodiment (FIG. 15), only in two respects. First, it has no component which corresponds to the potential-switching circuit 207. Second, data is read from, and written into, each memory cell, while the potential of the second electrode of each ferroelectric capacitor is fixed.

It will now be explained how data is written into, and read from, the memory according to the sixth embodiment of the invention.

Writing Mode

Figure 36:
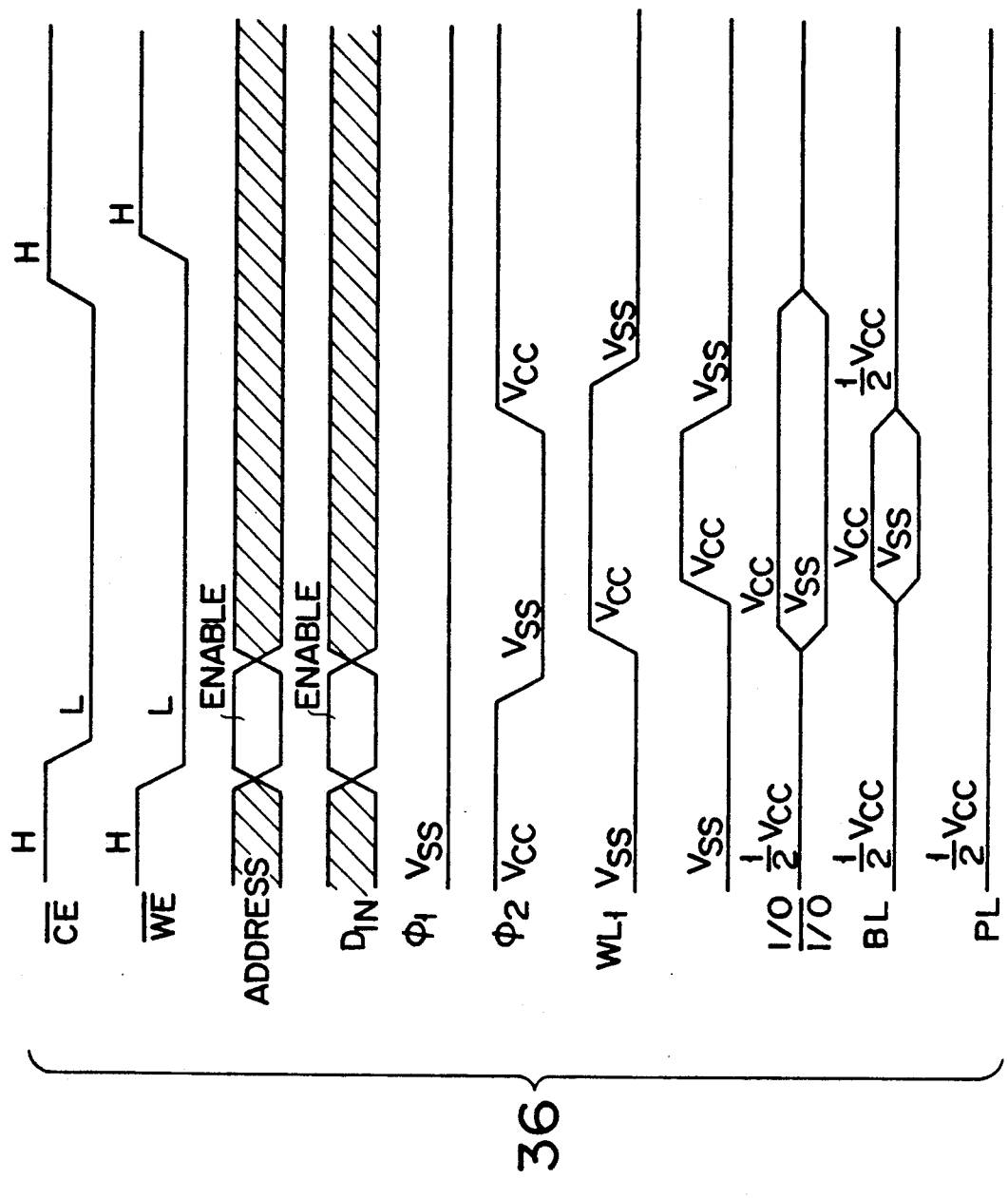

As is evident from the timing chart of FIG. 36, the write enable signal $\overline{WE}$ is set at the low level before the chip enable signal $\overline{CE}$ is lowered to the low level, as in the conventional DRAM. A data-writing cycle is thereby initialized.

Let us assume the memory address and the write-in data $D_{IN}$, both supplied from the input/output section of the memory, have been defined before the chip enable signal $\overline{CE}$ is lowered to the low level. When the memory chip is not selected, the second clock signal $\phi_2$ is set at Vcc, and the second equalizer 204 equalizes the bit lines BL1 and $\overline{BL1}$, setting them at the same potential of Vcc/2.

When the second clock signal $\phi_2$ is set at Vss, the second equalizer 204 stops pre-charging and equalizing the bit lines BL1 and $\overline{BL1}$. The data input/output lines I/O and $\overline{I/O}$, which connect the memory cells to the external circuits (not shown), are set at Vss or Vcc in accordance with the write-in data $D_{IN}$.

Thereafter, the row decoder/word-line driver 201 operates in response to a row-address signal, thereby raising the potential of the first word line WL1 from Vss to Vcc. At this time, the switching transistor MF of the memory cell connected to the word line WL1 is turned on, whereby a voltage is applied to the ferroelectric capacitor MC located between the bit line BL1 and the plate line PL. Nonetheless, the ferroelectric capacitor MC remains polarized in the same direction. This is because the bit line BL1 is held at the same potential (Vcc/2) as the plate line PL, and remains in floating condition.

The column decoder/column-selecting line driver 206 is operated in response to a column-address signal, thus raising the potential of the column-selecting line CSL1, from Vss to Vcc. Then, the column-selecting switching transistors CF1a and CF1b are turned on, connecting the data input/output lines I/O and $\overline{I/O}$ to the bit lines BL1 and $\overline{BL1}$, respectively. Hence, these lines I/O and $\overline{I/O}$ are set at the same potential. There is a potential difference between either bit line and the plate line PL set at Vcc/2. The ferroelectric capacitor of each memory cell is polarized in one direction or the other in accordance with the data to be written into the memory cell. After the data has been written into the memory cell, the potential of the column-selecting line CSL1 falls from Vcc to Vss. Then, the column-selecting switching transistors CF1a and CF1b are turned off, disconnecting the bit lines BL1 and $\overline{BL1}$ from the data input/output lines I/O and $\overline{I/O}$. At the same time, the second clock signal $\phi_2$, which has been at Vss, is set at the level of Vcc, and the bit lines BL1 and $\overline{BL1}$ are pre-charged to Vcc/2 and thus equalized. As a result of this, both electrodes of the ferroelectric capacitor are set at the same potential of Vcc/2. The charge which the capacitor has accumulated at the time of data-writing is thereby canceled. Nonetheless, the capacitor remains polarized since there is no potential difference between either bit line and the plate line P set at Vcc/2.

Thereafter, the potential of the word line WL1 is lowered from Vcc to Vss, whereby the memory cells connected to the word line WLI are electrically disconnected from the bit line BL1. The chip enable signal $\overline{CE}$ supplied to the memory is set at the high level, and the write enable signal $\overline{WE}$ is set at the high level. Thus, the data-writing cycle is completed, writing data into any memory cell designated by the address signals.

Reading Mode

With reference to the timing chart of FIG. 37, it will now be explained how to read the data which has been written into the memory cells. Although the bit lines are pre-charged to VPC (i.e., the potential output by the first equalizer 203 driven by the first clock signal $\phi_1$ in order to read from the memory cells, they are pre-charged to Vcc in this instance.

The write enable signal $\overline{WE}$ is set at the high level before the chip enable signal $\overline{CE}$ is lowered to the low level. A data-reading cycle is thereby initialized. Let us assume the memory address which is supplied from the input/output section of the memory, have been defined before the chip enable signal $\overline{CE}$ is lowered to the low level. When the memory chip is not selected, the second equalizer 204 equalizes the bit lines BL1 and $\overline{BL1}$, setting them at the same potential of Vcc/2.

The second clock signal $\phi_2$ is set at Vss. Then, the first clock signal $\phi_1$ is set from Vss to Vcc when the second equalizer 204 stops equalizing the bit lines BL1 and $\overline{BL1}$. The bit lines BL1 and $\overline{BL1}$ are thereby pre-charged to Vcc and equalized. When the potential of the first clock signal $\phi_1$ is lowered from Vcc to Vss, the bit lines BL1 and $\overline{BL1}$ are held at the same potential (Vcc/2) as the plate line PL, and remain in floating condition. When the row decoder/word-line driver 201 operates in response to an address signal, the potential of the word line WLI designated by the address signal is raised from Vss to Vcc. Simultaneously, the dummy word-line decoder/driver 202 operates, such that the dummy cell comprising the dielectric capacitor DC' and the switching transistor DF' is electrically connected to the bit line $\overline{BL1}$ which is complementary to the bit line BL1 to which the ferroelectric memory cell is connected. In other words, the dummy word line DWL is selected, and the potential of the dummy word line DWL is raised from Vss to Vcc, thereby connecting the dummy cell to the bit line $\overline{BL1}$. As a result, the Vcc potential is applied to the bit line BL1 connected to the selected memory cell comprised of a ferroelectric capacitor MC and a switching transistor MF, and the potential of Vcc/2 is applied to the plate line PL.

At this time, a small current flows into the memory cell if the ferroelectric capacitor is polarized in the same direction as the electric field extends, and a large current flows into the memory cell if the capacitor is polarized in the opposite direction. The potential of the bit line BL1 falls a little if a small current flows into the cell, and falls greatly if a large current flows into the cell. Each dummy cell has a dielectric capacitor whose capacitance allows only half the current flowing into the ferroelectric capacitor, to flow into the dielectric capacitor. Hence, the data stored in the memory cell is defined by the potential difference between the bit lines BL1 and $\overline{BL1}$, as in the case of the conventional DRAM. This potential difference is amplified by the sense amplifier 205, which is of the same type as is used in the conventional DRAM. Thus, the data is read from the memory cell.

More specifically, the sense-amplifier signals $\phi_{ACT}$ and $\overline{\phi_{ACT}}$ are controlled while a potential difference is occurring between the bit lines BL1 and $\overline{BL1}$, thereby driving the sense amplifier 205. Therefore, the potential of the bit line, which has dropped a little, is raised to Vcc, whereas the potential of the bit line, which has dropped greatly, is lowered to Vss. Hence, destructive reading takes place. Due to the destructive reading, the ferroelectric capacitor is polarized in one direction, whichever data the memory cell stored originally. Nonetheless, data can be written again into the memory cell when the sense amplifier 205 determines the potentials of the bit lines BL1 and $\overline{BL1}$. After the potentials of the bit lines BL1 and $\overline{BL1}$ have been determined, the column decoder/column-selecting line driver 206 is operated in response to a column-address signal, thus raising the potential of the column-selecting line CSL1, from Vss to Vcc. Then, the bit lines BL1 and $\overline{BL1}$ are connected to the data input/output lines I/O and $\overline{I/O}$, respectively. The data read from the memory cell is, therefore, supplied from the memory through an I/O buffer (not shown). Then, the potential of the column-selecting line CSL1 is lowered from Vcc to Vss. The input/output lines I/O and $\overline{I/O}$ are therefore electrically disconnected from the bit lines BL1 and $\overline{BL1}$, respectively. The sense-amplifier signals $\phi_{ACT}$ and $\overline{\phi_{ACT}}$ are controlled, thereby stopping the sense amplifier 205. Thereafter, the potential of the second clock signal $\phi_2$, which has been lowered to Vss, is raised to Vcc. Hence, the bit lines BL1 and $\overline{BL1}$ are equalized to the potential of Vcc/2. Then, the chip enable signal $\overline{CE}$ is raised to the high level. Thus, the data-reading cycle ends.

In the data-reading cycle explained with reference to FIG. 37, the bit lines are set at Vcc (i.e., the output potential of the first equalizer 203) before the data is read from the memory. Instead, the bit lines can be set at Vss before the data is read from the memory. With reference to the timing chart of FIG. 38, it will be explained how to read the data in this condition.

First, the second clock signal $\phi_2$ is set at Vss. Then, the first clock signal $\phi_1$ is set from Vss to Vcc when the second equalizer 204 stops equalizing the bit lines BL1 and $\overline{BL1}$. When the first clock signal $\phi_1$ is set at Vss, both bit lines BL1 and $\overline{BL1}$ are pre-charged to Vss and equalized and are brought into floating condition. When the row decoder/word-line driver 201 operates in response to an address signal, the potential of the first word line WL1 is raised from Vss to Vcc. Simultaneously, the dummy word-line decoder/driver 202 starts operating, thus connecting the dummy cell comprising the dielectric capacitor DC' and the switching transistor DF', to the bit line $\overline{BL1}$ which is complementary to the bit line BL1 to which the ferroelectric memory cell is connected. Hence, the bit line BL1 connected to the memory cell comprised of the ferroelectric capacitor MC and the switching transistor MF is set at Vss, and the potential of Vcc/2 is applied to the plate line PL.

At this time, a small current flows into the memory cell if the ferroelectric capacitor is polarized in the same direction as the electric field extends, and a large current flows into the memory cell if the capacitor is polarized in the opposite direction. The potential of the bit line BL1 rises a little if a small current flows into the cell, and rises greatly if a large current flows into the the cell. Each dummy cell has a dielectric capacitor whose capacitance allows only half the the current flowing into the ferroelectric capacitor, to flow into the dielectric capacitor. Hence, the data stored in the memory cell is defined by the potential difference between the bit lines BL1 and $\overline{BL1}$, as in the case of the conventional DRAM. Under this condition, the sense-amplifier signals $\phi_{ACT}$ and $\overline{\phi_{ACT}}$ are controlled, thereby driving the sense amplifier 205. Therefore, the potential of the bit line, which has risen greatly, is raised to Vcc, whereas the potential of the bit line, which has risen a little, is lowered to Vss. Thereafter, the same operations are performed as in the case where the bit lines are set at Vcc before the data is read from the memory.

Figure 35:
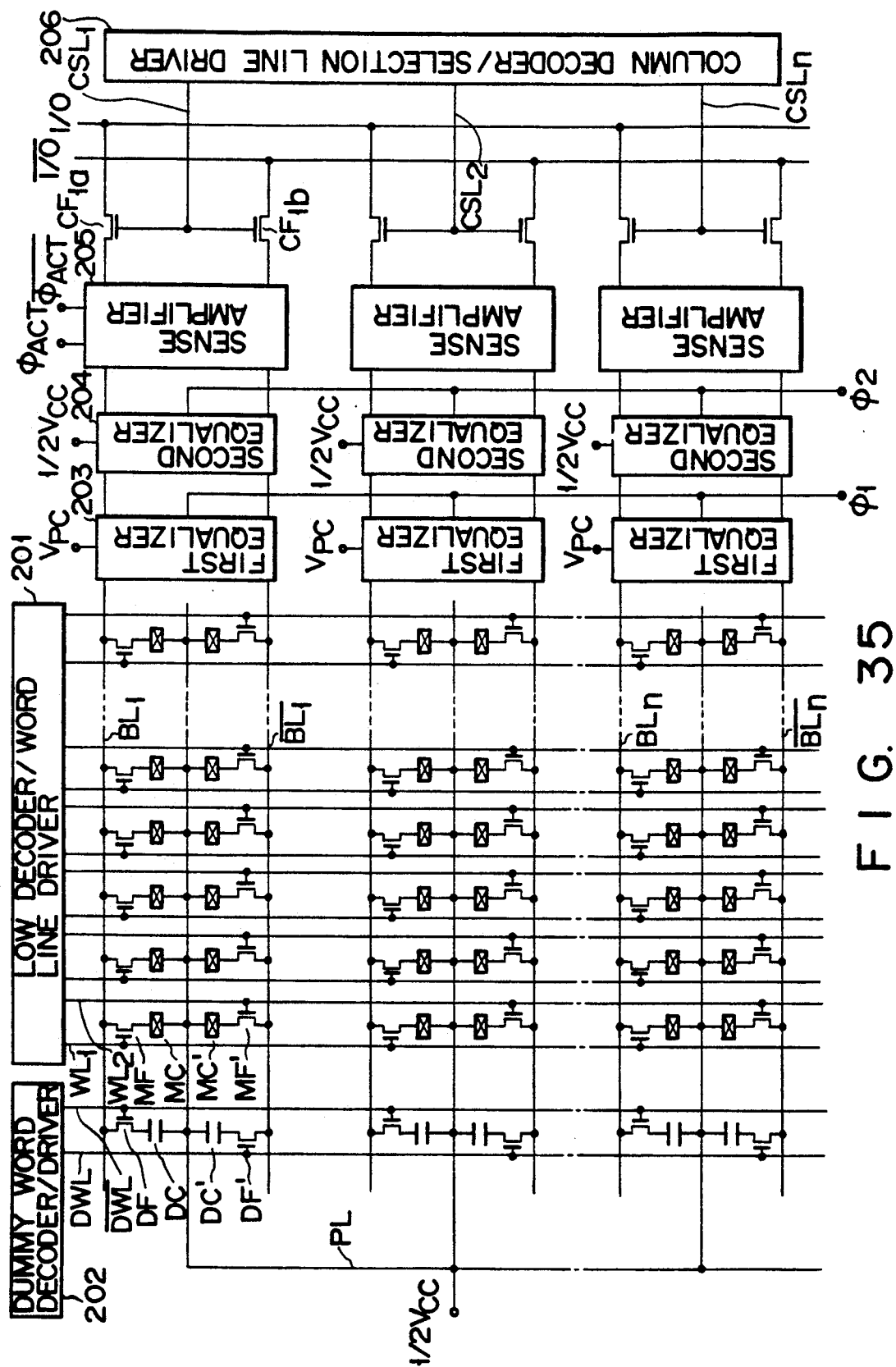
FIG. 35 is a circuit diagram illustrating a semiconductor memory according to a sixth embodiment of the present invention, wherein one drive voltage is fixed, while the other drive voltage is switched thereby to polarize an ferroelectric capacitor in one direction or the other.

As has been described, in the memory of FIG. 35, the first electrode of the ferroelectric capacitor of each memory cell is connected by the switching transistor MF to a bit line (e.g., the bit line BL1) which is set at either of two potentials Vss and Vcc corresponding to a "0" bit and a "1" bit, respectively, whereas the second electrode of the ferroelectric capacitor is connected to the plate line PL which is set at a potential between Vss and Vcc (for example, Vcc/2). Hence, the first and second electrodes of the capacitor are set at the high level and the low level, respectively, when the bit line BL1 coupled to the first electrode of the ferroelectric capacitor is set at Vcc, and are set at the low level and the high level, respectively, when the bit line BL1 is set at Vss. Therefore, the memory shown in FIG. 35 does not need as many drive lines as word lines, in order to polarize the ferroelectric capacitors in one direction and the opposite direction, as in the conventional ferroelectric memory. The circuits peripheral to the memory-cell array can therefore be more simple than those used in the conventional ferroelectric memory, and the memory shown in FIG. 35 can have a high integration density.

In addition, the memory shown in FIG. 35 can operate in the nonvolatile mode and keeps holding data even if the power switch is turned off, without being refreshed. Further, since the memory has the same structure as the conventional dynamic random-access memory (DRAM), it can have high integration density.

Still another semiconductor memory, which is the seventh embodiment of the invention, will now be described with reference to FIG. 39.

Figure 39:
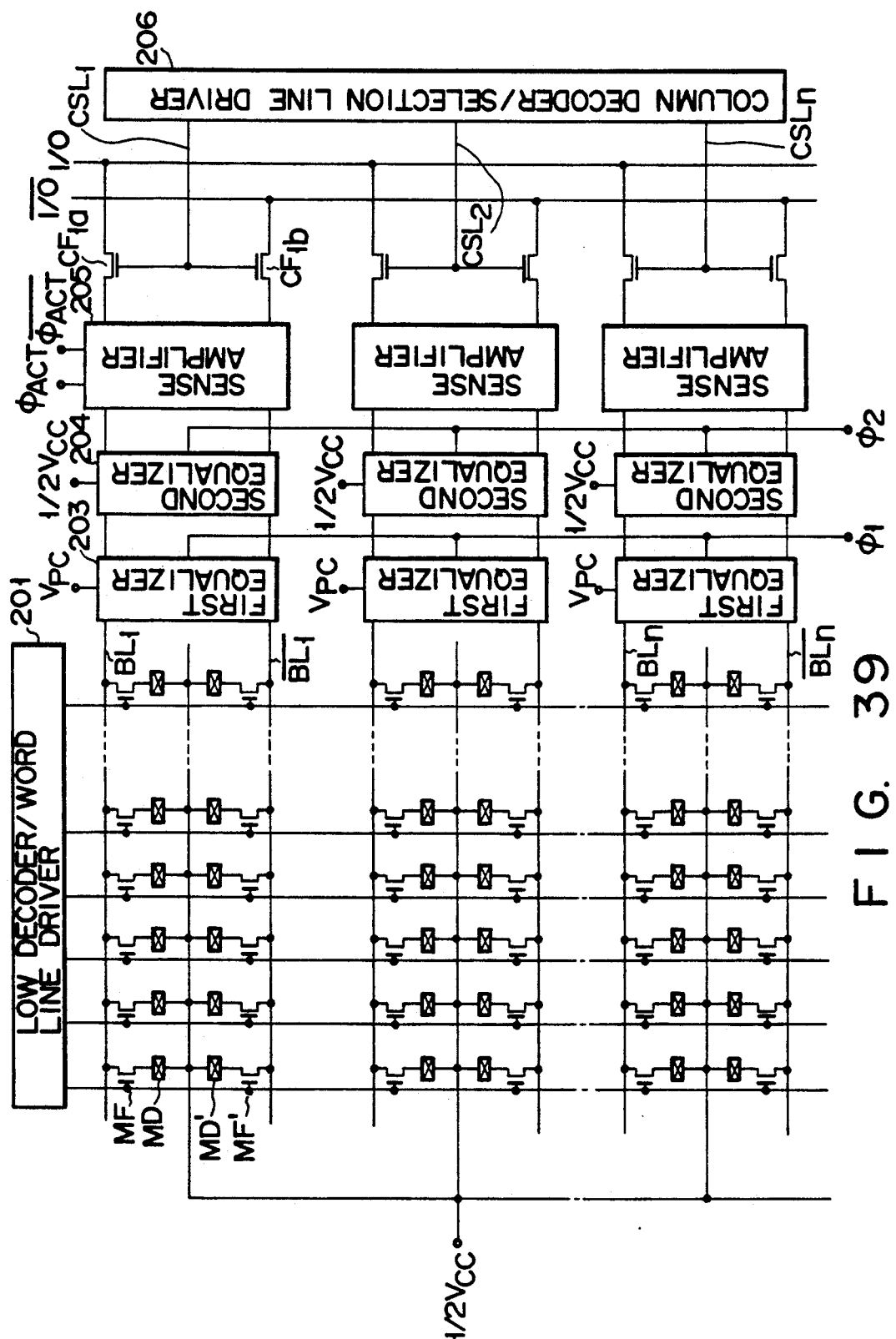
FIG. 39 is a circuit diagram showing a semiconductor memory according to a seventh embodiment of the invention, wherein one drive voltage is fixed, while the other drive voltage is switched thereby to polarize an ferroelectric capacitor in one direction or the other.

In the memory of FIG. 39, each memory cell unit for storing one bit of data comprises a pair of ferroelectric memory cell and a dielectric memory cell. One of these memory cells is used as a dummy cell. The ferroelectric memory cell has a ferroelectric capacitor MC connected to a word line (e.g., a word line WL1) and a switching transistor MF. The other ferroelectric memory cell has a ferroelectric capacitor MC' and a switching transistor MF'. The two memory cells of each memory cell unit are polarized in the opposite directions, so that the unit stores a "1" bit or a "0" bit in accordance with the directions in which the capacitors are polarized.

A sense amplifier 20 obtains data by determining whether or not the bit lines BL1 and $\overline{BL1}$, which are connected to one of the two ferroelectric capacitors, are at high potential when the potential of the word line WL1 is raised from Vss to Vcc after the bit lines BL1 and $\overline{BL1}$ have been pre-charged.

Therefore, the memory does not need dummy cells as the semiconductor memory shown in FIG. 15, and is less influenced by noise and more reliable than the memory shown in FIG. 15. In addition, no operation needs to be performed to switch dummy cells in order to change the operation mode, from the nonvolatile mode to the DRAM mode, or vice versa. The bit lines can be pre-charged to Vss and Vcc in the nonvolatile mode, and to Vss, Vcc, and Vcc/2 in the DRAM mode, just as in the semiconductor memory illustrated in FIG. 15.

Figure 38:
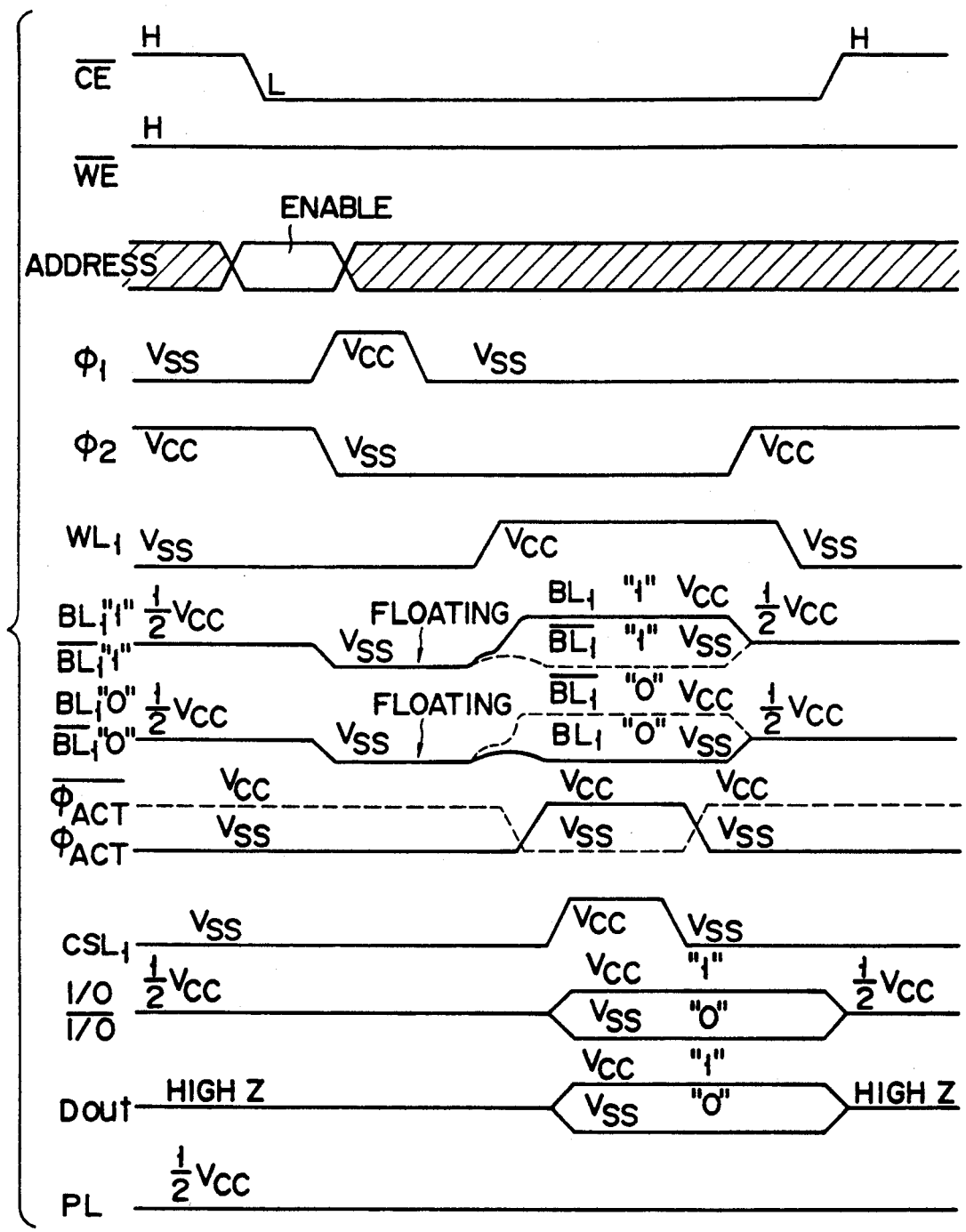

The memory of FIG. 39 operates in the same way as the memory of FIG. 35, as has been explained with reference to the timing charts of FIGS. 36 to 38.

As has been described, the present invention has solved the problem inherent in the conventional memory having ferroelectric capacitors, i.e., the short life time thereof. The invention can provide a semiconductor memory which can operate in the nonvolatile mode, by virtue of the use of ferroelectric capacitors, has a long lifetime, a high access speed, and a high integration density.

Additional advantages and modifications will readily occur to those skilled in the art. Therefore, the invention in its broader aspects is not limited to the specific details, and representative devices, shown and described herein Accordingly, various modifications may be made without departing from the spirit or scope of the general inventive concept as defined by the appended claims and their equivalents.

What is claimed is:

1. A semiconductor memory comprising:
   at least one ferroelectric capacitor having a predetermined capacitance;
   voltage output means for outputting a first voltage for reversely polarizing said ferroelectric capacitor and a second voltage for forwardly polarizing said ferroelectric capacitor, regardless of data stored in said ferroelectric capacitor;
   a first reference capacitor having such a capacitance as to accumulate less charge than charge which said ferroelectric capacitor accumulates, when the second voltage is applied to said ferroelectric capacitor;
   a second reference capacitor having such a capacitance that as to accumulate greater charge than the charge which said ferroelectric capacitor accumulates while said ferroelectric capacitor is forwardly polarized, when the first voltage is applied to said ferroelectric capacitor, thus reversely polarizing said ferroelectric capacitor;
   a sense amplifier connected to said ferroelectric capacitor and one of said reference capacitors; and
   reference-capacitor selecting means for connecting said first reference capacitor to said sense amplifier when said voltage output means outputs the second voltage, and connecting said second reference capacitor to said sense amplifier when said voltage output means outputs the first voltage.

2. The semiconductor memory according to claim 1, wherein said first reference capacitor comprises a first capacitor having about half the capacitance of said ferroelectric capacitor, and said second reference capacitor comprises a second capacitor having a capacitance about twice as large as said ferroelectric capacitor.

3. A semiconductor memory comprising:
   a ferroelectric capacitor having a predetermined capacitance;
   voltage output means for outputting a first voltage for charging said ferroelectric capacitor so as to change a polarization direction thereof and a second voltage for charging said ferroelectric capacitor without changing the polarization direction thereof, regardless of data stored in said ferroelectric capacitor;
   reference capacitor;
   a sense amplifier connected to said ferroelectric capacitor and said reference capacitor; and
   charge control means for controlling a charge to be applied to said reference capacitor so that said reference capacitor accumulates less charge than a charge which said ferroelectric capacitor accumulates, when the second voltage is applied to said ferroelectric capacitor, and said reference capacitor accumulates greater charge than the charge applied to said ferroelectric capacitor when said ferroelectric capacitor is forwardly polarized, and less charge than a charge applied to said ferroelectric capacitor when said ferroelectric capacitor is reversely polarized by said first voltage.

4. The semiconductor memory according to claim 3, wherein said ferroelectric capacitor and said reference capacitor are connected to said sense amplifier by a pair of bit lines, said sense amplifier is detects a voltage drop in said bit lines which results form the charges applied to said ferroelectric capacitor and said reference capacitor when voltages are applied to said ferroelectric capacitor and said reference capacitor, thereby to read data from said ferroelectric capacitor in accordance with potentials of said bit lines.

5. The semiconductor memory according to claim 3, wherein said reference capacitor is constructed by a capacitor having a capacitance about twice as large as said ferroelectric capacitor.

6. A semiconductor memory comprising:
   a pair of ferroelectric capacitors having substantially the same characteristics,
   means for complementarily charging different amounts of charges to said ferroelectric capacitors;
   means for complementarily changing polarization directions of said ferroelectric capacitors; and
   means for selectively executing volatile operation mode in which data is determined from an amount of electric charges in said ferroelectric capacitors, and nonvolatile operation mode in which data is determined from directions in which said ferroelectric capacitors are polarized.

7. A semiconductor memory comprising:
   at least one ferroelectric capacitor;
   a reference capacitor; and
   operation mode executing means for selectively performing volatile operation mode in which data is determined by an amount of electric charges in said ferroelectric capacitors, and nonvolatile operation mode in which data is determined by directions in which said ferroelectric capacitors are polarized, including data-determining means for comparing the charge flowing to said reference capacitor when a voltage is applied to said reference capacitor, with the charge flowing to said ferroelectric capacitor when a voltage is applied to said ferroelectric capacitor while said ferroelectric capacitor is storing data, thereby to determine the data stored in said ferroelectric capacitor.

8. The semiconductor memory according to claim 7, wherein said data-determining means determines, as a state that said ferroelectric capacitor accumulates no electric charge, a state that said reference capacitor is charged to a predetermined level.

9. A semiconductor memory comprising;
at least one ferroelectric capacitor;
a reference capacitor; and
operation mode executing means for selectively performing volatile operation mode in which data is determined by an amount of electric charges in said ferroelectric capacitors, and nonvolatile operation mode in which data is determined by directions in which said ferroelectric capacitors are polarized;
wherein said reference capacitor has a capacitance which is smaller than the capacitance which said ferroelectric capacitor has while said operation mode executing means is performing the volatile operation, and said operation mode executing means includes data-determining means or comparing the charges accumulated in said ferroelectric capacitor when a voltage is applied thereto, with the charge accumulated in said reference capacitor when the same voltage is applied to said reference capacitor, thereby to determine the data stored in said ferroelectric capacitor.

10. A semiconductor memory comprising;
at least one ferroelectric capacitor;
a reference capacitor; and
operation mode executing means for selectively performing volatile operation mode in which data is determined by an amount of electric charges in said ferroelectric capacitors, and nonvolatile operation mode in which data is determined by directions in which said ferroelectric capacitors are polarized;
wherein said reference capacitor has such a capacitance that said reference capacitor accumulates an electric charge less than an electric charge accumulated in said ferroelectric capacitor, when a voltage is applied to said reference capacitor while said operation mode executing means is executing the volatile operation mode, and said operation mode executing means includes data-determining means for comparing the charge accumulated in said reference capacitor when said voltage is applied to said reference capacitor, with the charge accumulated in said ferroelectric capacitor when a voltage is applied to said ferroelectric capacitor, thereby to determine the data stored in said ferroelectric capacitor.

11. A semiconductor memory comprising:
at least one ferroelectric capacitor;
a reference capacitor; and
operation mode executing means for selectively performing volatile operation mode in which data is determined by an amount of electric charges in said ferroelectric capacitors, and nonvolatile operation mode in which data is determined by directions in which said ferroelectric capacitors are polarized;
wherein said operation mode executing means includes data-determining means for comparing the charge accumulated in said reference capacitor, which is greater than the charge flowing to said ferroelectric capacitor when said ferroelectric capacitor is forwardly polarized, and is less than the charge flowing to said ferroelectric capacitor when said ferroelectric capacitor is reversely polarized, with the charge flowing to said ferroelectric capacitor when said ferroelectric capacitor is polarized, thereby to determine the data stored in said ferroelectric capacitor.

12. A semiconductor memory comprising;
at least one ferroelectric capacitor;
a reference capacitor; and
operation mode executing means for selectively performing volatile operation mode in which data is determined by an amount of electric charges in said ferroelectric capacitors, and nonvolatile operation mode in which data is determined by directions in which said ferroelectric capacitors are polarized;
wherein said reference capacitor is used when said operation mode executing means executes the volatile operation mode and the volatile operation mode, and said executing means includes means for changing the voltage applied to said reference capacitor.

13. A semiconductor memory comprising:
at least one ferroelectric capacitor;
a reference capacitor; and
operation mode executing means for selectively performing volatile operation mode in which data is determined by an amount of electric charges in said ferroelectric capacitors, and nonvolatile operation mode in which data is determined by directions in which said ferroelectric capacitors are polarized wherein said executing means executes the volatile operation mode under normal condition, and executes the nonvolatile operation mode under a special condition.

14. A semiconductor memory comprising:
at least one ferroelectric capacitor;
a reference capacitor; and
operation mode executing means for selectively performing volatile operation mode in which data is determined by an amount of electric charges in said ferroelectric capacitors, and nonvolatile operation mode in which data is determined by directions in which said ferroelectric capacitors are polarized wherein said executing means includes means for stopping the volatile operation mode and starting the nonvolatile operation mode when supply of power to the memory is stopped, and for storing the last data valid during the execution of the volatile operation mode, by means of the nonvolatile operation mode.

15. A semiconductor memory comprising:
at least one ferroelectric capacitor;
a reference capacitor; and
operation mode executing means for selectively performing volatile operation mode in which data is determined by an amount of electric charges in said ferroelectric capacitors, and nonvolatile operation mode in which data is determined by directions in which said ferroelectric capacitors are polarized wherein said executing means includes means for reading data during the execution of the nonvolatile operation mode, when supply of power to the memory is started, and starting the volatile operation mode thereafter.

16. A semiconductor memory comprising;
a plurality of memory cells each comprising a ferroelectric capacitor having a first electrode and a second electrode;
potential-applying means for applying a first potential to the first electrode of the ferroelectric capacitor of each memory cell, thereby to write a bit of a first binary value to the memory cell, and a second potential to the first electrode of the ferroelectric capacitor of the memory cell, thereby to write a bit of a second binary value to the memory cell;
holding means for holding said second electrode of the ferroelectric capacitor of each memory cell at a potential higher than the first potential and lower than the second potential; and
detecting means for detecting a direction in which said ferroelectric capacitor is polarized, thereby to read a bit from said memory cell.

17. The semiconductor memory according to claim 16, wherein said holding means holds the second electrode of the ferroelectric capacitor of each memory cell at a middle potential between the first potential and the second potential.

18. The semiconductor memory according to claim 16, wherein said holding means comprises means for holding the second electrode of the ferroelectric capacitor of each memory cell at one of the first potential, the second potential, and a third potential which is higher than the first potential and lower than the second potential.

19. A semiconductor memory comprising:
a plurality of memory cells each comprising a ferroelectric capacitor having a first electrode and a second electrode, and a switching transistor connected to the first electrode of the ferroelectric capacitor;
potential-applying means for applying a first potential to the first electrode of the ferroelectric capacitor of each memory cell through said switching transistor, thereby to write a bit of a first binary value to the memory cell, and a second potential to the first electrode of the ferroelectric capacitor of the memory cell through said switching transistor, thereby to write a bit of a second binary value to the memory cell;
holding means for holding said second electrode of the ferroelectric capacitor of each memory cell at a third potential higher than the first potential and lower than the second potential; and
detecting means for detecting the direction in which said ferroelectric capacitor is polarized, thereby to read a bit from said memory cell.

* * * * *